(12) United States Patent
Kagawa

(10) Patent No.: US 10,667,444 B2
(45) Date of Patent: *May 26, 2020

(54) ELECTROMAGNETIC-WAVE-ABSORBING COMPOSITE SHEET

(71) Applicants: Seiji Kagawa, Koshigaya-shi, Saitama (JP); Atsuko Kagawa, Koshigaya-shi, Saitama (JP)

(72) Inventor: Seiji Kagawa, Koshigaya (JP)

(73) Assignees: Seiji Kagawa, Koshigaya-Shi (JP); Atsuko Kagawa, Koshigaya-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/351,959

(22) Filed: Mar. 13, 2019

(65) Prior Publication Data
US 2019/0394911 A1  Dec. 26, 2019

(30) Foreign Application Priority Data

Jun. 21, 2018 (JP) ................................ 2018-117782
Sep. 21, 2018 (JP) ................................ 2018-177487

(51) Int. Cl.
*H05K 9/00* (2006.01)

(52) U.S. Cl.
CPC ......... *H05K 9/0088* (2013.01); *H05K 9/0062* (2013.01); *H05K 9/0069* (2013.01); *H05K 9/0084* (2013.01)

(58) Field of Classification Search
CPC .......................... H05K 9/0088; H05K 9/0084
See application file for complete search history.

(56) References Cited

U.S. PATENT DOCUMENTS

| 10,062,477 B1 | 8/2018 | Kagawa |
| 2009/0075068 A1* | 3/2009 | Pyo .................... B32B 15/08 428/336 |
| 2011/0008580 A1 | 1/2011 | Kagawa et al. |

(Continued)

FOREIGN PATENT DOCUMENTS

| JP | 6208394 B1 | 10/2017 |
| WO | WO 2010/093027 A1 | 8/2010 |
| WO | WO 2013/081043 A1 | 6/2013 |

OTHER PUBLICATIONS

Taiwanese Office Action and Search Report (including a partial English translation) issued in the Taiwanese Patent Application No. 108107159 dated Nov. 18, 2019.

*Primary Examiner* — Hung V Ngo
(74) *Attorney, Agent, or Firm* — Birch, Stewart, Kolasch & Birch, LLP

(57) ABSTRACT

An electromagnetic-wave-absorbing composite sheet comprising an electromagnetic-wave-shielding film laminated on an electromagnetic-wave-absorbing film; the electromagnetic-wave-absorbing film comprising a single- or multilayer thin metal film formed on a surface of a plastic film, the thin metal film being provided with large numbers (pluralities) of substantially parallel, intermittent, linear scratches with irregular widths and intervals in plural directions; the electromagnetic-wave-shielding film being a conductive metal foil, a plastic film having a thin conductive metal film or coating, or a carbon sheet; and an area ratio of the electromagnetic-wave-shielding film to the electromagnetic-wave-absorbing film being 10-80%.

8 Claims, 53 Drawing Sheets

(56) References Cited

U.S. PATENT DOCUMENTS

| | | |
|---|---|---|
| 2015/0027771 A1 | 1/2015 | Kagawa |
| 2016/0286698 A1* | 9/2016 | Chang ................... H05K 9/0083 |
| 2017/0002488 A1* | 1/2017 | Tanaka ..................... B32B 5/02 |
| 2017/0311448 A1* | 10/2017 | Kawabata ............. H01F 1/0306 |
| 2019/0215994 A1* | 7/2019 | Hiroi ....................... B32B 15/08 |

* cited by examiner

Sample 21    Sample 22

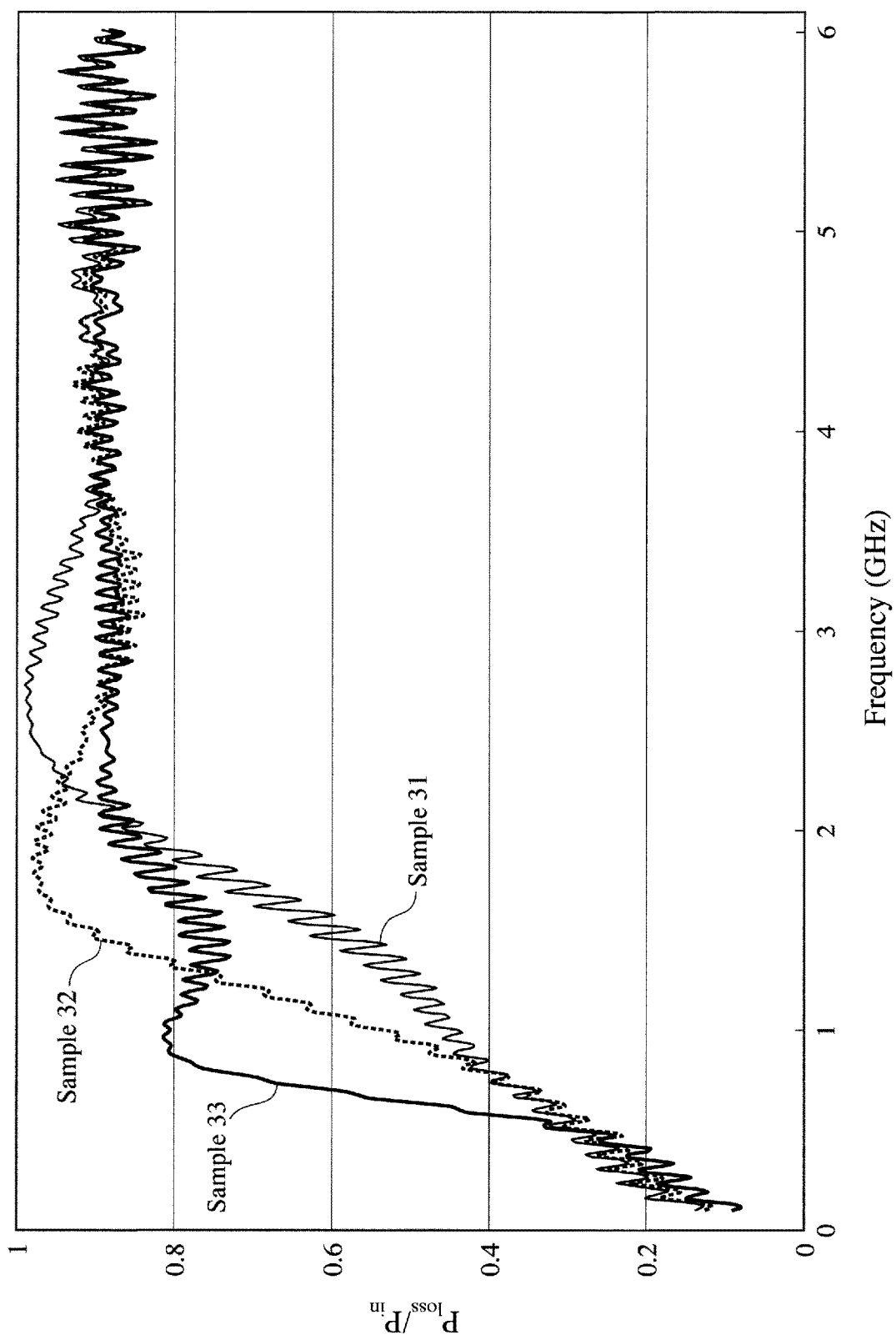

ELECTROMAGNETIC-WAVE-ABSORBING COMPOSITE SHEET

FIELD OF THE INVENTION

The present invention relates to an electromagnetic-wave-absorbing composite sheet having high absorbability to electromagnetic wave noises in a desired frequency range, and capable of shifting a frequency range in which the electromagnetic wave noise absorbability is maximized.

BACKGROUND OF THE INVENTION

Electric appliances and electronic appliances emit electromagnetic wave noises, and ambient electromagnetic wave noises intrude into them so that noises are contained in signals. To prevent the emission and intrusion of electromagnetic wave noises, electric appliances and electronic appliances have conventionally been shielded with metal sheets. It is also proposed to dispose electromagnetic-wave-absorbing films in electric appliances and electronic appliances to absorb electromagnetic wave noises.

For example, WO 2010/093027 A1 discloses a linear-scratched, thin metal film-plastic composite film with reduced anisotropy in electromagnetic wave absorbability, which comprises a plastic film and a single- or multi-layer, thin metal film formed on at least one surface of the plastic film, the thin metal film being provided with large numbers of substantially parallel, intermittent linear scratches with irregular widths and intervals in plural directions. WO 2010/093027 A1 describes that the linear-scratched, thin metal film-plastic composite film can be laminated with an electromagnetic wave reflector (a sheet, net or mesh of metal, a plastic film having a thin metal film, etc.) via a dielectric layer to obtain a composite electromagnetic wave absorber. This composite electromagnetic wave absorber has high absorbability to electromagnetic wave noise in a wide frequency, but does not have a function of exhibiting particularly large absorbability to electromagnetic wave noise in a particular frequency range, and a function of shifting a frequency range in which the electromagnetic wave absorbability is maximized.

WO 2013/081043 A1 discloses an electromagnetic-wave-absorbing composite sheet comprising (a) a first electromagnetic-wave-absorbing film comprising a plastic film, and a single- or multi-layer thin metal film formed on at least one surface of the plastic film, the thin metal film being provided with large numbers of substantially parallel, intermittent, linear scratches with irregular widths and intervals in plural directions; and (b) a second electromagnetic-wave-absorbing film made of a resin or rubber in which magnetic or non-magnetic particles are dispersed. This electromagnetic-wave-absorbing composite sheet has high absorbability to electromagnetic wave noise in a wide frequency, but does not have a function of exhibiting particularly large absorbability to electromagnetic wave noise in a particular frequency range, and a function of shifting a frequency range in which the electromagnetic wave absorbability is maximized.

OBJECT OF THE INVENTION

Accordingly, an object of the present invention is to provide an electromagnetic-wave-absorbing composite sheet having high absorbability to electromagnetic wave noises in a desired frequency range, and capable of shifting a frequency range in which the electromagnetic wave noise absorbability is maximized.

SUMMARY OF THE INVENTION

As a result of intensive research in view of the above object, the inventor has found that an electromagnetic-wave-absorbing composite sheet having high absorbability to electromagnetic wave noises in a desired frequency range, and capable of shifting a frequency range in which the electromagnetic wave noise absorbability is maximized, can be obtained by laminating an electromagnetic-wave-shielding film on an electromagnetic-wave-absorbing film having a thin metal film provided with large numbers (pluralities) of substantially parallel, intermittent, linear scratches with irregular widths and intervals in plural directions, and setting an area ratio of the electromagnetic-wave-shielding film to the electromagnetic-wave-absorbing film at 10-80%. The present invention has been completed based on such findings.

Thus, the electromagnetic-wave-absorbing composite sheet of the present invention comprises an electromagnetic-wave-absorbing film and an electromagnetic-wave-shielding film laminated on the electromagnetic-wave-absorbing film;

the electromagnetic-wave-absorbing film comprising a single- or multi-layer thin metal film formed on a surface of a plastic film, the thin metal film being provided with large numbers (pluralities) of substantially parallel, intermittent, linear scratches with irregular widths and intervals in plural directions; and an area ratio of the electromagnetic-wave-shielding film to the electromagnetic-wave-absorbing film being 10-80%.

The area ratio of the electromagnetic-wave-shielding film to the electromagnetic-wave-absorbing film is preferably 20-80%, more preferably 30-70%, most preferably 40-60%.

The electromagnetic-wave-shielding film is preferably a conductive metal foil, a plastic film having a thin conductive metal film or coating, or a carbon sheet.

The linear scratches in the electromagnetic-wave-absorbing film preferably have widths in a range of 0.1-100 μm for 90% or more and 1-50 μm on average, and lateral intervals in a range of 1-500 μm and 1-200 μm on average.

The linear scratches in the electromagnetic-wave-absorbing film preferably have an acute crossing angle θs in a range of 30-90°.

The conductive metal in the electromagnetic-wave-shielding film is preferably at least one selected from the group consisting of aluminum, copper, silver, tin, nickel, cobalt, chromium, and their alloys.

Both of the electromagnetic-wave-absorbing film and the electromagnetic-wave-shielding film are preferably in a rectangular or square shape.

BRIEF DESCRIPTION OF THE DRAWINGS

FIG. 1(*b*) is a plan view showing an example of the electromagnetic-wave-absorbing composite sheets of the present invention.

FIG. 19 is a graph showing the noise absorption ratios $P_{loss}/P_{in}$ of Samples 31-33 of the electromagnetic-wave-absorbing composite sheets comprising carbon sheet pieces of graphite powder/carbon black.

DESCRIPTION OF THE PREFERRED EMBODIMENTS

The embodiments of the present invention will be explained in detail referring to the attached drawings, and it should be noted that explanations of one embodiment are applicable to other embodiments unless otherwise mentioned. Also, the following explanations are not restrictive, and various modifications may be made within the scope of the present invention.

Figure 1A:
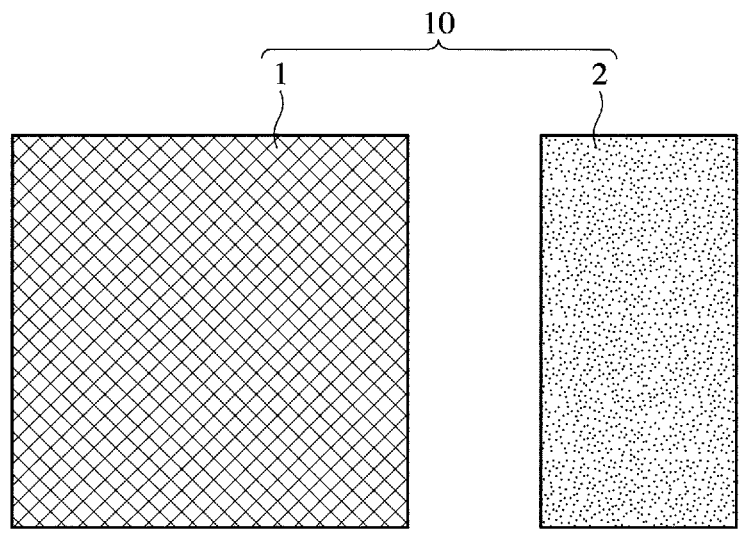
FIG. 1(*a*) is an exploded plan view showing an example of the electromagnetic-wave-absorbing composite sheets of the present invention.
Figure 1B:
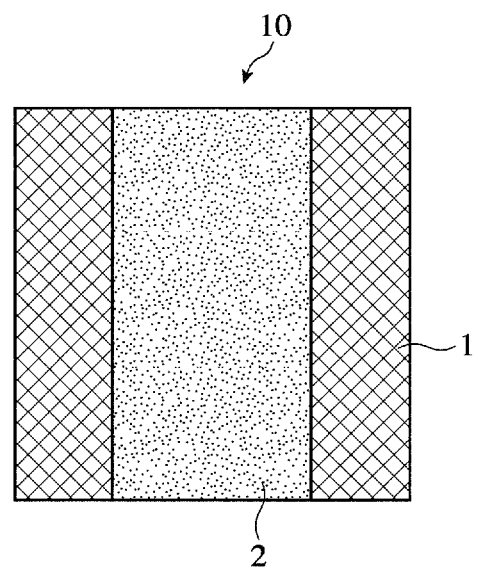

FIG. 1(a) shows an electromagnetic-wave-absorbing film 1 and an electromagnetic-wave-shielding film 2 laminated on the electromagnetic-wave-absorbing film 1, which constitute the electromagnetic-wave-absorbing composite sheet 10 of the present invention, and FIG. 1(b) shows an example of the electromagnetic-wave-absorbing composite sheets 10 of the present invention, which comprises the electromagnetic-wave-absorbing film 1 and the electromagnetic-wave-shielding film 2.

[1] Electromagnetic-Wave-Absorbing Film

Figure 2A:
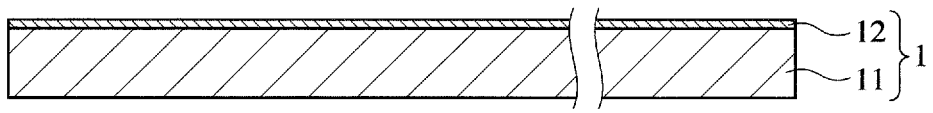
FIG. 2(*a*) is a cross-sectional view showing an example of electromagnetic-wave-absorbing films constituting the electromagnetic-wave-absorbing composite sheet of the present invention.
FIG. 2(b) is a partial plan view showing an example of linear scratches of an electromagnetic-wave-absorbing film.
FIG. 2(c) is a cross-sectional view taken along the line A-A in FIG. 2(b).
FIG. 2(d) is an enlarged cross-sectional view showing a portion B in FIG. 2(c).
FIG. 2(e) is a cross-sectional view showing another example of electromagnetic-wave-absorbing films.
FIG. 2(f) is an enlarged cross-sectional view showing a portion C in FIG. 2(e).
Figure 2B:
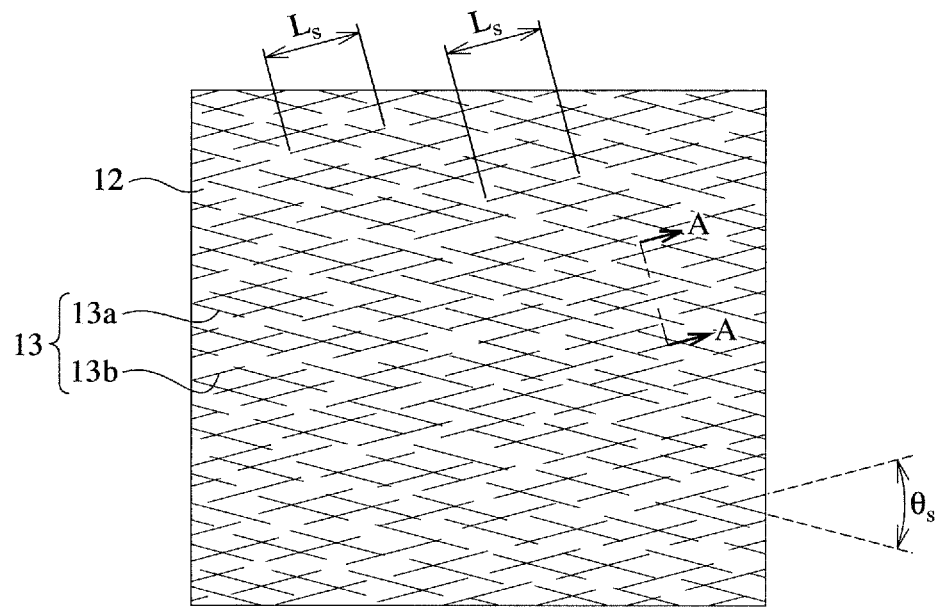

As shown in FIGS. 2(a) and 2(b), the electromagnetic-wave-absorbing film 1 comprises a plastic film 11, and a single- or multi-layer thin metal film 12 formed on at least one surface of the plastic film 11, the thin metal film 12 being provided with large numbers (pluralities) of substantially parallel, intermittent, linear scratches 13 with irregular widths and intervals in plural directions.

(1) Plastic Film

Resins forming the plastic film 11 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. From the aspect of strength and cost, polyethylene terephthalate (PET) is preferable. The thickness of the plastic film 11 may be about 8-30 μm.

(2) Thin Metal Film

Metals forming the thin metal film 12 are not particularly restrictive as long as they have conductivity, and they are preferably aluminum, copper, silver, tin, nickel, cobalt, chromium and their alloys, particularly aluminum, copper, nickel and their alloys, from the aspect of corrosion resistance and cost. The thickness of the thin metal film 12 is preferably 0.01 μm or more. Though not restrictive, the upper limit of the thickness of the thin metal film 12 may be practically about 10 μm. Of course, the thin metal film 12 may be thicker than 10 μm, with substantially no change in the absorbability of high-frequency electromagnetic waves. Accordingly, the thickness of the thin metal film 12 is preferably 0.01-10 μm, more preferably 0.01-5 μm, most preferably 0.01-1 μm. The thin metal film 12 can be produced by vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

When the thin metal film 12 has a single-layer structure, the thin metal film 12 is preferably made of aluminum or nickel from the aspect of conductivity, corrosion resistance and cost. When the thin metal film 12 has a multi-layer structure, one layer may be made of a non-magnetic metal, while the other layer may be made of a magnetic metal. The non-magnetic metals include aluminum, copper, silver, tin and their alloys, and the magnetic metals include nickel, cobalt, chromium and their alloys. The magnetic thin metal film is preferably as thick as 0.01 μm or more, and the non-magnetic thin metal film is preferably as thick as 0.1 μm or more. Though not restrictive, the upper limits of their thicknesses may be practically about 10 μm. More preferably, the thickness of the magnetic thin metal film is 0.01-5 μm, and the thickness of the non-magnetic thin metal film is 0.1-5 μm. FIGS. 2(e) and 2(f) show two layers (thin metal films 12a, 12b) formed on a plastic film 11.

(3) Linear Scratches

Figure 2C:
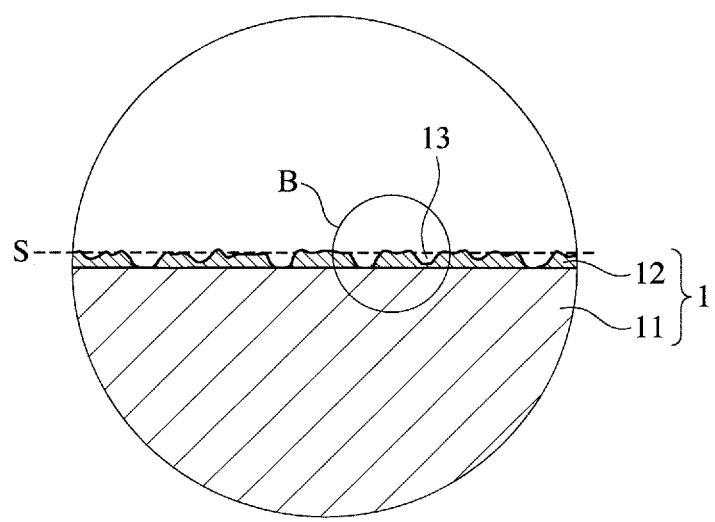
Figure 2D:
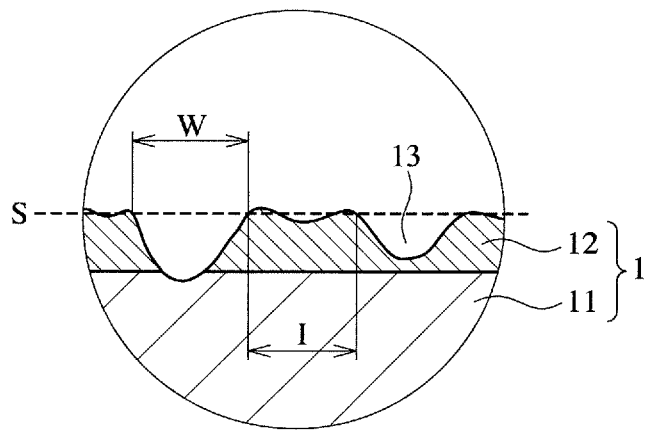
Figure 2E:
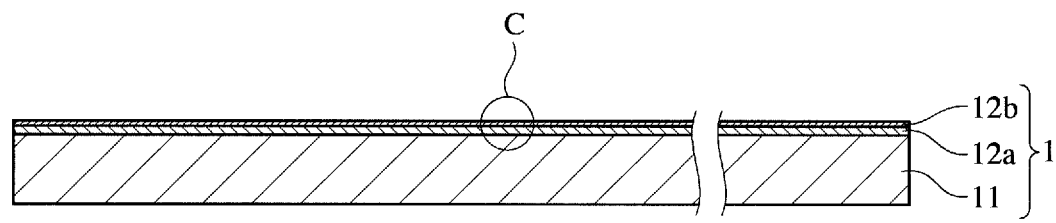
Figure 2F:
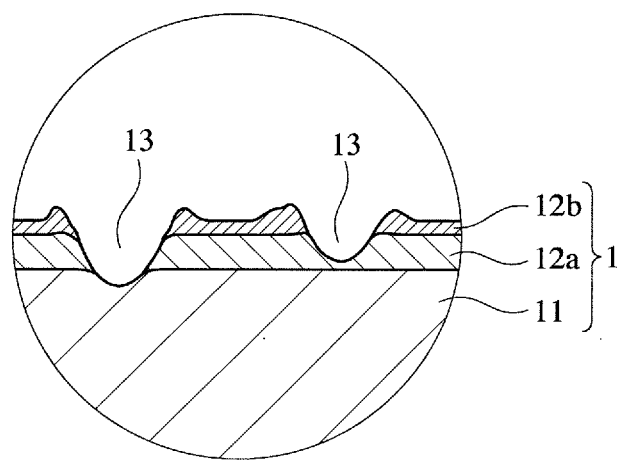

In the example shown in FIGS. 2(b) and 2(c), a thin metal film 12 is provided with large numbers of substantially parallel, intermittent, linear scratches 13 (13a, 13b) with irregular widths and intervals in two directions. The depth of linear scratches 13 is exaggerated in FIG. 2(c) for the purpose of explanation. As shown in FIG. 2(d), the linear scratches 13 have various widths W and intervals I. The widths W and intervals I of linear scratches 13 are determined at a height corresponding to a surface S of the thin metal film 12 before forming linear scratches. Because the linear scratches 13 have various widths W and intervals I, the electromagnetic-wave-absorbing film 1 can efficiently absorb electromagnetic noise in a wide frequency range.

90% or more of the widths W of the linear scratches 13 are in a range of preferably 0.1-100 μm, more preferably 0.5-50 μm, most preferably 0.5-20 μm. The average width Wav of the linear scratches 13 is preferably 1-50 μm, more preferably 1-10 μm, most preferably 1-5 μm.

The lateral intervals I of the linear scratches 13 are in a range of preferably 1-500 μm, more preferably 1-100 μm, most preferably 1-50 μm, particularly 1-30 μm. The average lateral interval Iav of the linear scratches 13 is preferably 1-200 μm, more preferably 5-50 μm, most preferably 5-30 μm.

Because the lengths Ls of the linear scratches 13 are determined by sliding conditions (mainly relative peripheral speeds of the pattern roll and the composite film, and sliding direction of the composite film to the pattern roll), most linear scratches 13 have substantially the same lengths Ls (substantially equal to the average length Lsav), unless the sliding conditions are changed. The lengths Ls of the linear scratches 13 may be practically about 1-100 mm, preferably 2-10 mm, though not particularly restrictive.

The acute crossing angle θs, which may be simply called "crossing angle θs" unless otherwise mentioned, of the linear scratches 13a, 13b is preferably 30-90°, more preferably 45-90°. By adjusting the sliding conditions of the composite film to the pattern rolls (relative peripheral speeds, sliding directions, etc.), the linear scratches 13 having various crossing angles θs can be obtained.

(4) Production Method

FIGS. 3(a)-3(e) show an example of apparatuses for forming linear scratches 113 (113a, 113b) in two directions. This apparatus comprises (a) a reel 221 from which a composite film 100 having a thin metal film 112 formed on a plastic film is unwound; (b) a first pattern roll 202a arranged in a different direction from the lateral direction of the composite film 100 on the side of the thin metal film 112; (c) a first push roll 203a arranged upstream of the first pattern roll 202a on the opposite side to the thin metal film 112; (d) a second pattern roll 202b arranged in an opposite direction to the first pattern roll 202a with respect to the lateral direction of the composite film 100 on the side of the thin metal film 112; (e) a second push roll 203b arranged downstream of the second pattern roll 202b on the opposite side to the thin metal film 112; (f) an electric-resistance-measuring means 204a arranged on the side of the thin metal film 112 between the first and second pattern rolls 202a, 202b; (g) a second electric-resistance-measuring means 204b arranged downstream of the second pattern roll 202b on the side of the thin metal film 112; and (h) a reel 224, around which a linearly-scratched composite film (electromagnetic-wave-absorbing film) 111 is wound, in this order from upstream. In addition, pluralities of guide rolls 222, 223 are arranged at predetermined positions. Each pattern roll 202a, 202b is rotatably supported by a backup roll (for example, rubber roll) 205a, 205b.

Figure 3A:
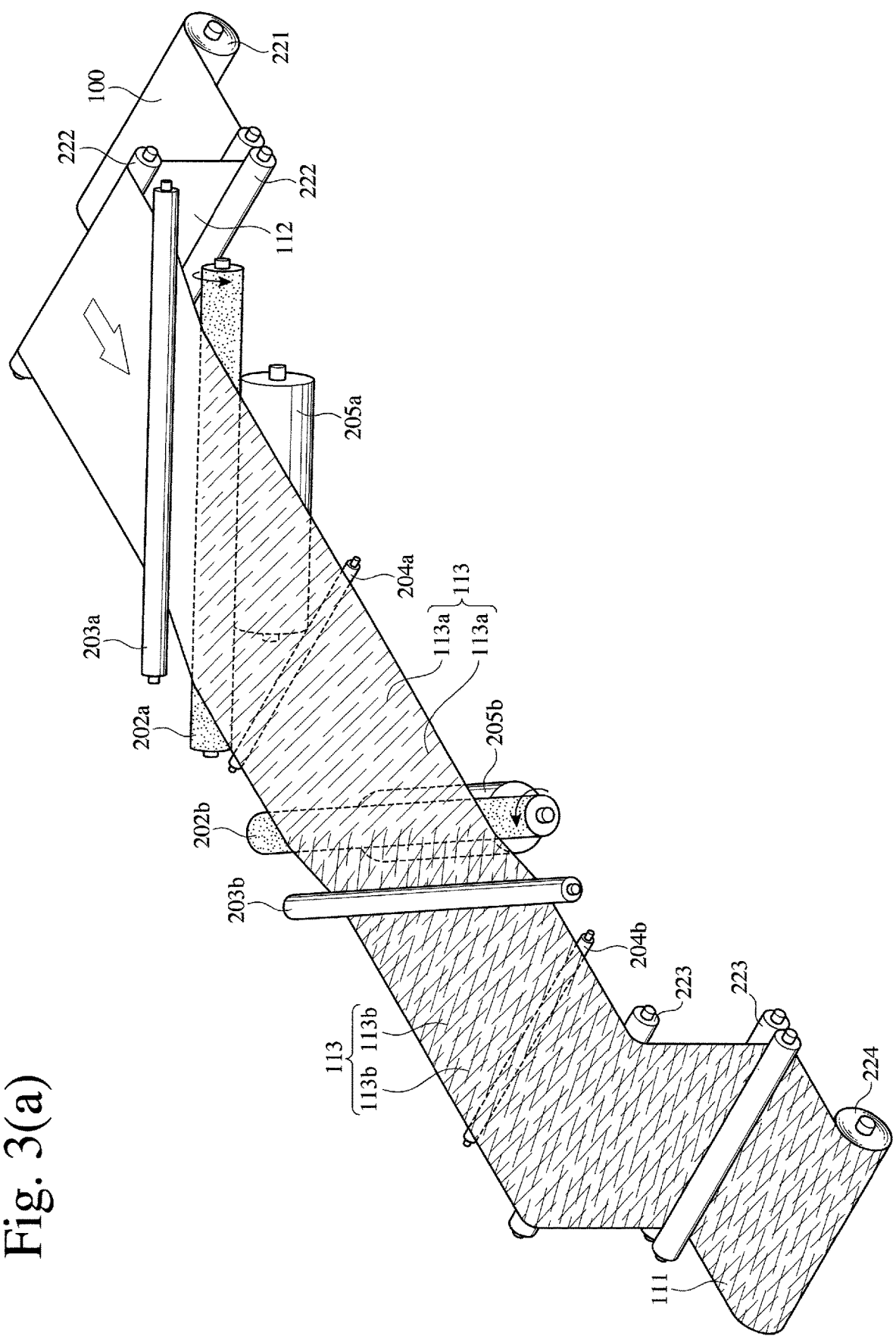
FIG. 3(a) is a perspective view showing an example of apparatuses for forming linear scratches.
Figure 3B:
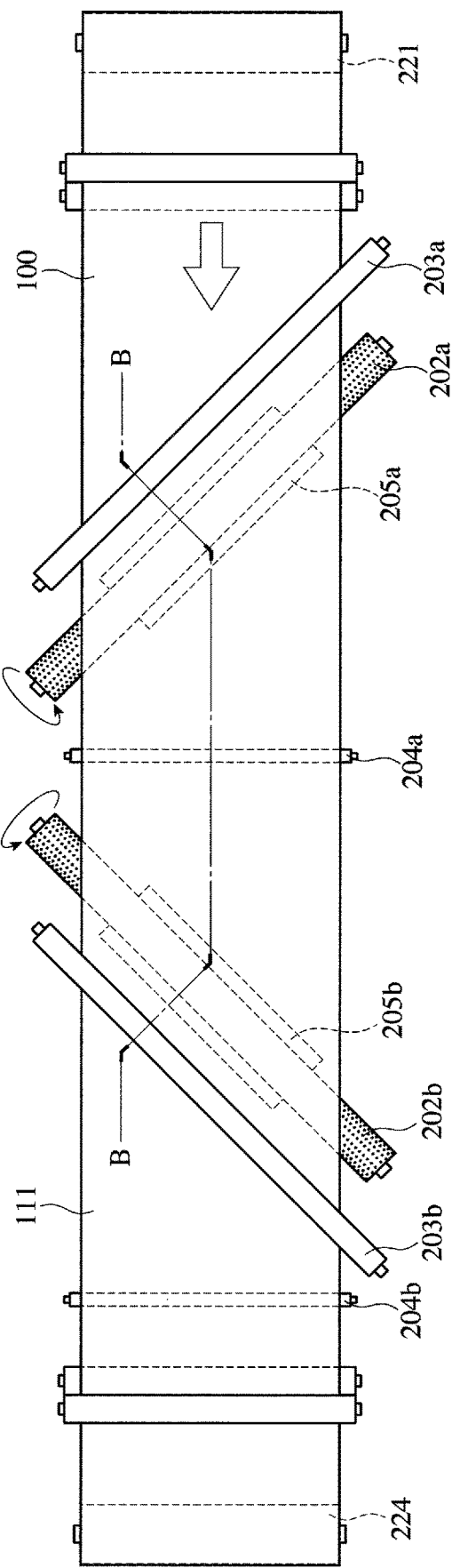
FIG. 3(b) is a plan view showing the apparatus of FIG. 3(a).
Figure 3C:
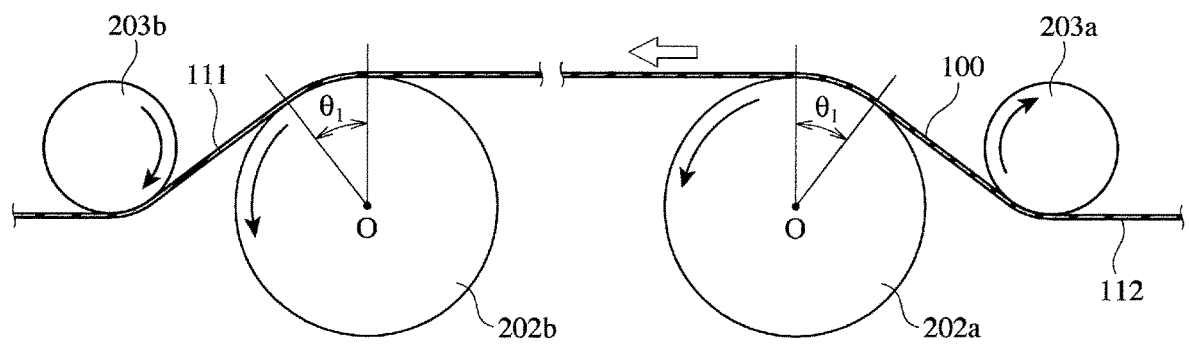
FIG. 3(c) is a cross-sectional view taken along the line B-B in FIG. 3(b).

Because the position of each push roll 203a, 203b is lower than a position at which the composite film 100 is brought into sliding contact with each pattern roll 202a, 202b as shown in FIG. 3(c), the thin metal film 112 of the composite film 100 is pushed to each pattern roll 202a, 202b. With this condition met, the vertical position of each push roll 203a, 203b may be adjusted to control the pressing power of each pattern roll 202a, 202b to the thin metal film 112, and a sliding distance proportional to a center angle $\theta_1$.

Figure 3D:
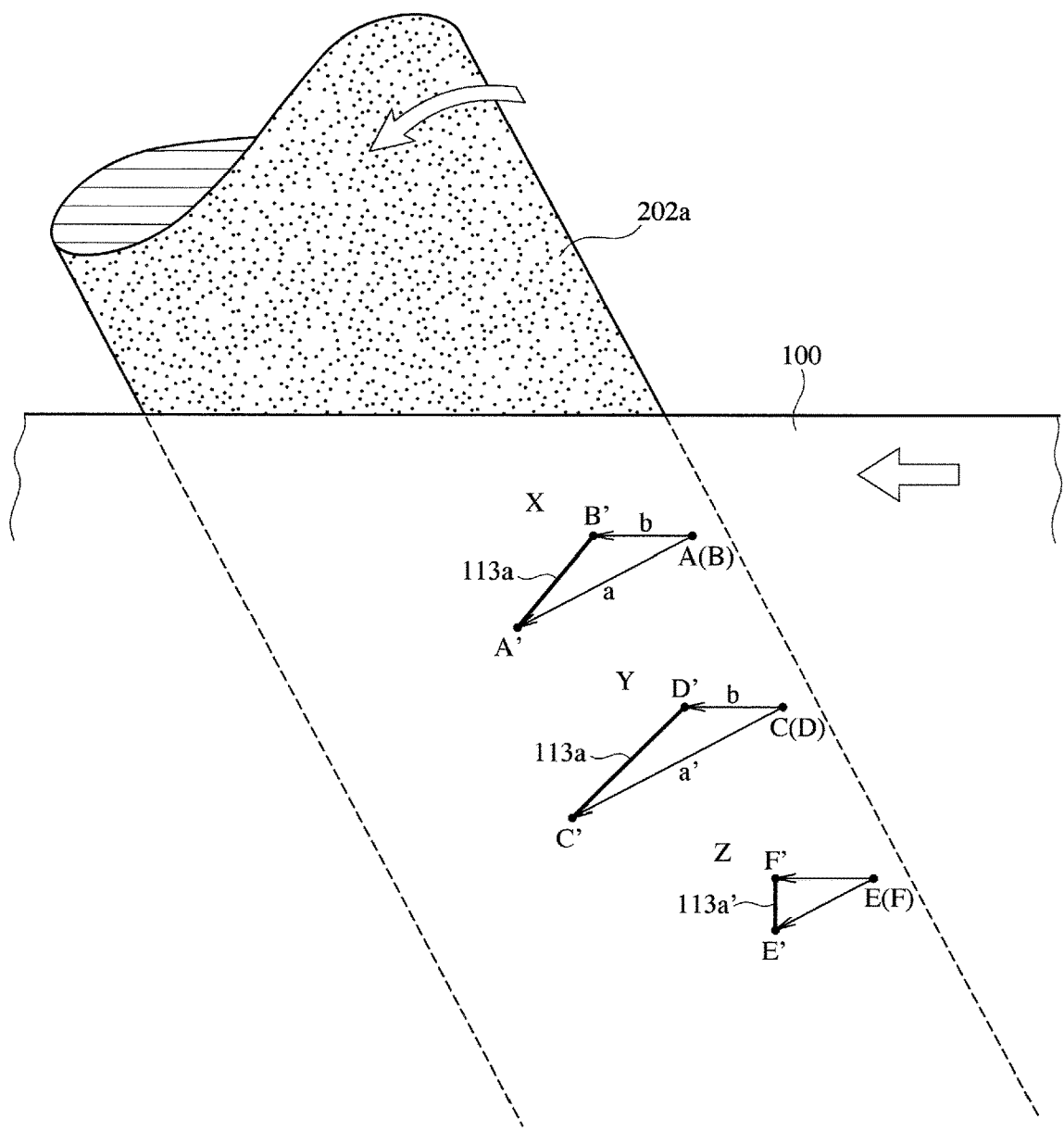
FIG. 3(d) is an enlarged, partial plan view showing the principle of forming linear scratches inclined to the moving direction of a composite film.
Figure 3E:
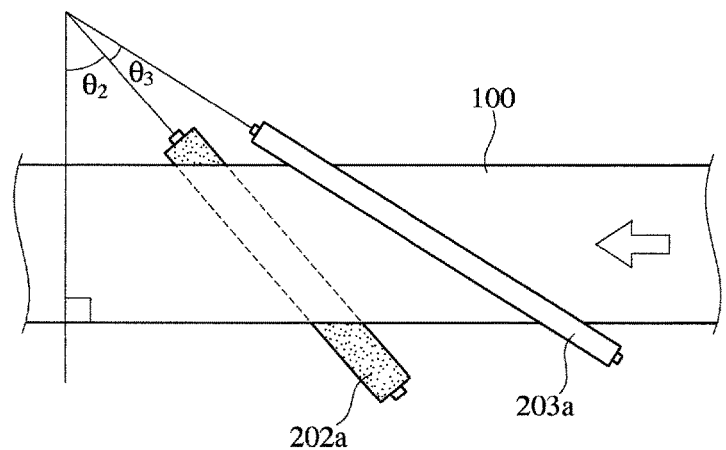
FIG. 3(e) is a partial plan view showing the inclination angles of a pattern roll and a push roll to a composite film in the apparatus of FIG. 3(a).

FIG. 3(d) shows the principle that linear scratches 113a are formed on the composite film 100 with inclination to the moving direction thereof. Because the pattern roll 202a is inclined to the moving direction of the composite film 100, the moving direction (rotation direction) a of fine, hard particles on the pattern roll 202a differs from the moving direction b of the composite film 100. After a fine, hard particle at a point A on the pattern roll 202a comes into contact with the thin metal film 112 to form a scratch B as shown by X, the fine, hard particle moves to a point A', and the scratch B moves to a point B'. While the fine, hard particle moves from the point A to the point A', a scratch is continuously formed, resulting in a linear scratch 113a extending from the point B' to the point A'.

The directions and crossing angle θs of the first and second linear scratches formed by the first and second pattern rolls 202a, 202b can be adjusted by changing the angle of each pattern roll 202a, 202b to the composite film 100, and/or the peripheral speed of each pattern roll 202a, 202b relative to the moving speed of the composite film 100. For instance, when the peripheral speed a of the pattern roll 202a increases relative to the moving speed b of the composite film 100, the linear scratches 113a can be inclined, for example, 45° to the moving direction of the composite film 100 like a line C'D' shown by Y in FIG. 3(d). Similarly, the peripheral speed a of the pattern roll 202a can be changed by changing the inclination angle $\theta_2$ of the pattern roll 202a to the lateral direction of the composite film 100. This is true for the pattern roll 202b. Accordingly, with both pattern rolls 202a, 202b adjusted, the directions of the linear scratches 113a, 113b can be changed.

Because each pattern roll 202a, 202b is inclined to the composite film 100, sliding contact with each pattern roll 202a, 202b is likely to exert a force in a lateral direction onto the composite film 100. Accordingly, to prevent the lateral displacement of the composite film 100, it is preferable to adjust the vertical position and/or angle of each push roll 203a, 203b to each pattern roll 202a, 202b. For instance, the proper adjustment of a crossing angle $\theta_3$ between the axis of the pattern roll 202a and the axis of the push roll 203a can provide pressing power with such a lateral distribution as to cancel lateral components, thereby preventing the lateral displacement. The adjustment of the distance between the pattern roll 202a and the push roll 203a also contributes to the prevention of the lateral displacement. To prevent the lateral displacement and breakage of the composite film 100, the rotation directions of the first and second pattern rolls 202a, 202b inclined from the lateral direction of the composite film 100 are preferably the same as the moving direction of the composite film 100.

As shown in FIG. 3(b), each electric-resistance-measuring means (roll) 204a, 204b comprises a pair of electrodes (not shown) via an insulating portion, between which the electric resistance of the linearly scratched thin metal film 112 is measured. The electric resistance measured by the electric-resistance-measuring means 204a, 204b is compared with a target electric resistance, to adjust the operation conditions such as the moving speed of the composite film 100, the rotation speeds and inclination angles $\theta_2$ of the pattern rolls 202a, 202b, the positions and inclination angles $\theta_3$ of the push rolls 203a, 203b, etc., depending on their difference.

Figure 4:
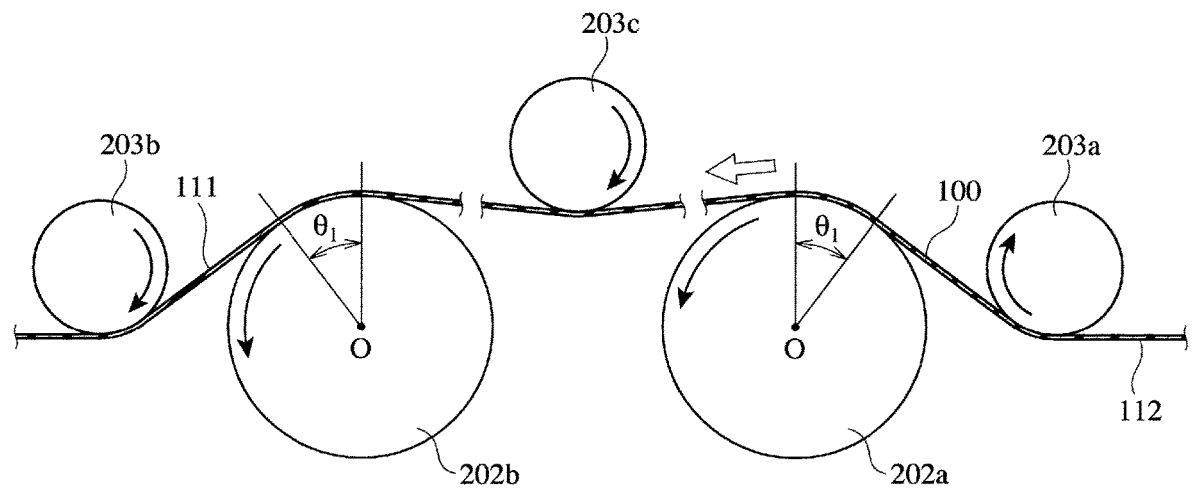
FIG. 4 is a partial cross-sectional view showing an apparatus for forming linear scratches.

To increase the pressing forces of the pattern rolls 202a, 202b to the composite film 100, a third push roll 203c may be provided between the pattern rolls 202a, 202b as shown in FIG. 4. The third push roll 203c increases the sliding distance of the thin metal film 12 proportional to a center angle $\theta_1$, resulting in longer linear scratches 113a, 113b. The adjustment of the position and inclination angle of the third push roll 203c can contribute to the prevention of the lateral displacement of the composite film 100.

Figure 5:
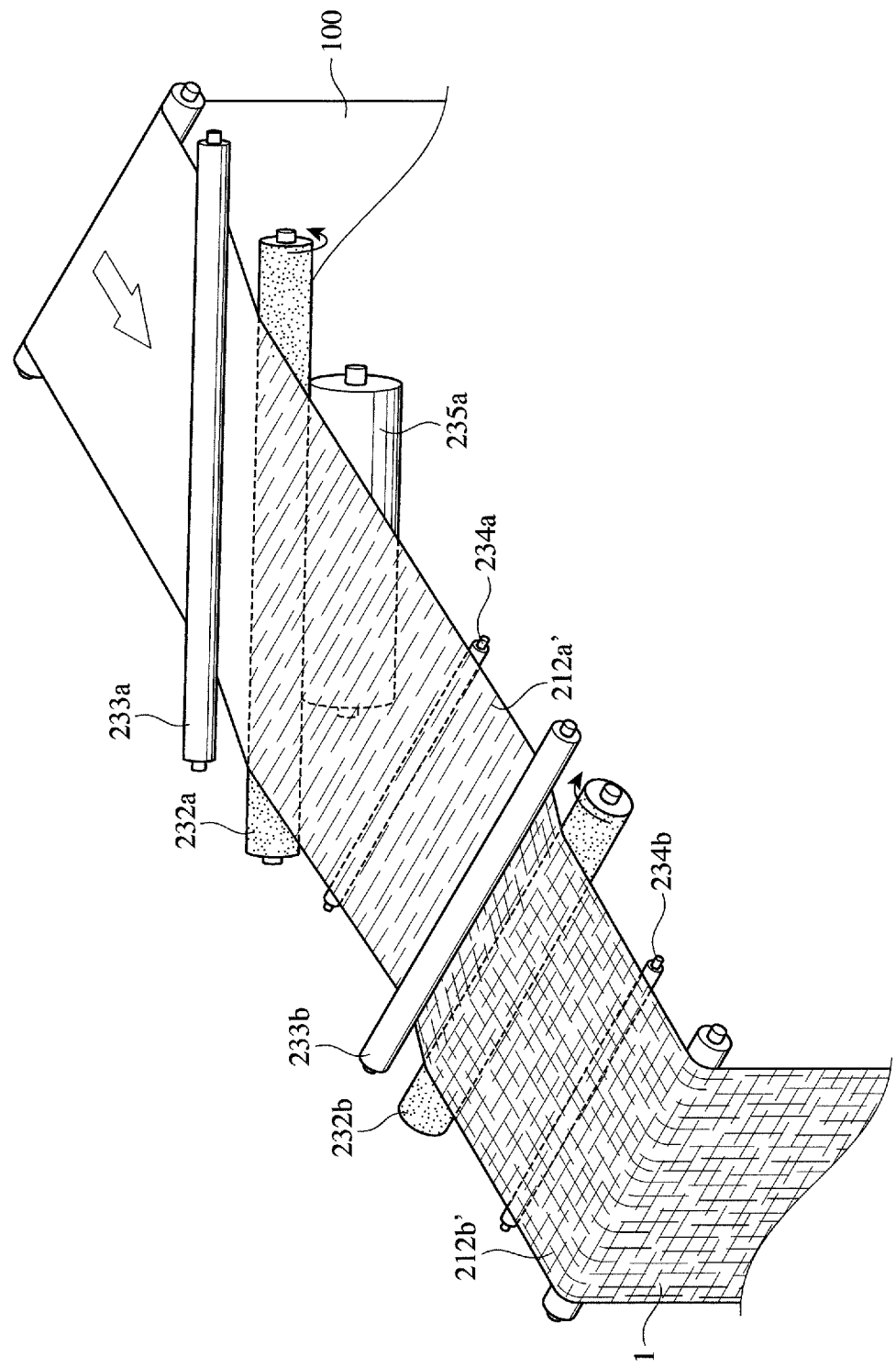
FIG. 5 is a perspective view showing another example of apparatuses for forming linear scratches.

FIG. 5 shows an example of apparatuses for forming linear scratches oriented in two perpendicular directions. This apparatus is different from the apparatus shown in FIGS. 3(a)-3(e), in that a second pattern roll 232b is in parallel to the lateral direction of the composite film 100. Accordingly, only portions different from those shown in FIGS. 3(a)-3(e) will be explained. The rotation direction of the second pattern roll 232b may be the same as or opposite to the moving direction of the composite film 100. Also, the second push roll 233b may be upstream or downstream of the second pattern roll 232b. This apparatus makes the direction (line E'F') of linear scratches 113a' in alignment with the lateral direction of the composite film 100 as shown by Z in FIG. 3(d), thereby forming linear scratches crossing at 90°.

Operation conditions determining not only the inclination angles and crossing angles of linear scratches but also their depths, widths, lengths and intervals are the moving speed of the composite film 100, the rotation speeds and inclination angles and pressing powers of the pattern rolls, etc. The moving speed of the composite film 100 is preferably 5-200 m/minute, and the peripheral speed of the pattern roll is preferably 10-2,000 m/minute. The inclination angles $\theta_2$ of the pattern rolls are preferably 20°-60°, particularly about 45°. The tension (in parallel to the pressing power) of the composite film 100 is preferably 0.05-5 kgf/cm width.

The pattern rolls used in the apparatus for forming linear scratches are preferably rolls having fine particles with sharp edges and Mohs hardness of 5 or more on the surface, for instance, the diamond rolls described in JP 2002-59487 A. Because the widths of linear scratches are determined by the sizes of fine particles, 90% or more of fine diamond particles preferably have sizes in a range of 1-1,000 µm, more preferably in a range of 10-200 µm. The fine diamond particles are attached to the roll surface preferably at an area ratio of 50% or more.

[2] Electromagnetic-Wave-Shielding Film

To reflect electromagnetic wave noise transmitting the electromagnetic-wave-absorbing film 1 and project it to the electromagnetic-wave-absorbing film 1 again, the electromagnetic-wave-shielding film 2 should have a function of reflecting electromagnetic wave noise. To exhibit such function effectively, the electromagnetic-wave-shielding film 2 is preferably a conductive metal foil, a plastic film having a thin conductive metal film or coating, or a carbon sheet. The electromagnetic-wave-absorbing film 1 and the electromagnetic-wave-shielding film 2 are preferably laminated via a non-conductive adhesive, which may be a known one.

(1) Conductive Metal Foil

The conductive metal is preferably at least one selected from the group consisting of aluminum, copper, silver, tin, nickel, cobalt, chromium, and their alloys. The conductive metal foil is preferably as thick as 5-50 µm.

(2) Thin Conductive Metal Film or Coating

The thin conductive metal film is preferably a vapor-deposited film of the above conductive metal. The vapor-deposited metal film may be as thick as several tens of nanometers to several tens of micrometers. The plastic film on which a vapor-deposited film of the above conductive metal is formed may be the same as the plastic film 11 in the electromagnetic-wave-absorbing film 1.

(3) Conductive Metal Coating

The conductive metal coating can be formed by coating a plastic film with an ink (paste) comprising conductive metal powder such as silver powder, etc. highly dispersed in a thermoplastic resin or a photocuring resin, drying the resultant coating, and then irradiating the coating with ultraviolet rays, if necessary. The conductive ink (paste) may be a known one, for example, a photocuring, conductive ink composition (JP 2016-14111 A) comprising a conductive filler, a photoinitiator, and a polymer dispersant, the percentage of the conductive filler being 70-90% by mass; and the conductive filler being silver powder having a particle size $D_{50}$ of 0.3-3.0 μm, 50% or more by mass of which is in a scale, foil or flake shape. The plastic film on which the conductive metal is coated may be the same as the plastic film 11 in the electromagnetic-wave-absorbing film 1.

(4) Carbon Sheet

The carbon sheet used as the electromagnetic-wave-shielding film may be a commercially available PGS (registered trademark) graphite sheet (available from Panasonic Corporation) formed by heat-treating a polyimide film at an ultrahigh temperature in an inert gas, a carbon sheet (heat dissipation sheet) comprising graphite powder and carbon black, etc.

Usable as a carbon sheet of graphite powder/carbon black is a heat dissipation sheet (JP 2015-170660 A) having a structure in which carbon black is uniformly dispersed among fine graphite particles, with a fine graphite particles/carbon black mass ratio of 75/25-95/5, a density of 1.9 g/cm$^3$ or more, and an in-plane thermal conductivity of 570 W/mK or more. The fine graphite particles preferably have an average diameter of 5-100 μm and an average thickness of 200 nm or more. This heat dissipation sheet is preferably as thick as 25-250 μm.

This heat dissipation sheet can be formed by a method comprising (1) preparing a dispersion containing 5-25% by mass in total of fine graphite particles and carbon black, and 0.05-2.5% by mass of a binder resin in an organic solvent, a mass ratio of the fine graphite particles to the carbon black being 75/25-95/5; (2) repeating a step of applying the dispersion to a surface of a support plate and a drying step plural times, to form a resin-containing composite sheet comprising the fine graphite particles, the carbon black, and the binder resin; (3) burning the resin-containing composite sheet to remove the binder resin; and (4) pressing the resultant composite sheet of fine graphite particles/carbon black for densification.

[3] Arrangement of Electromagnetic-Wave-Absorbing Film and Electromagnetic-Wave-Shielding Film (1) Area Ratio As shown in FIG. 1(b), an area ratio of the electromagnetic-wave-shielding film 2 to the electromagnetic-wave-absorbing film 1 is 10-80%. When the area ratio is less than 10% or more than 80%, the absorbability of electromagnetic wave noise in a desired frequency range is not sufficiently maximized. This is an unexpected result, and it is an important feature of the present invention that the area ratio of the electromagnetic-wave-shielding film 2 to the electromagnetic-wave-absorbing film 1 is 10-80%. The lower limit of the area ratio is preferably 20%, more preferably 30%, further preferably 40%, most preferably 45%. The upper limit of the area ratio is preferably 70%, more preferably 65%, most preferably 60%. The area ratio range of the electromagnetic-wave-shielding film 2 to the electromagnetic-wave-absorbing film 1 is, for example, preferably 20-80%, more preferably 30-70%, further preferably 40-65%, most preferably 45-60%.

(2) Position

Figure 6A:
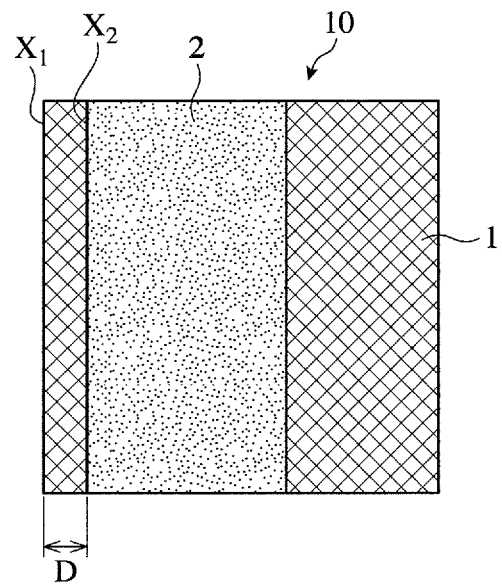
FIG. 6(a) is a plan view showing another example of the electromagnetic-wave-absorbing composite sheets of the present invention.
Figure 6B:
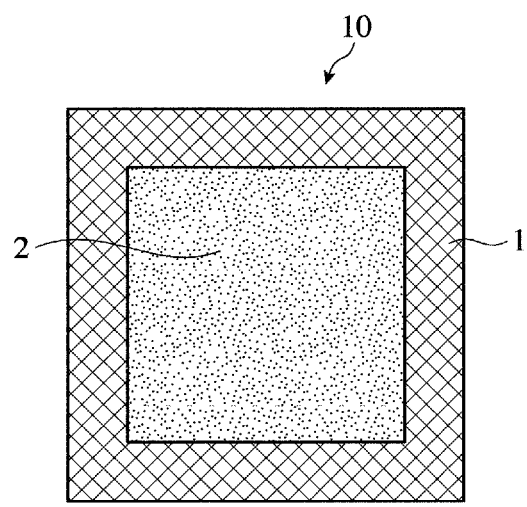
FIG. 6(b) is a plan view showing a further example of the electromagnetic-wave-absorbing composite sheets of the present invention.

A center of the electromagnetic-wave-shielding film 2 is preferably positioned at a center of the electromagnetic-wave-absorbing film 1, but it may be deviated to change a frequency at which the electromagnetic wave absorbability has a peak. The position change of the electromagnetic-wave-shielding film 2 may be conducted by shifting the electromagnetic-wave-shielding film 2 in one direction relative to the electromagnetic-wave-absorbing film 1 as shown in FIG. 6(a), or by reducing the size of the electromagnetic-wave-shielding film 2 such that four sides of the electromagnetic-wave-shielding film 2 are receding inward from four sides of the electromagnetic-wave-absorbing film 1 as shown in FIG. 6(b). In both cases, because how the electromagnetic-wave-shielding film 2 is shifted or sized relative to the electromagnetic-wave-absorbing film 1 affects a frequency at which the electromagnetic wave absorbability has a peak, it is preferably determined depending on a frequency range in which the electromagnetic wave absorbability is to be maximized. In any of FIGS. 6(a) and 6(b), of course, the area ratio of the electromagnetic-wave-shielding film 2 to the electromagnetic-wave-absorbing film 1 should meet the above requirement.

The present invention will be explained in more detail referring to Examples below without intention of restricting the present invention thereto.

Reference Example 1

Using an apparatus having the structure shown in FIG. 5 comprising pattern rolls 232a, 232b having electroplated fine diamond particles having a particle size distribution of 50-80 linear scratches oriented in two directions with a crossing angle θs of 90° were formed in a thin aluminum film having a thickness of 0.05 μm, which was formed on a surface of a biaxially oriented polyethylene terephthalate (PET) film as thick as 16 μm by a vacuum vapor deposition method. An optical photomicrograph of the linearly-scratched, thin aluminum film revealed that the linear scratches had the following characteristics:

Range of widths W: 0.5-5 μm,
Average width Way: 2 μm,
Range of intervals I: 2-30 μm,
Average interval Iav: 20 μm,
Average length Lsav: 5 mm, and
Crossing angle θs: 90°.

Reference Example 2

Using an apparatus having the structure shown in FIG. 3 comprising pattern rolls 202a, 202b having electroplated fine diamond particles having a particle size distribution of 50-80 μm, linear scratches oriented in two directions with a crossing angle θs of 60° were formed in a thin aluminum film having a thickness of 0.05 μm, which was formed on a surface of a PET film as thick as 16 μm by a vacuum vapor deposition method. An optical photomicrograph of the linearly-scratched, thin aluminum film revealed that the linear scratches had the following characteristics:

Range of widths W: 0.5-5 μm,
Average width Way: 2 μm,
Range of intervals I: 2-30 μm,
Average interval Iav: 20 μm,
Average length Lsav: 5 mm, and
Crossing angle θs: 60°.

Reference Example 3

A thin aluminum film as thick as 0.05 μm, which was formed on a surface of a PET film as thick as 16 μm by a vacuum vapor deposition method, was provided with linear scratches oriented in two directions with a crossing angle θs of 45° by the same method as in Reference Example 2 except for changing the crossing angle θs to 45°, to produce an electromagnetic-wave-absorbing film.

Reference Example 4

A thin aluminum film as thick as 0.05 μm, which was formed on a surface of a PET film as thick as 16 μm by a vacuum vapor deposition method, was provided with linear scratches oriented in two directions with a crossing angle θs of 30° by the same method as in Reference Example 2 except for changing the crossing angle θs to 30°, to produce an electromagnetic-wave-absorbing film.

EXAMPLE 1

Figure 8:
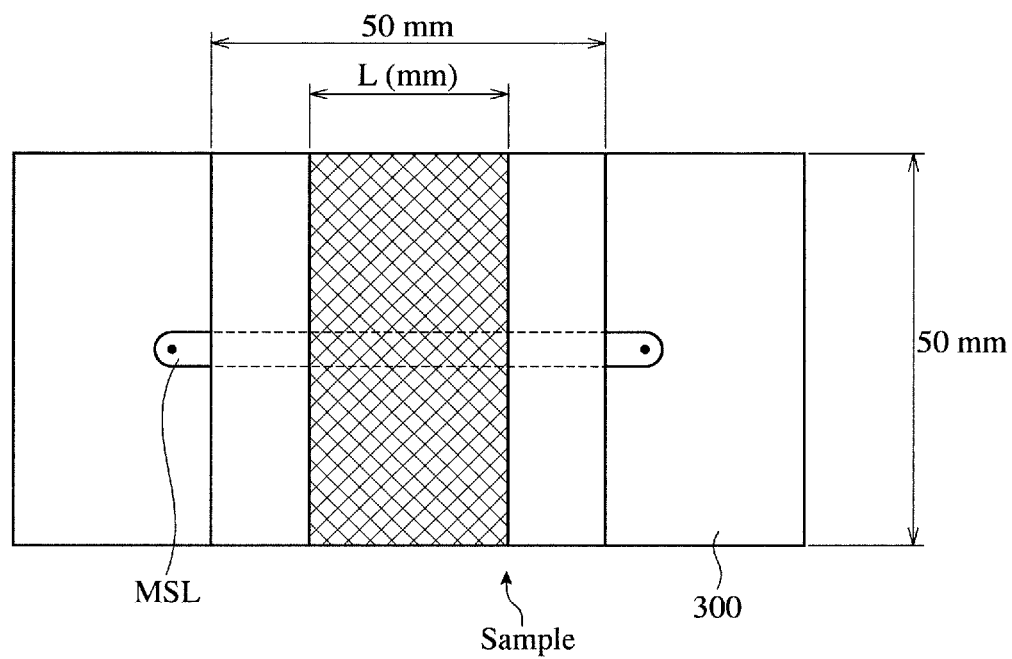
FIG. 8 is a plan view showing an example of samples placed on a microstripline MSL.
Figure 9:
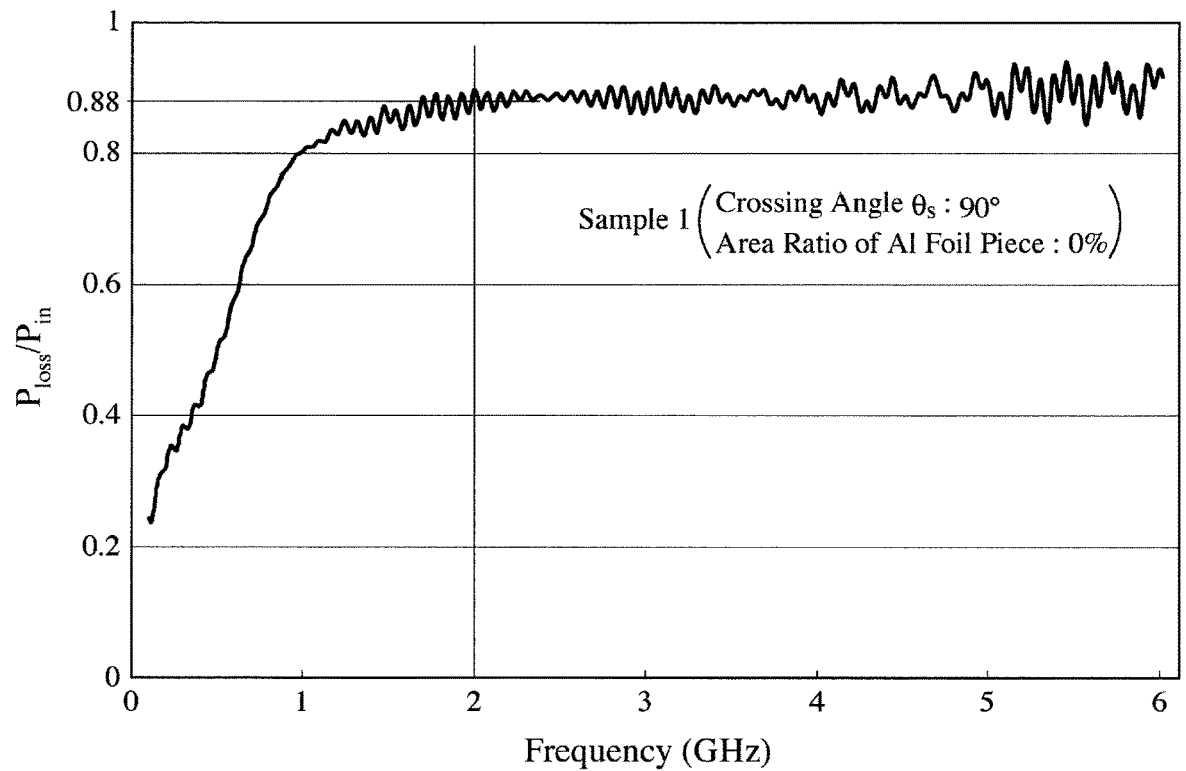
FIG. 9 is a graph showing the noise absorption ratio $P_{loss}/P_{in}$ of Sample 1 (crossing angle θs of linear scratches=90°, and area ratio of aluminum foil piece=0%) of the electromagnetic-wave-absorbing composite sheet.
Figure 10:
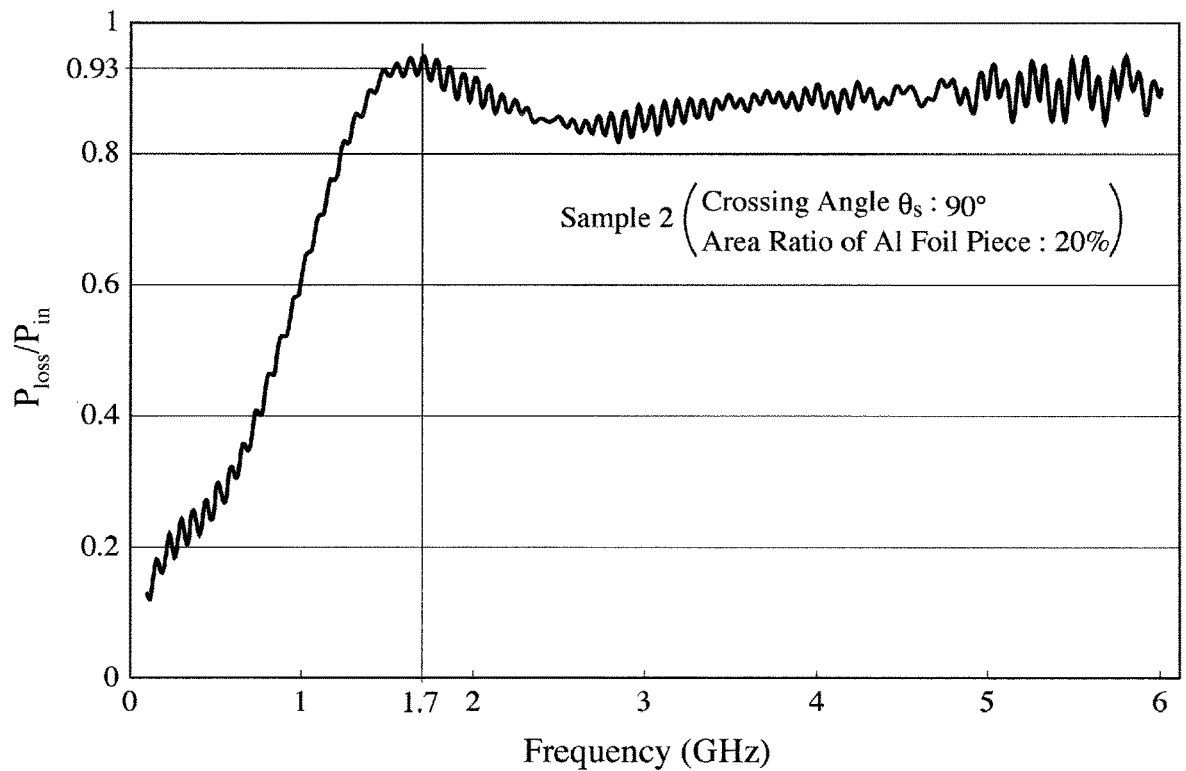
FIG. 10 is a graph showing the noise absorption ratio $P_{loss}/P_{in}$ of Sample 2 (crossing angle θs of linear scratches=90°, and area ratio of aluminum foil piece=20%) of the electromagnetic-wave-absorbing composite sheet.
Figure 11:
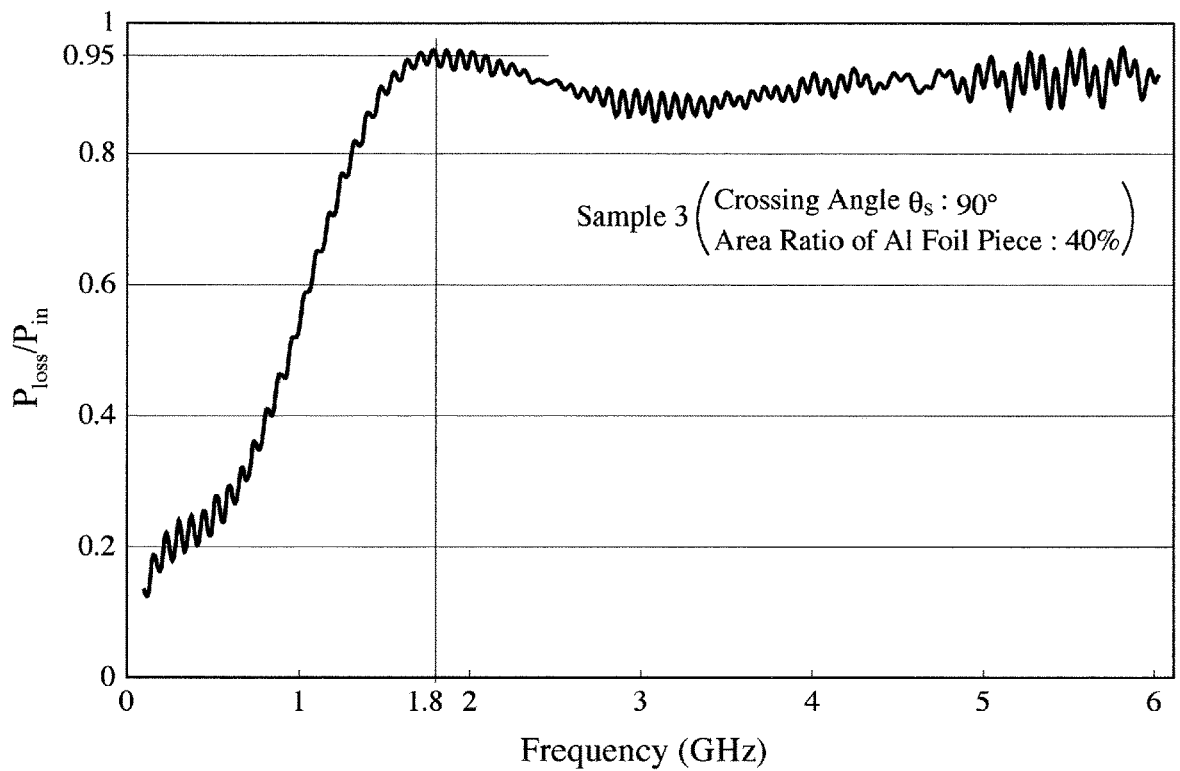
FIG. 11 is a graph showing the noise absorption ratio $P_{loss}/P_{in}$ of Sample 3 (crossing angle θs of linear scratches=90°, and area ratio of aluminum foil piece=40%) of the electromagnetic-wave-absorbing composite sheet.
Figure 12:
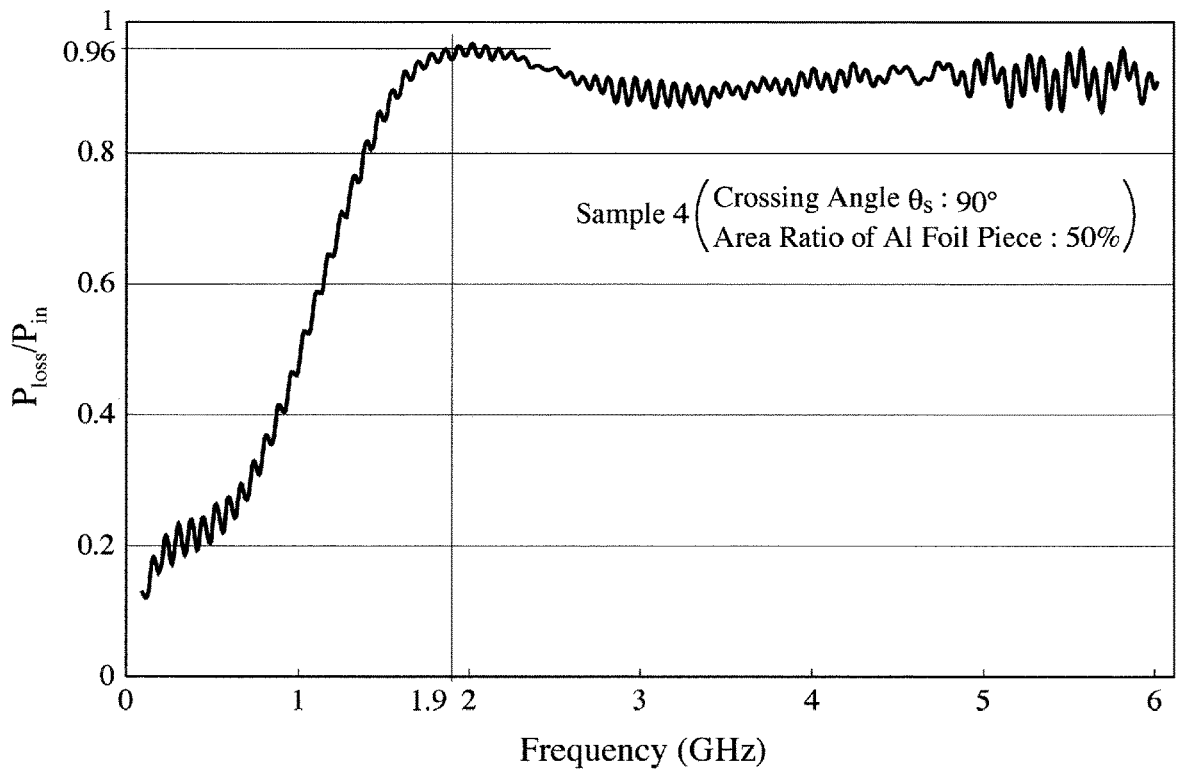
FIG. 12 is a graph showing the noise absorption ratio $P_{loss}/P_{in}$ of Sample 4 (crossing angle θs of linear scratches=90°, and area ratio of aluminum foil piece=50%) of the electromagnetic-wave-absorbing composite sheet.
Figure 13:
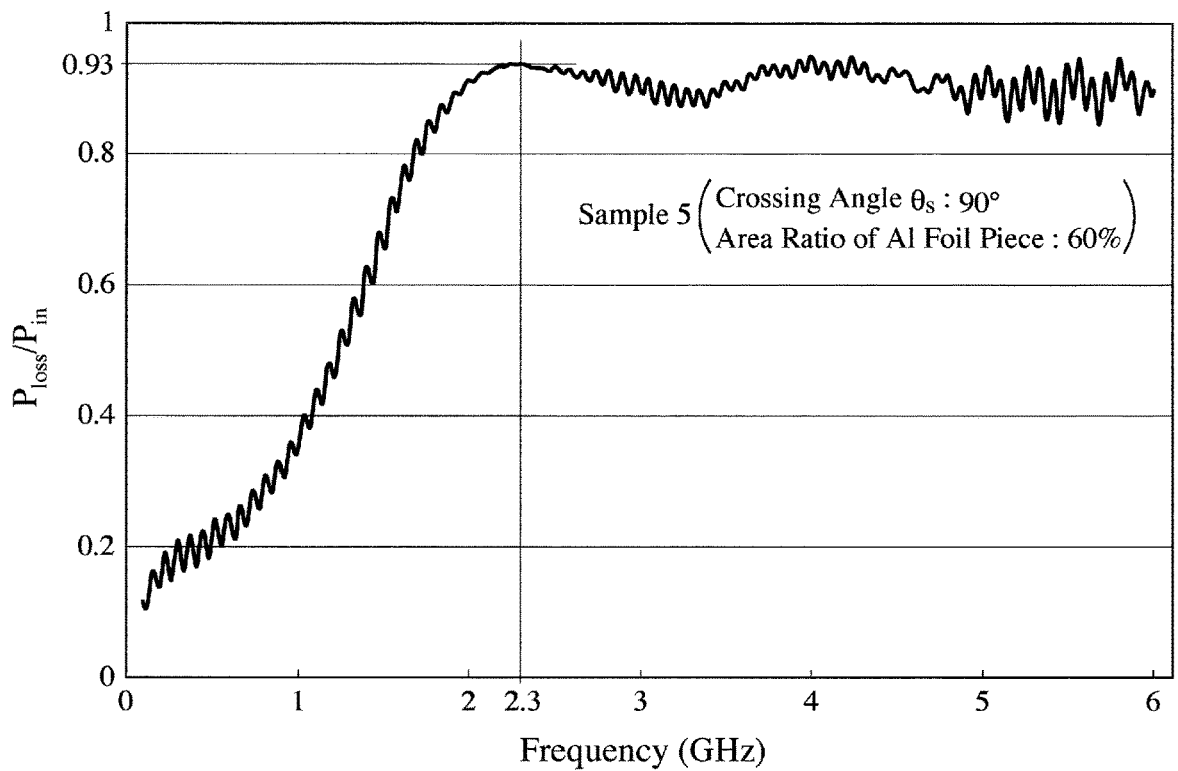
FIG. 13 is a graph showing the noise absorption ratio $P_{loss}/P_{in}$ of Sample 5 (crossing angle θs of linear scratches=90°, and area ratio of aluminum foil piece=60%) of the electromagnetic-wave-absorbing composite sheet.
Figure 14:
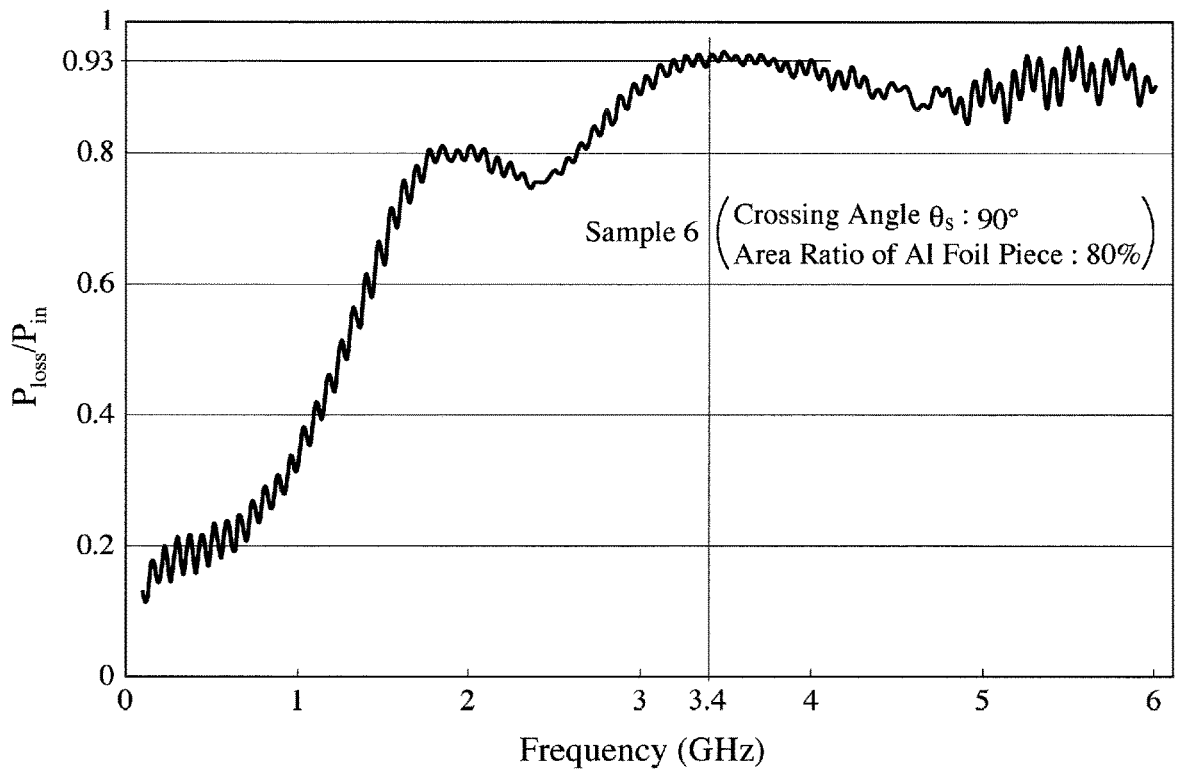
FIG. 14 is a graph showing the noise absorption ratio $P_{loss}/P_{in}$ of Sample 6 (crossing angle θs of linear scratches=90°, and area ratio of aluminum foil piece=80%) of the electromagnetic-wave-absorbing composite sheet.
Figure 15:
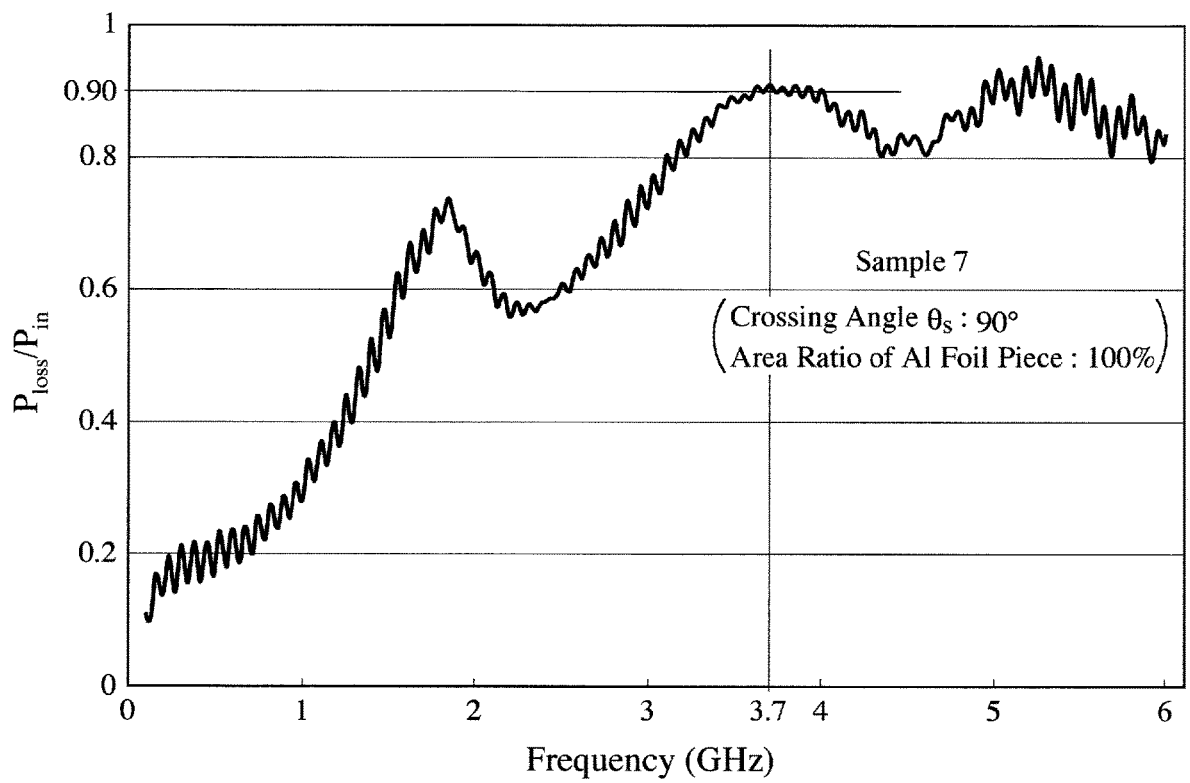
FIG. 15 is a graph showing the noise absorption ratio $P_{loss}/P_{in}$ of Sample 7 (crossing angle θs of linear scratches=90°, and area ratio of aluminum foil piece=100%) of the electromagnetic-wave-absorbing composite sheet.

Electromagnetic-wave-absorbing film pieces of 50 mm×50 mm were cut out of the electromagnetic-wave-absorbing film (crossing angle θs of linear scratches: 90°) obtained in Reference Example 1, and an aluminum foil piece (thickness: 15 μm) having a size of L (0 mm, 10 mm, 20 mm, 25 mm, 30 mm, 40 mm, and 50 mm)×50 mm was laminated via a non-conductive adhesive on each electromagnetic-wave-absorbing film piece as shown in FIG. 8, to produce Samples 1-7. In each Sample, a center of the aluminum foil piece was aligned with a center of the electromagnetic-wave-absorbing film piece.

Figure 7A:
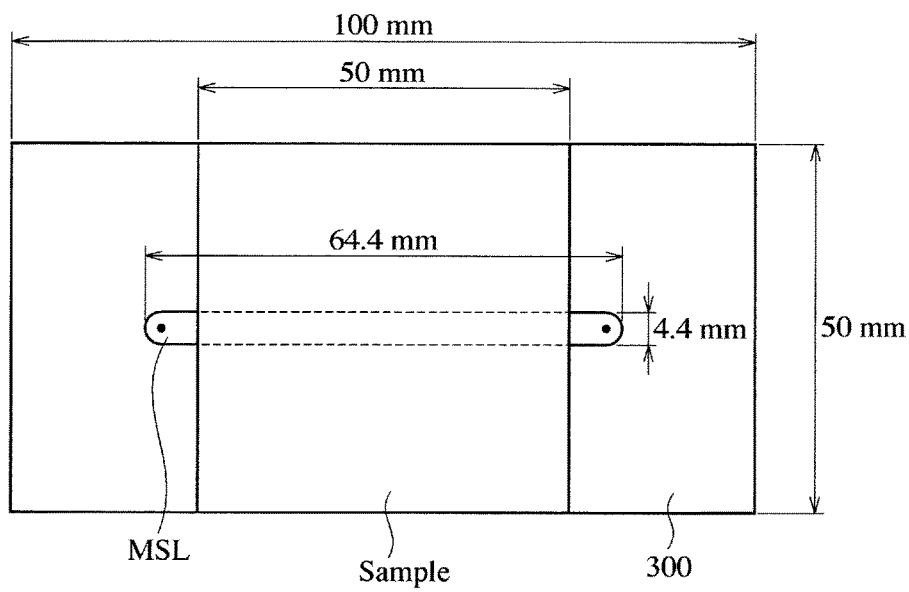
FIG. 7(a) is a plan view showing a system for measuring the powers of reflected wave and transmitted wave to incident wave.
Figure 7B:
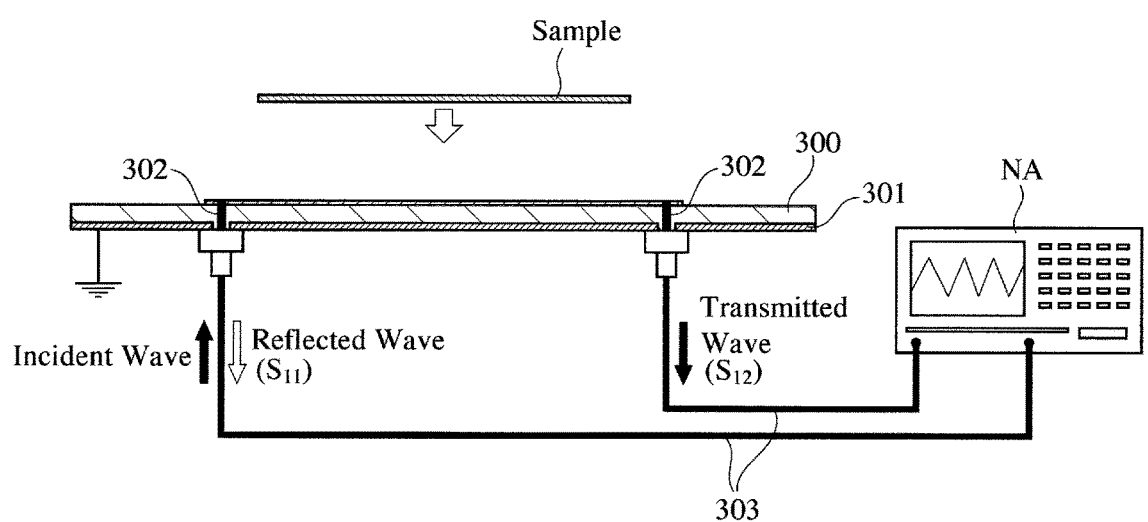
FIG. 7(b) is a schematic, partial cross-sectional view showing the system of FIG. 7(a).

Using a system comprising a microstripline MSL (64.4 mm×4.4 mm) of 50Ω, an insulation substrate 300 supporting the microstripline MSL, a grounded electrode 301 attached to a lower surface of the insulation substrate 300, conductor pins 302, 302 connected to both ends of the microstripline MSL, a network analyzer NA, and coaxial cables 303, 303 connecting the network analyzer NA to the conductor pins 302, 302 as shown in FIGS. 7(a) and 7(b), each sample was attached to an upper surface of the insulation substrate 300 by an adhesive such that a center of each sample was aligned with a center of the microstripline MSL as shown in FIG. 8, to measure reflected wave power $S_{11}$ and transmitted wave power $S_{12}$ to incident wave power in 0.1-6 GHz.

Power loss $P_{loss}$ was determined by subtracting the reflected wave power $S_{11}$ and the transmitted wave power $S_{12}$ from the incident power $P_{in}$ input to the system shown in FIGS. 7(a) and 7(b), and a noise absorption ratio $P_{loss}/P_{in}$ was determined by dividing $P_{loss}$ by the incident power P. The results are shown in FIGS. 9 to 15 and Table 1.

TABLE 1

| Sample No. | θs [1] (°) | Aluminum Foil Piece L (mm) | Area Ratio [2] (%) | $P_{loss}/P_{in}$ | Maximum Noise Absorption Frequency (GHz) |
|---|---|---|---|---|---|
| 1* | 90 | 0 | 0 | 0.88 | 2 |
| 2 | 90 | 10 | 20 | 0.93 | 1.7 |
| 3 | 90 | 20 | 40 | 0.95 | 1.8 |
| 4 | 90 | 25 | 50 | 0.96 | 1.9 |
| 5 | 90 | 30 | 60 | 0.93 | 2.3 |
| 6 | 90 | 40 | 80 | 0.93 | 3.4 |
| 7* | 90 | 50 | 100 | 0.90 | 3.7 |

Note:
[1] θs represents the crossing angle of linear scratches.
[2] An area ratio of the aluminum foil piece to the electromagnetic-wave-absorbing film piece.
Samples with * are outside the scope of the present invention.

In Sample 1 having no aluminum foil piece laminated on the electromagnetic-wave-absorbing film piece, the maximum noise absorption ratio $P_{loss}/P_{in}$ was 0.88 at a frequency of about 2 GHz. In Sample 7 having an aluminum foil piece of the same size laminated on the electromagnetic-wave-absorbing film piece, the maximum noise absorption ratio $P_{loss}/P_{in}$ was 0.90 at a frequency of about 3.7 GHz. On the other hand, in Sample 4 having an aluminum foil piece having a size corresponding to an area ratio of 50% laminated on the electromagnetic-wave-absorbing film piece, the maximum noise absorption ratio $P_{loss}/P_{in}$ was as high as 0.96 at a frequency of about 1.9 GHz. In Sample 6 having an aluminum foil piece having a size corresponding to an area ratio of 80% laminated on the electromagnetic-wave-absorbing film piece, the maximum noise absorption ratio $P_{loss}/P_{in}$ was as high as 0.93, but a frequency at which the maximum noise absorption ratio $P_{loss}/P_{in}$ was exhibited was shifted to 3.4 GHz. It is thus clear that to maximize the noise absorption ratio $P_{loss}/P_{in}$ in a desired frequency range, the area ratio of the aluminum foil piece (electromagnetic-wave-shielding film) to the electromagnetic-wave-absorbing film piece should be 10-80%.

EXAMPLE 2

An aluminum foil piece (thickness: 15 μm) of 25 mm×50 mm was laminated via a non-conductive adhesive on each electromagnetic-wave-absorbing film piece (crossing angle θs of linear scratches: 90°) of 50 mm×50 mm used in Example 1, such that as shown in FIG. 6(a) the distance D between one side $X_1$ of the electromagnetic-wave-absorbing film piece and one side $X_2$ (parallel to $X_1$) of the aluminum foil piece was 0 mm, 5 mm and 10 mm, respectively, to produce Samples 11-13. Each sample was placed on the microstripline MSL on the insulation substrate 300 as shown in FIG. 7(a), to measure its noise absorption ratio $P_{loss}/P_{in}$ in a range of 0.1-6 GHz. With respect to each sample, the distance D, the noise absorption ratio $P_{loss}/P_{in}$ at 2 GHz, the maximum noise absorption ratio $P_{loss}/P_{in}$, and a frequency at the maximum noise absorption ratio are shown in Table 2.

TABLE 2

| Sample No. | θs [1] (°) | D [2] (mm) | $P_{loss}/P_{in}$ at 2 GHz | Maximum $P_{loss}/P_{in}$ (GHz) |
|---|---|---|---|---|
| 11 | 90 | 0 | 0.50 | 0.98 (3.9) |
| 12 | 90 | 5 | 0.60 | 1.0 (3.7) |
| 13 | 90 | 10 | 0.89 | 0.98 (2.6) |

Note:
[1] θs represents the crossing angle of linear scratches.
[2] D represents the distance between one side $X_1$ of the electromagnetic-wave-absorbing film piece and one side $X_2$ of the aluminum foil piece.

As is clear from Table 2, (a) as a center of the aluminum foil piece was shifted closer to a center of the electromagnetic-wave-absorbing film piece, the noise absorption ratio $P_{loss}/P_{in}$ at 2 GHz increased, and (b) as a center of the aluminum foil piece was shifted away from a center of the electromagnetic-wave-absorbing film piece, the noise absorption ratio $P_{loss}/P_{in}$ at 2 GHz decreased, but the noise absorption ratio $P_{loss}/P_{in}$ was maximized at a frequency (near 4 GHz) different from 2 GHz. This indicates that in a noise frequency region of semiconductors, a center of the aluminum foil is preferably as close to a center of the electromagnetic-wave-absorbing film as possible, and that in other frequency regions, a center of the aluminum foil piece may be shifted from a center of the electromagnetic-wave-absorbing film piece to maximize the noise absorption ratio $P_{loss}/P_{in}$.

EXAMPLE 3

Figure 16:
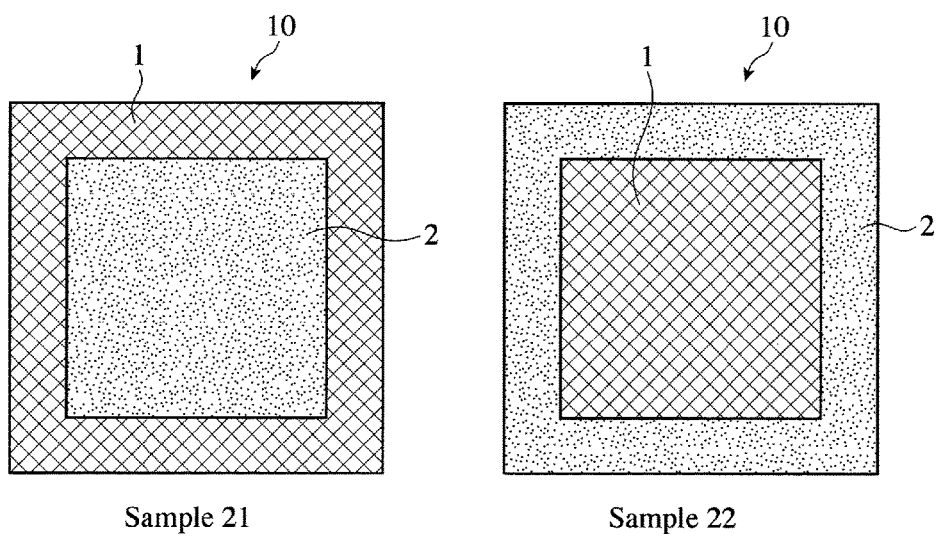
FIG. 16 is a plan view showing Samples 21 and 22 of the electromagnetic-wave-absorbing composite sheet.

As shown in FIG. 16, a square aluminum foil piece having an area ratio of 50%, and a square-frame-shaped aluminum foil piece having an area ratio of 50% were laminated on each of the same electromagnetic-wave-absorbing film pieces of 50 mm×50 mm as in Example 1, such that their centers were in alignment with each other, to produce Samples 21 and 22. The noise absorption ratio $P_{loss}/P_{in}$ of each sample was measured. The measurement results are shown in FIG. 17, together with those of Samples 1 and 4.

Figure 17:
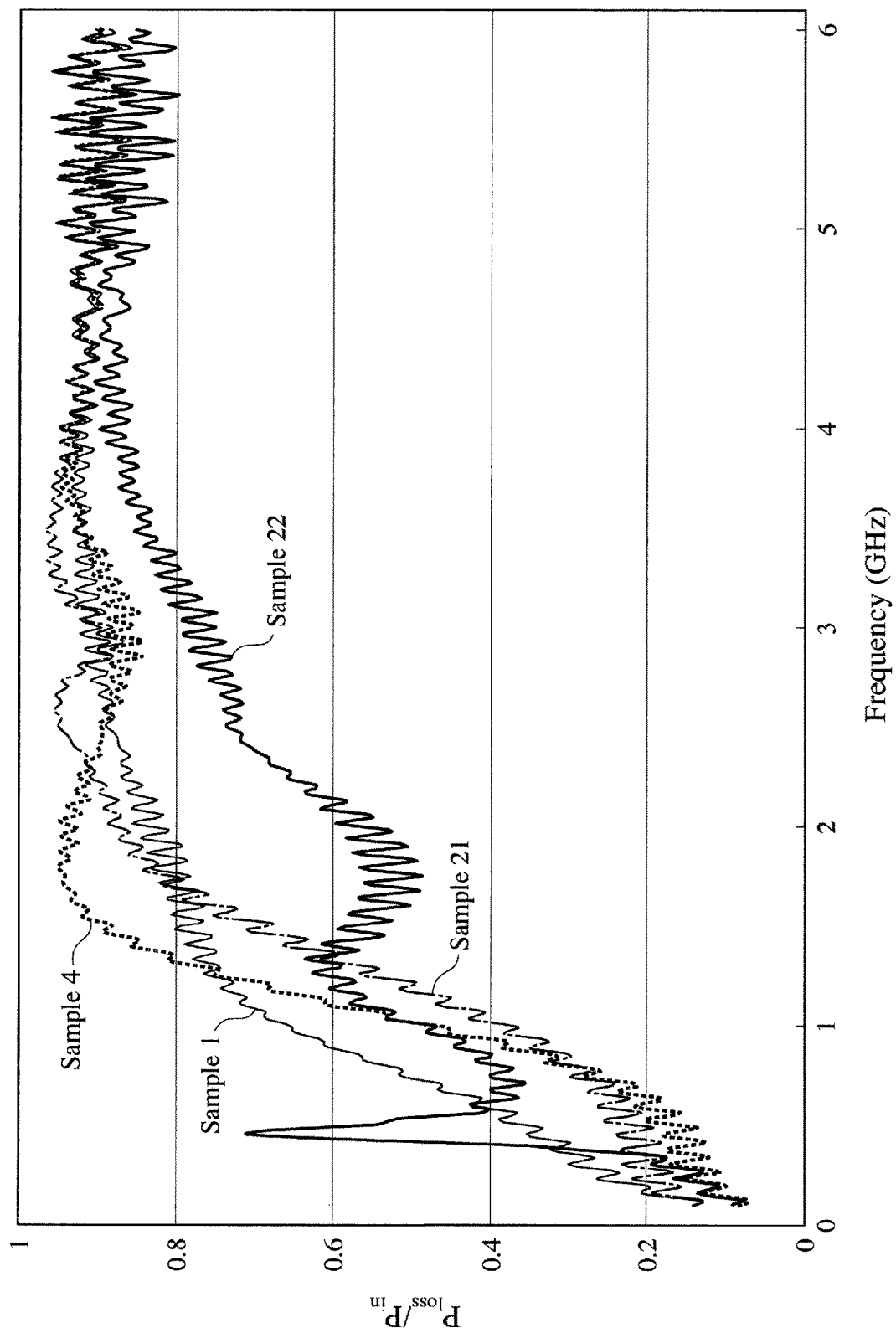
FIG. 17 is a graph showing the noise absorption ratios $P_{loss}/P_{in}$ of Samples 21 and 22 of electromagnetic-wave-absorbing composite sheets comprising aluminum foil pieces having different shapes, together with the noise absorption ratios $P_{loss}/P_{in}$ of Samples 1 and 4.

As is clear from FIG. 17, Sample 21 laminated with a square aluminum foil piece having an area ratio of 50% exhibited the maximum noise absorption ratio $P_{loss}/P_{in}$ on the same level as that of Sample 4 laminated with an aluminum foil piece of 25 mm×50 mm, at a different frequency from that of Sample 4. On the other hand, Sample 22 laminated with an aluminum foil piece having a different shape with the same area ratio exhibited an extremely lower noise absorption ratio $P_{loss}/P_{in}$ than that of Sample 21 in a wide frequency range. This indicates that (a) a frequency at which the maximum noise absorption ratio $P_{loss}/P_{in}$ is exhibited can be changed by changing the shape of an aluminum foil piece (electromagnetic-wave-shielding film), despite the same area ratio; and that (b) among aluminum foil pieces having the same area ratio, an aluminum foil piece having such a shape as occupying a center portion of the electromagnetic-wave-absorbing film piece has a higher noise absorption ratio $P_{loss}/P_{in}$.

EXAMPLE 4

An electromagnetic-wave-absorbing composite sheet as large as covering an IC chip in Fire Stick TV of Amazon, which had the same structure as in Example 1, was produced. An electromagnetic-wave-absorbing film piece was in a square shape having the same size as that of the IC chip, and an aluminum foil piece was in a rectangular shape having an area ratio of 50% to the electromagnetic-wave-absorbing film piece. One pair of opposing sides of the aluminum foil piece were aligned with one pair of opposing sides of the electromagnetic-wave-absorbing film piece, and the distance between the other pair of opposing sides perpendicular to one pair of opposing sides of the aluminum foil piece was 50% of the distance between the other pair of opposing sides of the electromagnetic-wave-absorbing film piece. A center of the laminated aluminum foil piece was aligned with a center of the electromagnetic-wave-absorbing film piece. Namely, the electromagnetic-wave-absorbing composite sheet of Example 4 had the shape shown in FIG. 1(b).

Figure 18A:
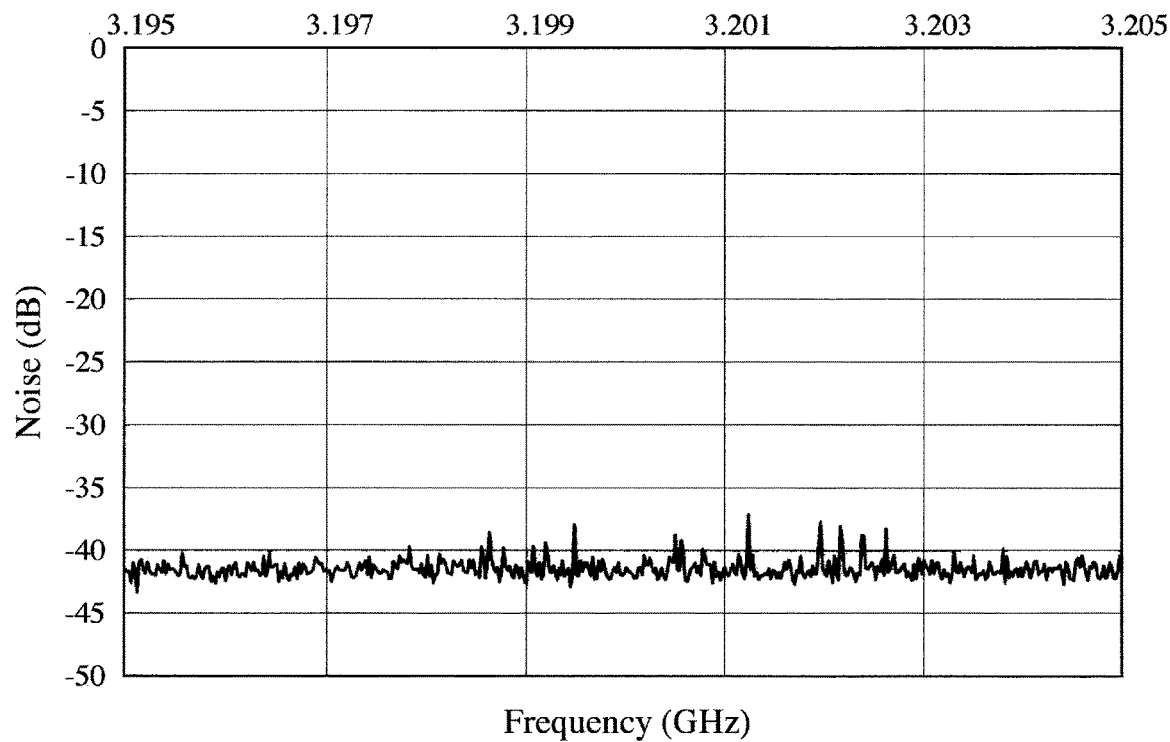
FIG. 18(a) is a graph showing electromagnetic wave noise at a frequency near 3 GHz leaking from Fire Stick TV, when the electromagnetic-wave-absorbing composite sheet of Example 4 was placed on an IC chip in the Fire Stick TV.
Figure 18B:
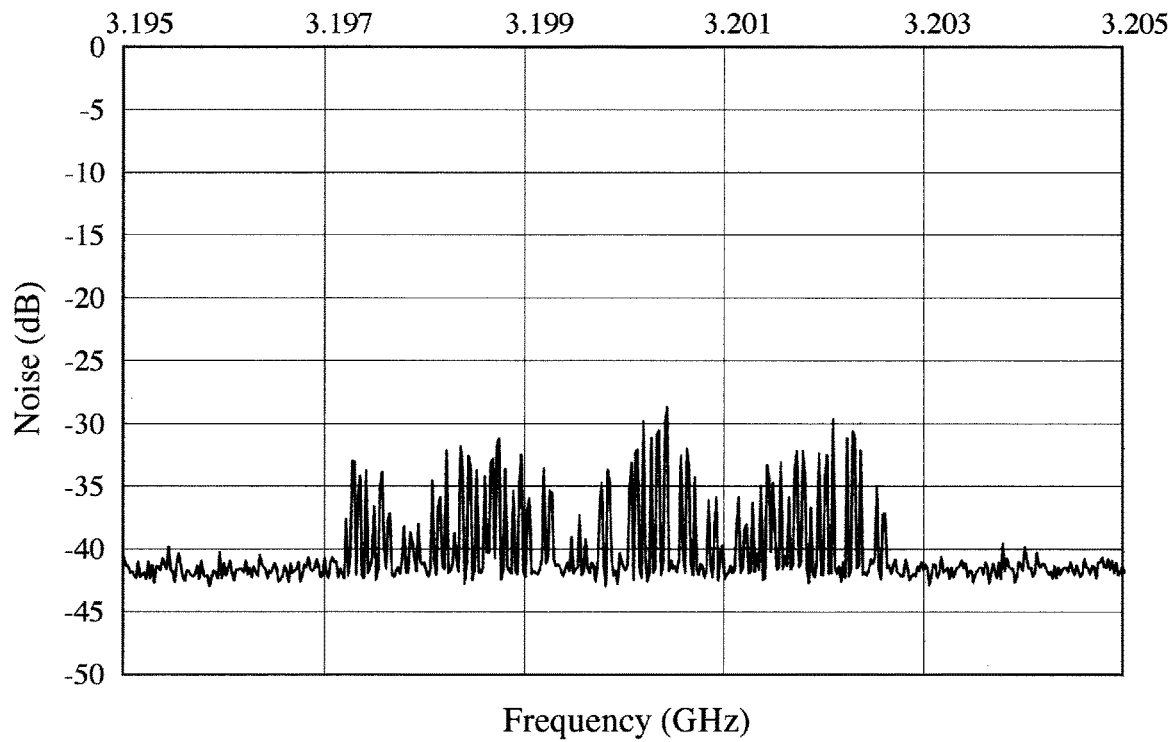
FIG. 18(b) is a graph showing electromagnetic wave noise at a frequency near 3 GHz leaking from Fire Stick TV without the electromagnetic-wave-absorbing composite sheet.
Figure 20:
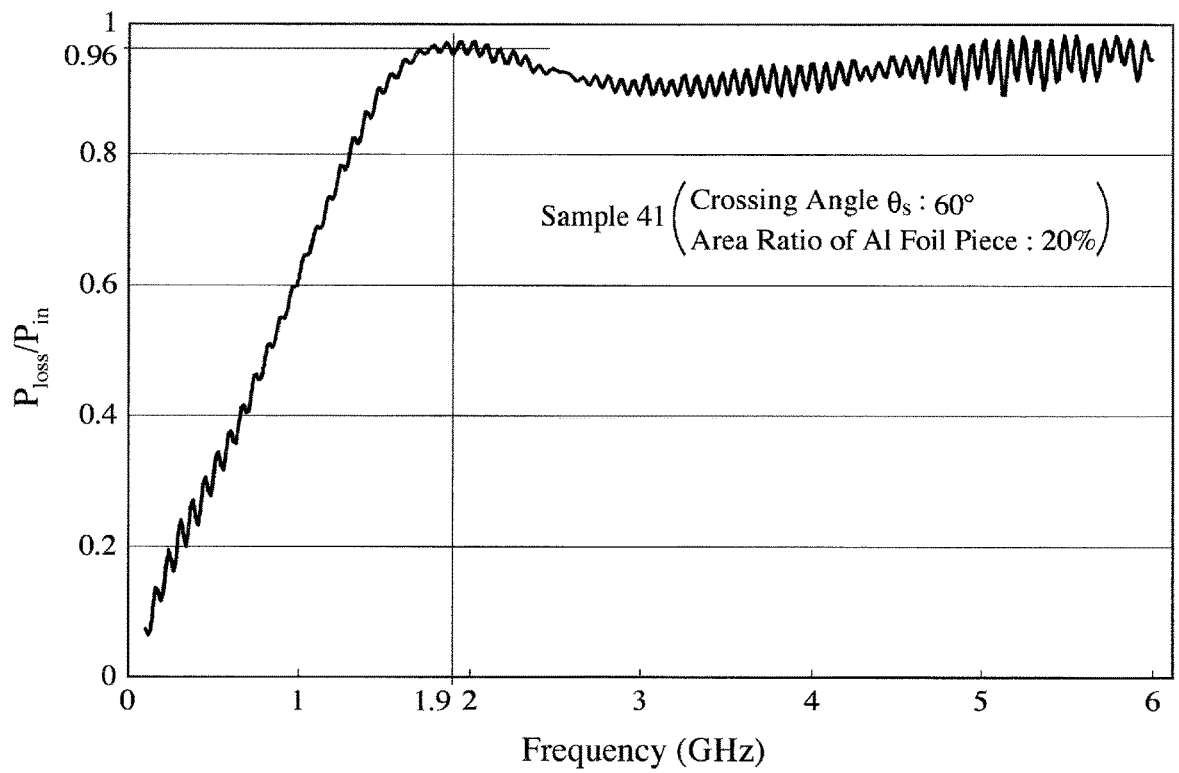
FIG. 20 is a graph showing the noise absorption ratio $P_{loss}/P_{in}$ of Sample 41 (crossing angle θs of linear scratches=60°, and area ratio of aluminum foil piece=20%) of the electromagnetic-wave-absorbing composite sheet.
Figure 21:
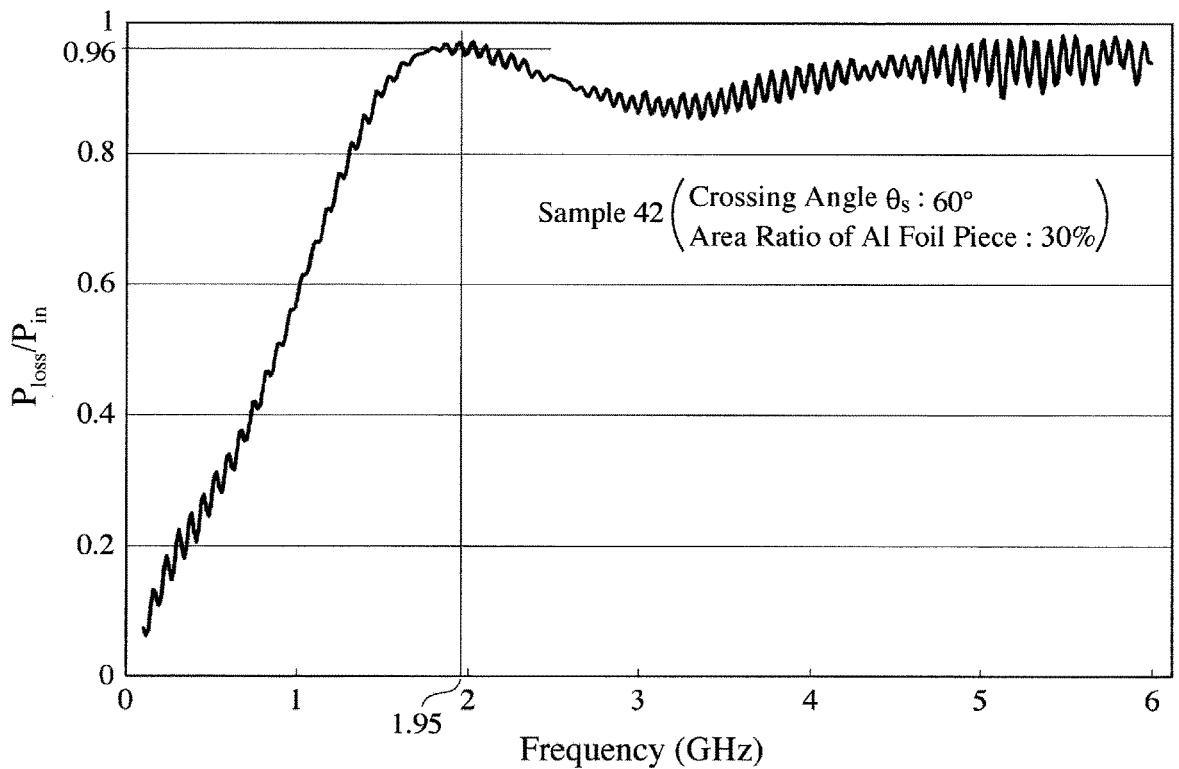
FIG. 21 is a graph showing the noise absorption ratio $P_{loss}/P_{in}$ of Sample 42 (crossing angle θs of linear scratches=60°, and area ratio of aluminum foil piece=30%) of the electromagnetic-wave-absorbing composite sheet.
Figure 22:
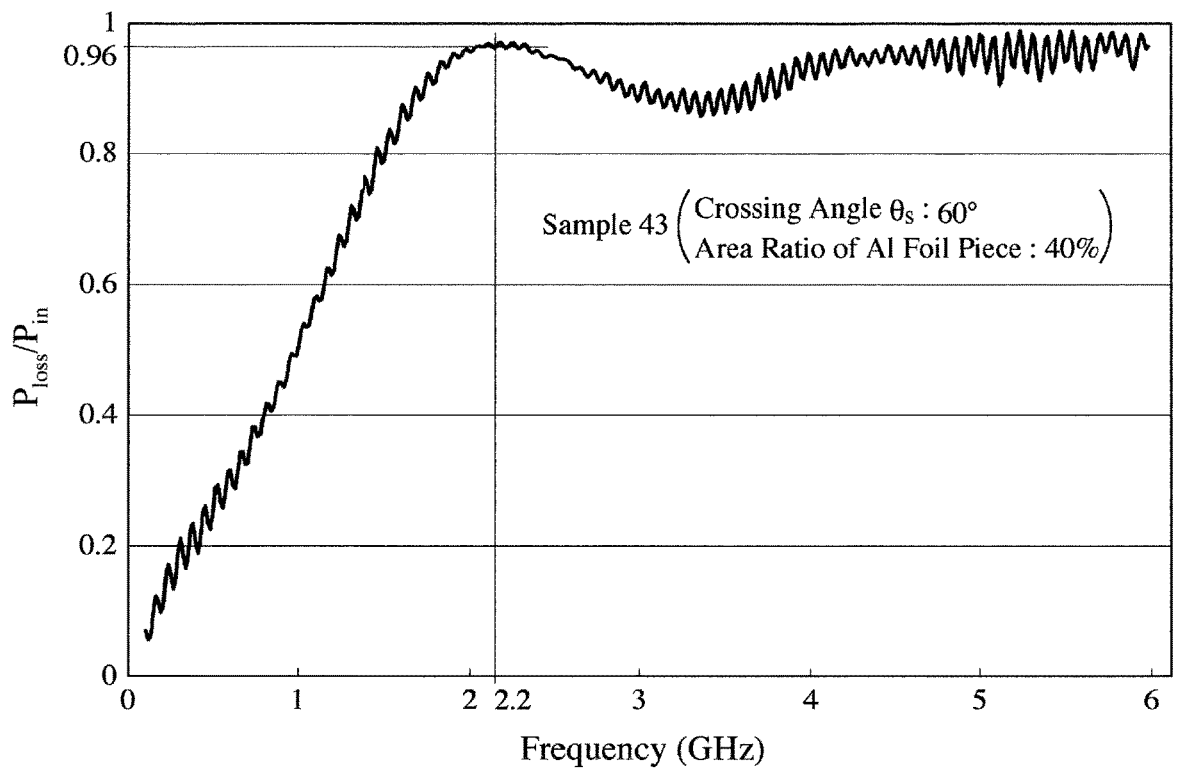
FIG. 22 is a graph showing the noise absorption ratio $P_{loss}/P_{in}$ of Sample 43 (crossing angle θs of linear scratches=60°, and area ratio of aluminum foil piece=40%) of the electromagnetic-wave-absorbing composite sheet.
Figure 23:
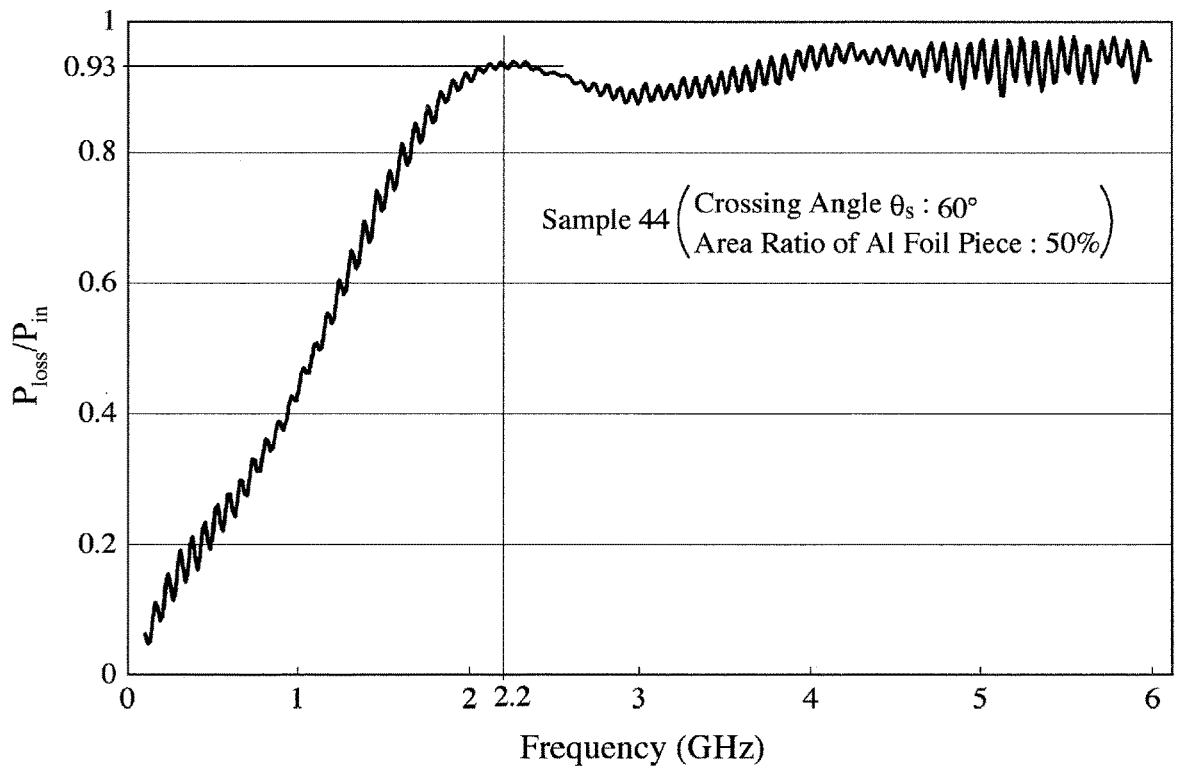
FIG. 23 is a graph showing the noise absorption ratio $P_{loss}/P_{in}$ of Sample 44 (crossing angle θs of linear scratches=60°, and area ratio of aluminum foil piece=50%) of the electromagnetic-wave-absorbing composite sheet.
Figure 24:
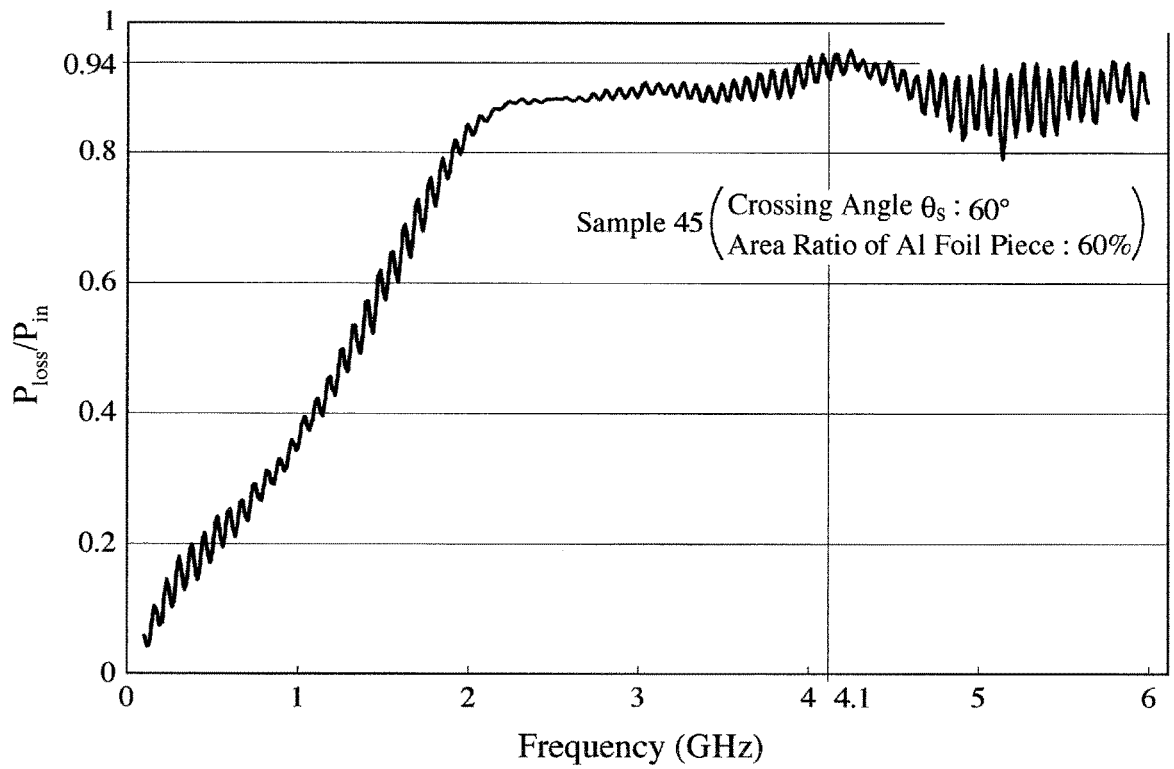
FIG. 24 is a graph showing the noise absorption ratio $P_{loss}/P_{in}$ of Sample 45 (crossing angle θs of linear scratches=60°, and area ratio of aluminum foil piece=60%) of the electromagnetic-wave-absorbing composite sheet.
Figure 25:
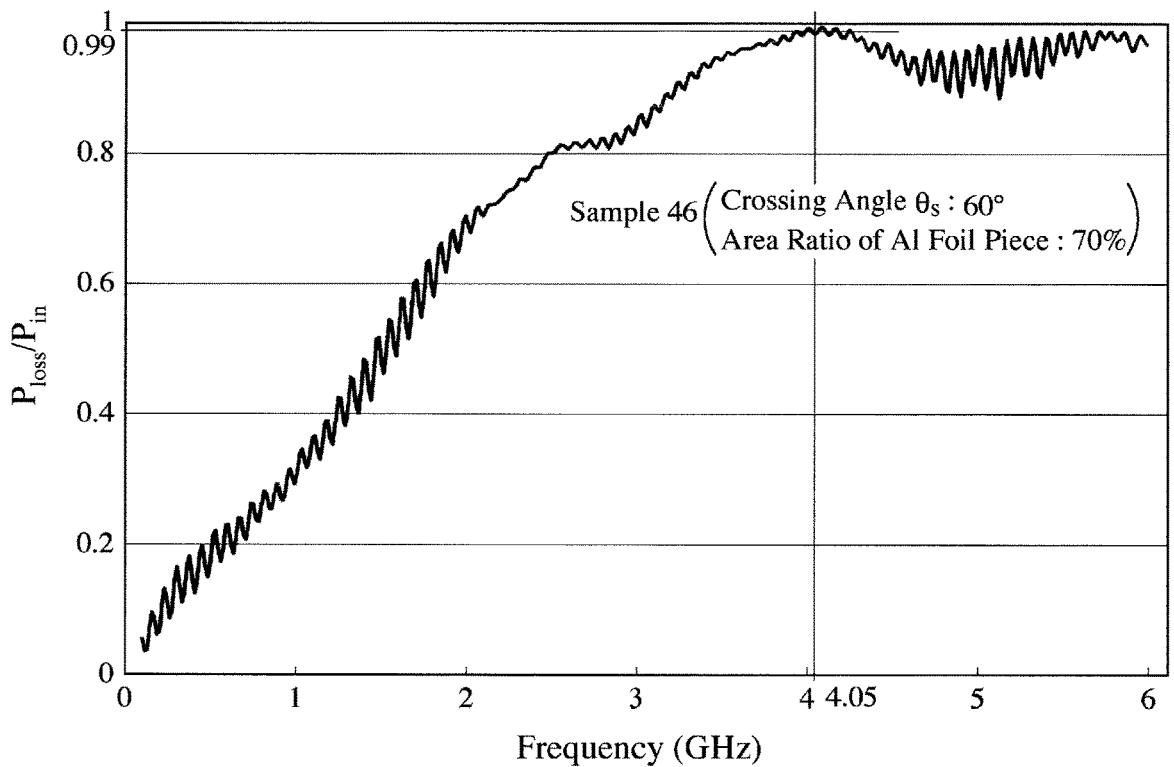
FIG. 25 is a graph showing the noise absorption ratio $P_{loss}/P_{in}$ of Sample 46 (crossing angle θs of linear scratches=60°, and area ratio of aluminum foil piece=70%) of the electromagnetic-wave-absorbing composite sheet.
Figure 26:
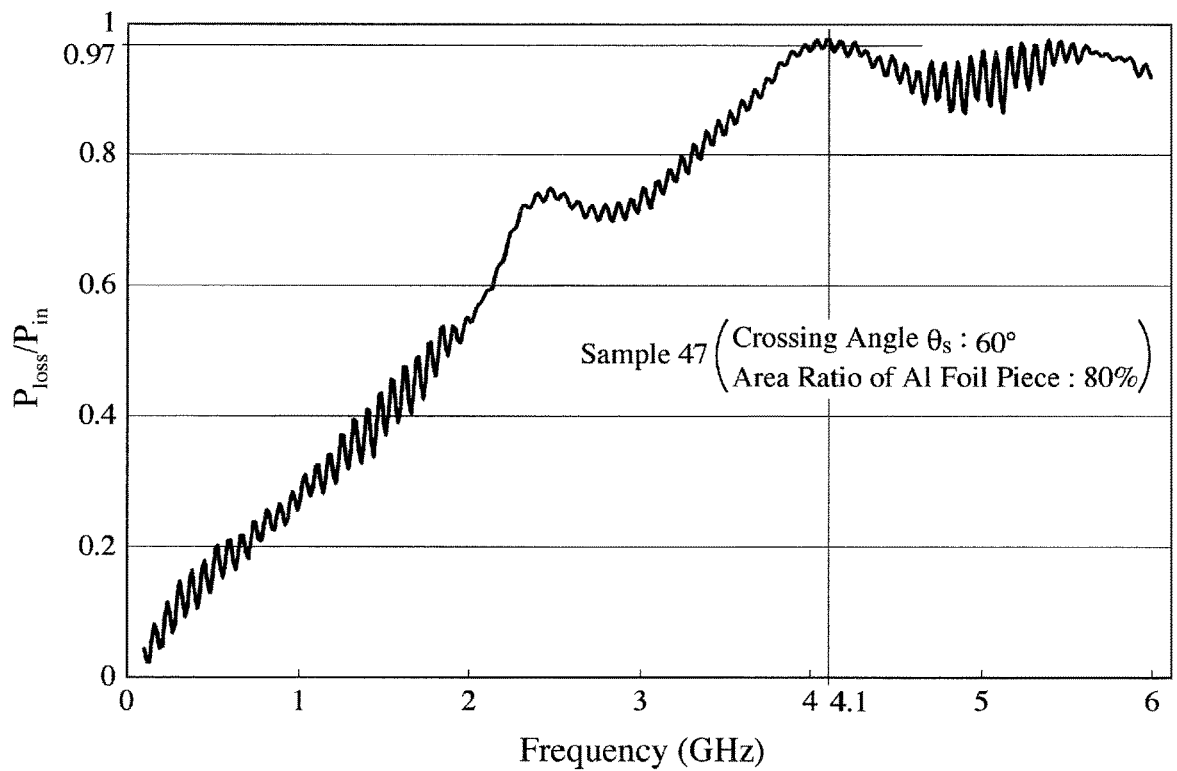
FIG. 26 is a graph showing the noise absorption ratio $P_{loss}/P_{in}$ of Sample 47 (crossing angle θs of linear scratches=60°, and area ratio of aluminum foil piece=80%) of the electromagnetic-wave-absorbing composite sheet.
Figure 27:
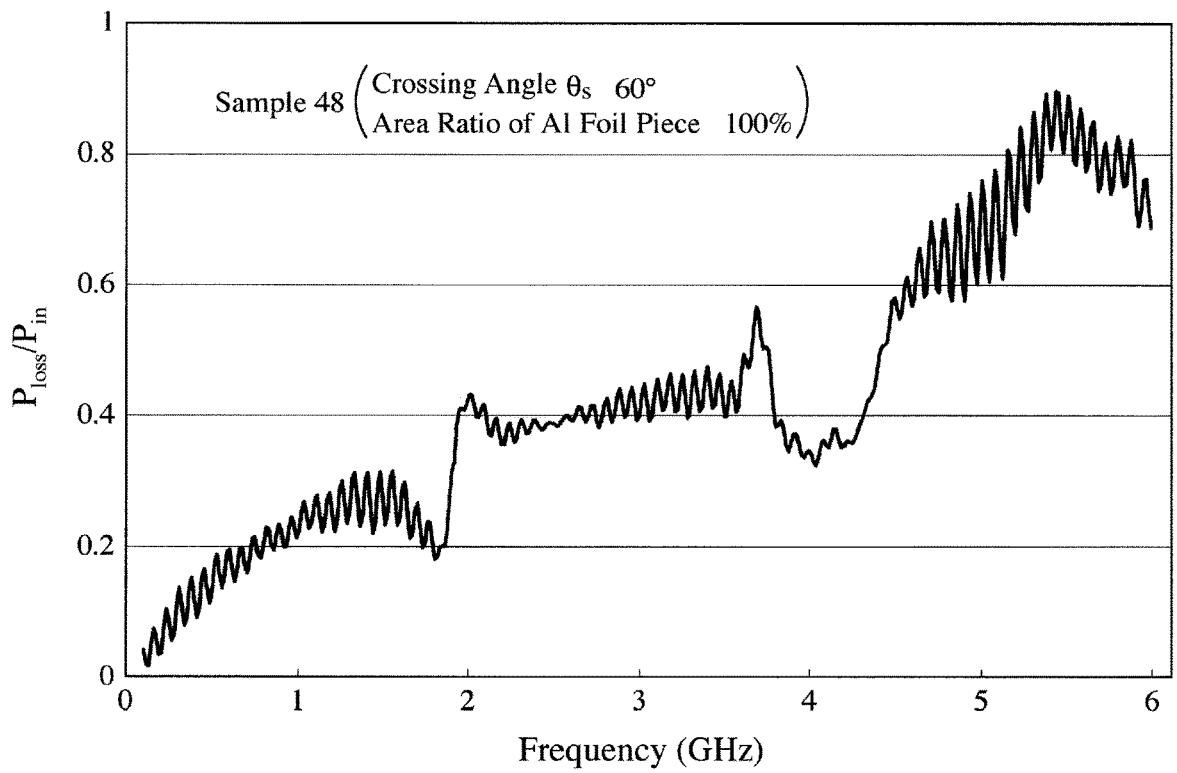
FIG. 27 is a graph showing the noise absorption ratio $P_{loss}/P_{in}$ of Sample 48 (crossing angle θs of linear scratches=60°, and area ratio of aluminum foil piece=100%) of the electromagnetic-wave-absorbing composite sheet.
Figure 28:
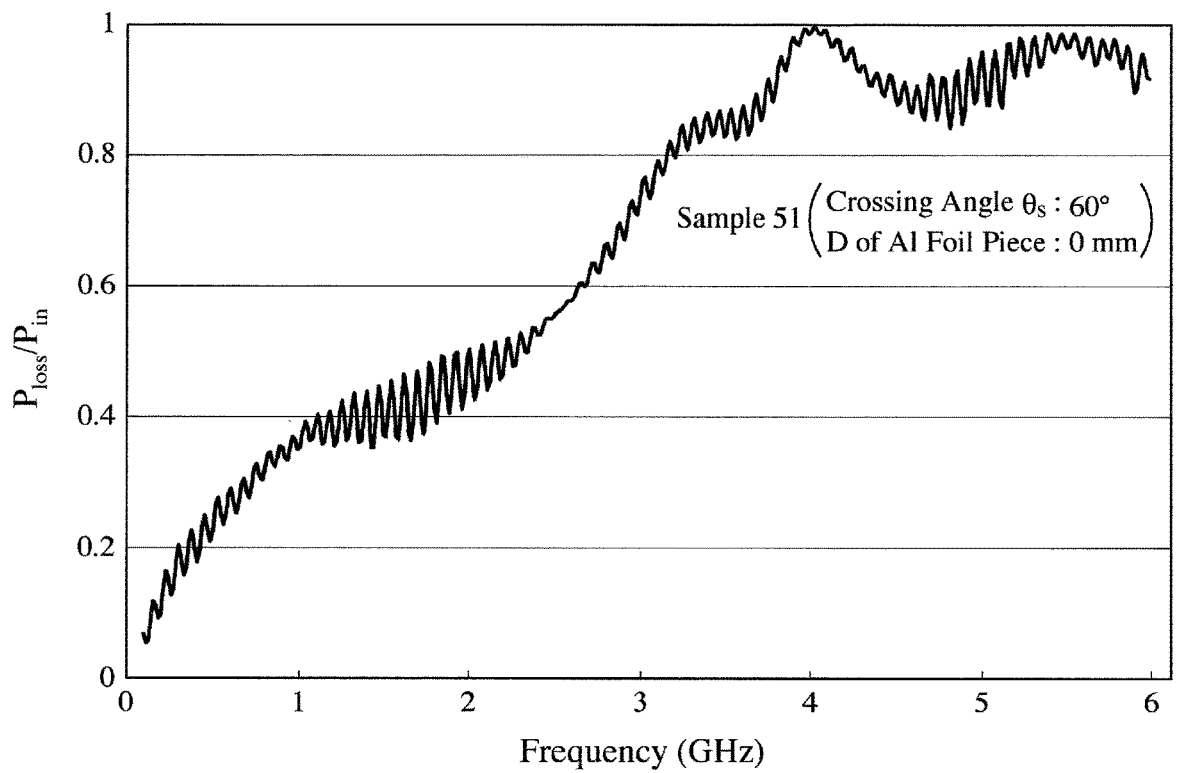
FIG. 28 is a graph showing the noise absorption ratio $P_{loss}/P_{in}$ of Sample 51 (crossing angle θs of linear scratches=60°, and distance D of aluminum foil piece=0 mm) of the electromagnetic-wave-absorbing composite sheet.
Figure 29:
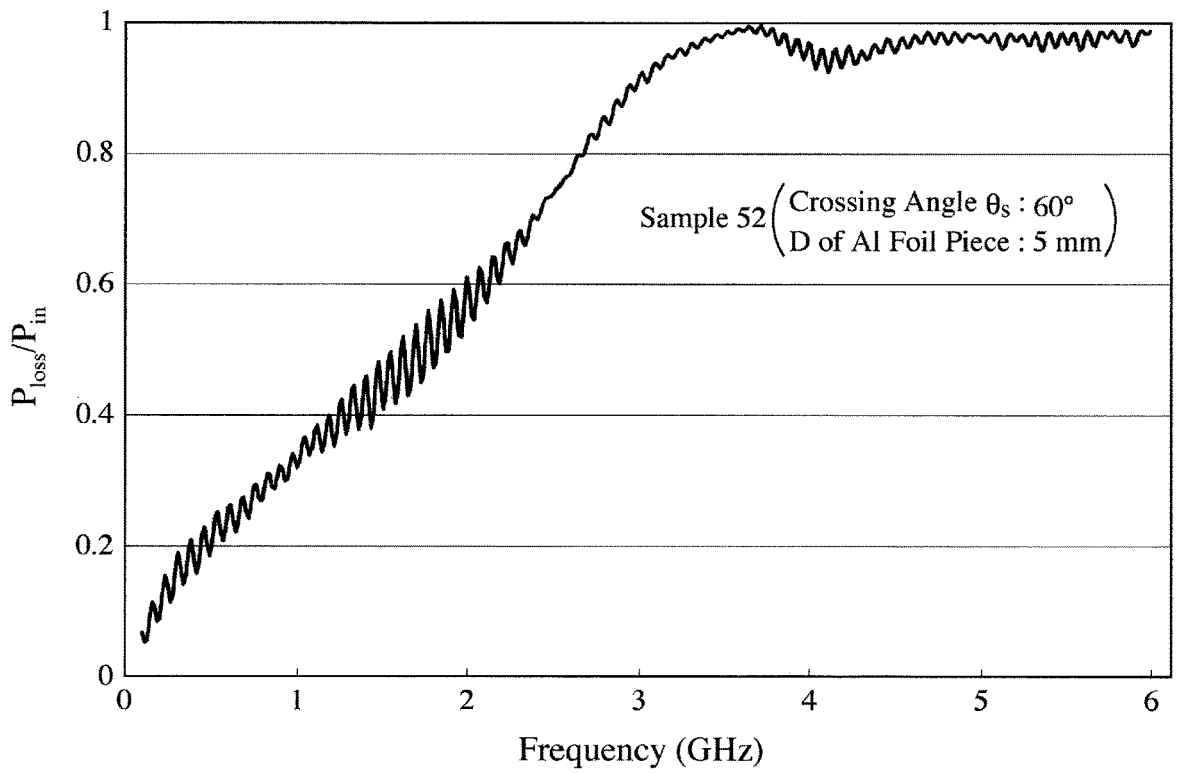
FIG. 29 is a graph showing the noise absorption ratio $P_{loss}/P_{in}$ of Sample 52 (crossing angle θs of linear scratches=60°, and distance D of aluminum foil piece=5 mm) of the electromagnetic-wave-absorbing composite sheet.
Figure 30:
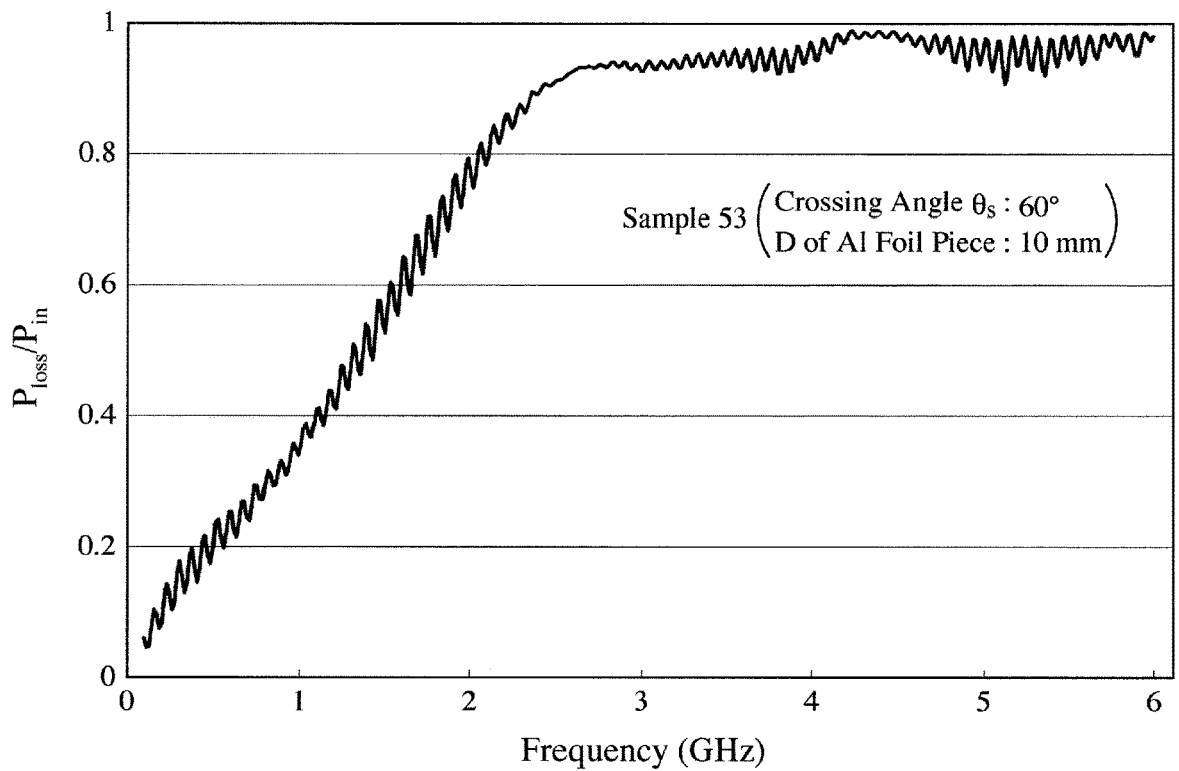
FIG. 30 is a graph showing the noise absorption ratio $P_{loss}/P_{in}$ of Sample 53 (crossing angle θs of linear scratches=60°, and distance D of aluminum foil piece=10 mm) of the electromagnetic-wave-absorbing composite sheet.
Figure 31:
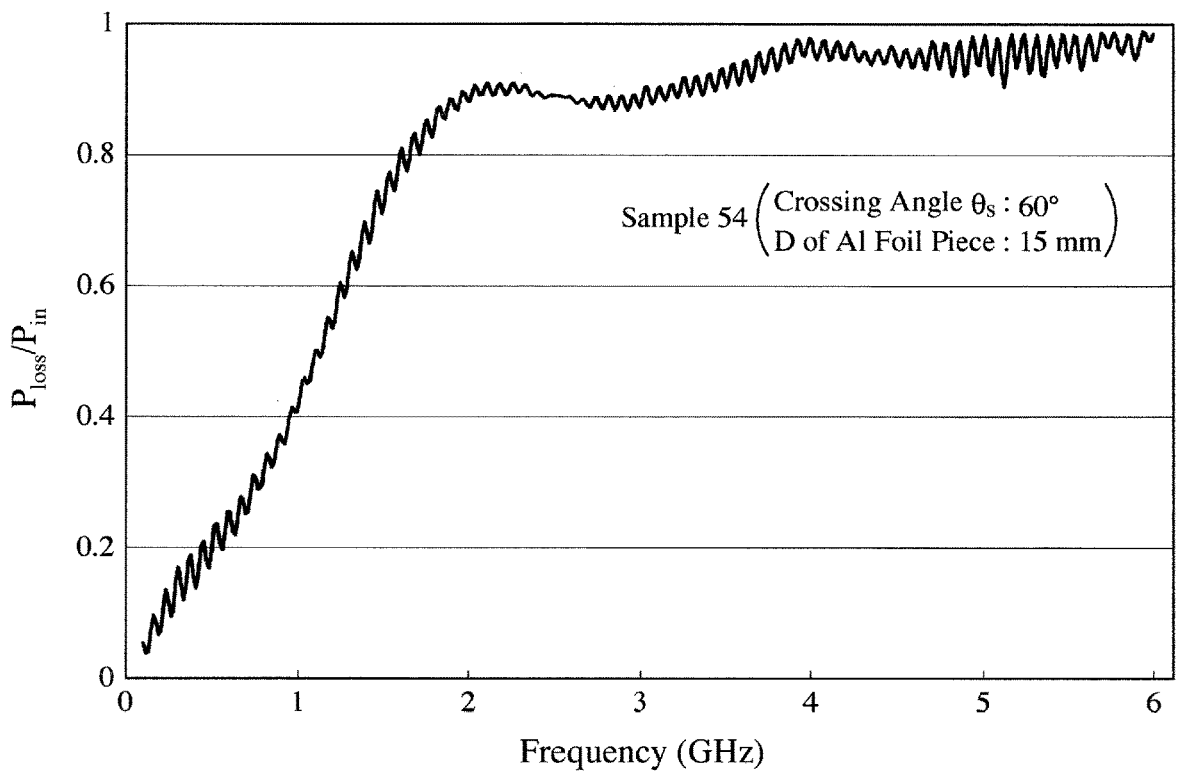
FIG. 31 is a graph showing the noise absorption ratio $P_{loss}/P_{in}$ of Sample 54 (crossing angle θs of linear scratches=60°, and distance D of aluminum foil piece=15 mm) of the electromagnetic-wave-absorbing composite sheet.
Figure 32:
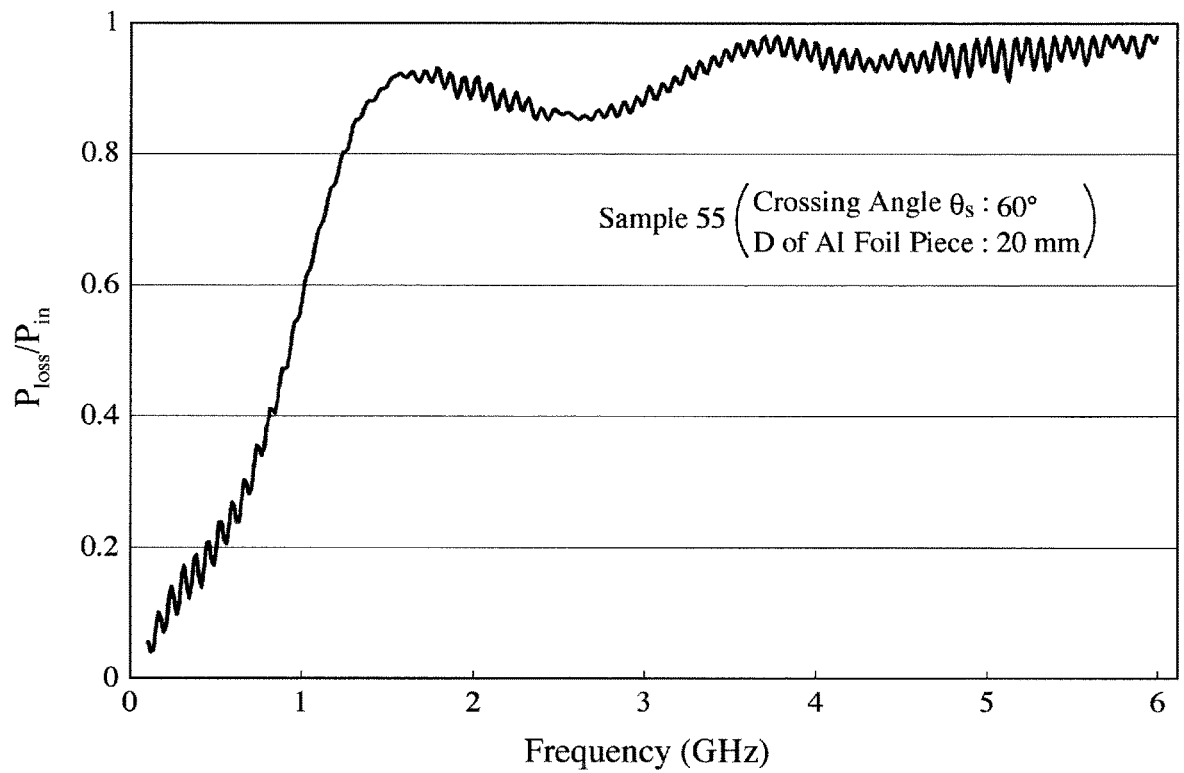
FIG. 32 is a graph showing the noise absorption ratio $P_{loss}/P_{in}$ of Sample 55 (crossing angle θs of linear scratches=60°, and distance D of aluminum foil piece=20 mm) of the electromagnetic-wave-absorbing composite sheet.
Figure 33:
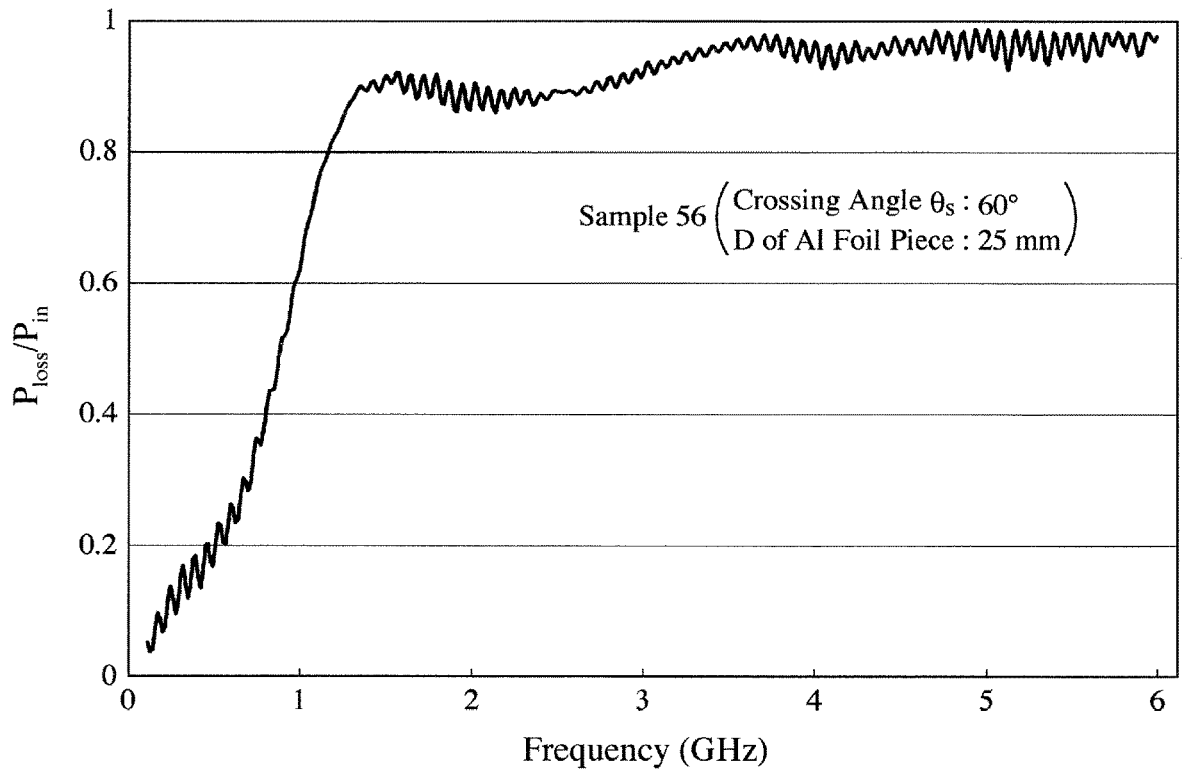
FIG. 33 is a graph showing the noise absorption ratio $P_{loss}/P_{in}$ of Sample 56 (crossing angle θs of linear scratches=60°, and distance D of aluminum foil piece=25 mm) of the electromagnetic-wave-absorbing composite sheet.
Figure 34:
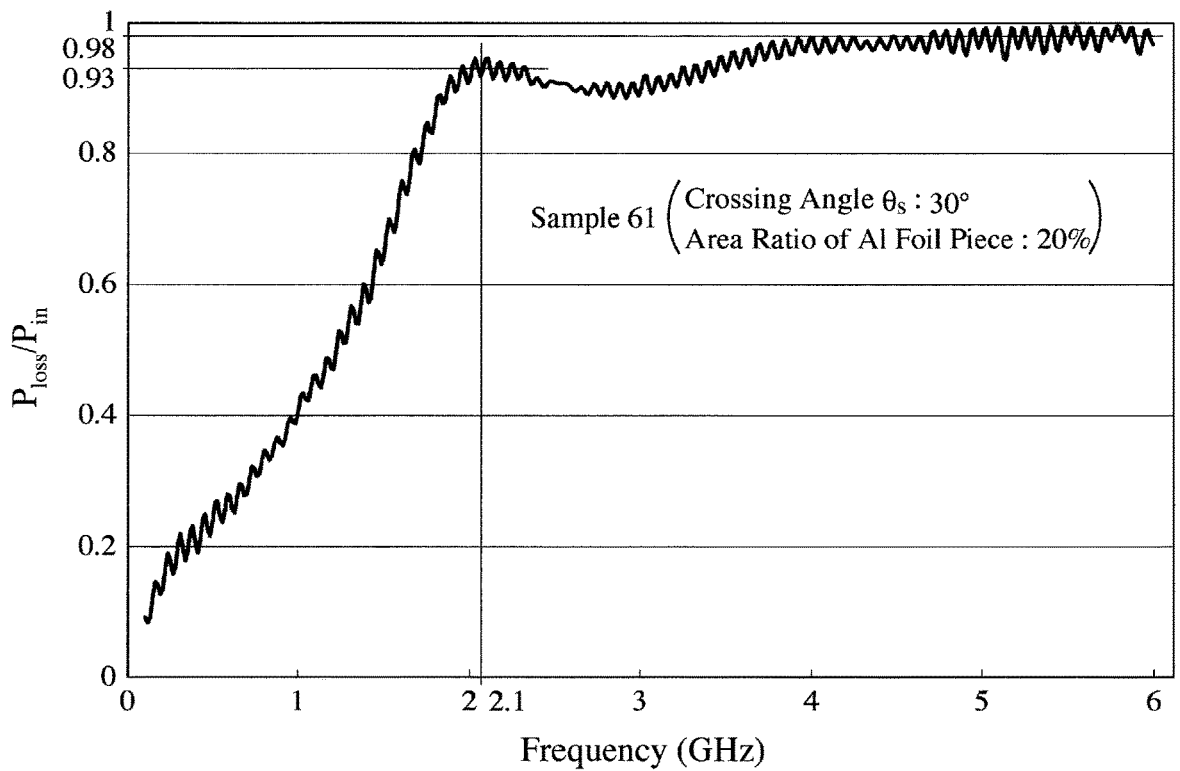
FIG. 34 is a graph showing the noise absorption ratio $P_{loss}/P_{in}$ of Sample 61 (crossing angle θs of linear scratches=30°, and area ratio of aluminum foil piece=20%) of the electromagnetic-wave-absorbing composite sheet.
Figure 35:
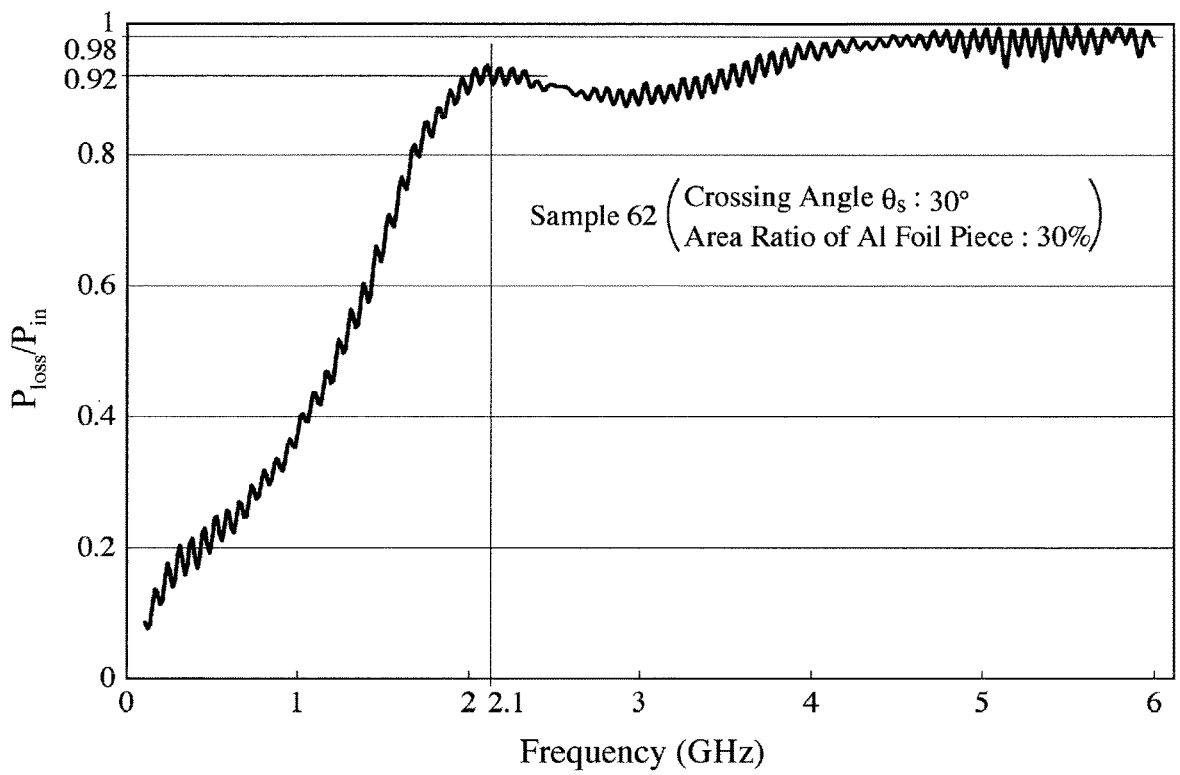
FIG. 35 is a graph showing the noise absorption ratio $P_{loss}/P_{in}$ of Sample 62 (crossing angle θs of linear scratches=30°, and area ratio of aluminum foil piece=30%) of the electromagnetic-wave-absorbing composite sheet.
Figure 36:
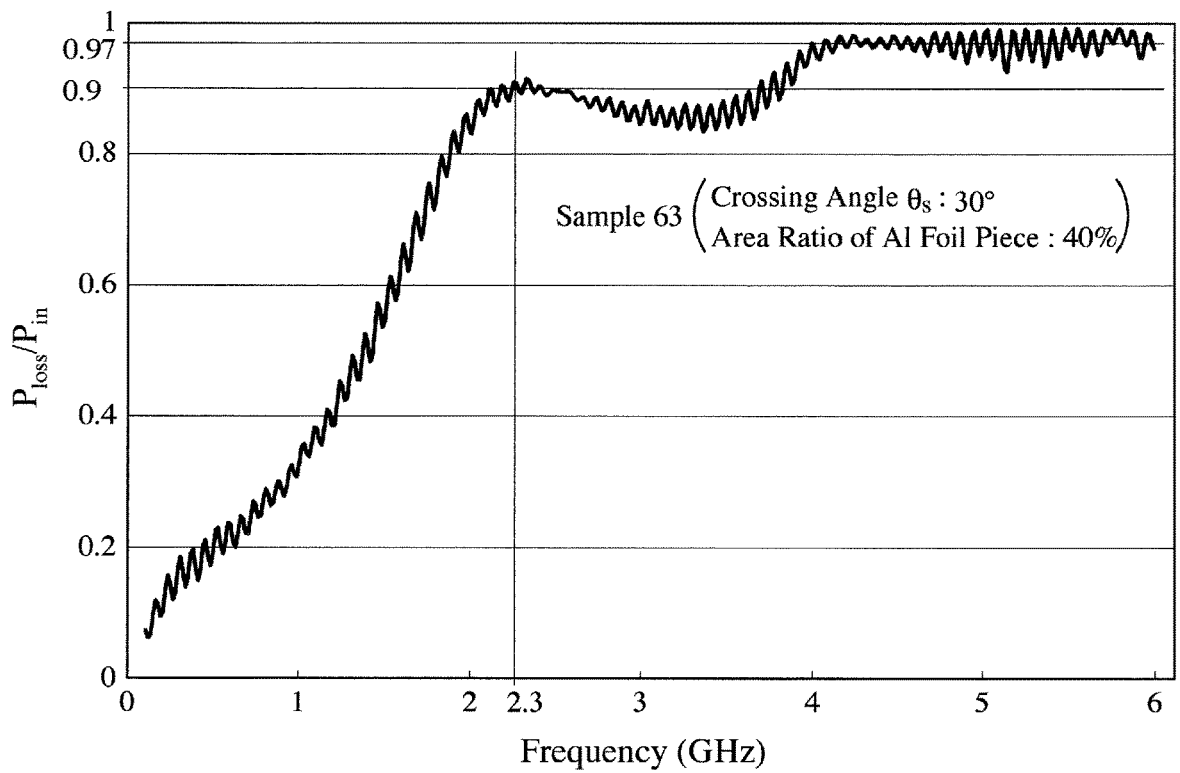
FIG. 36 is a graph showing the noise absorption ratio $P_{loss}/P_{in}$ of Sample 63 (crossing angle θs of linear scratches=30°, and area ratio of aluminum foil piece=40%) of the electromagnetic-wave-absorbing composite sheet.
Figure 37:
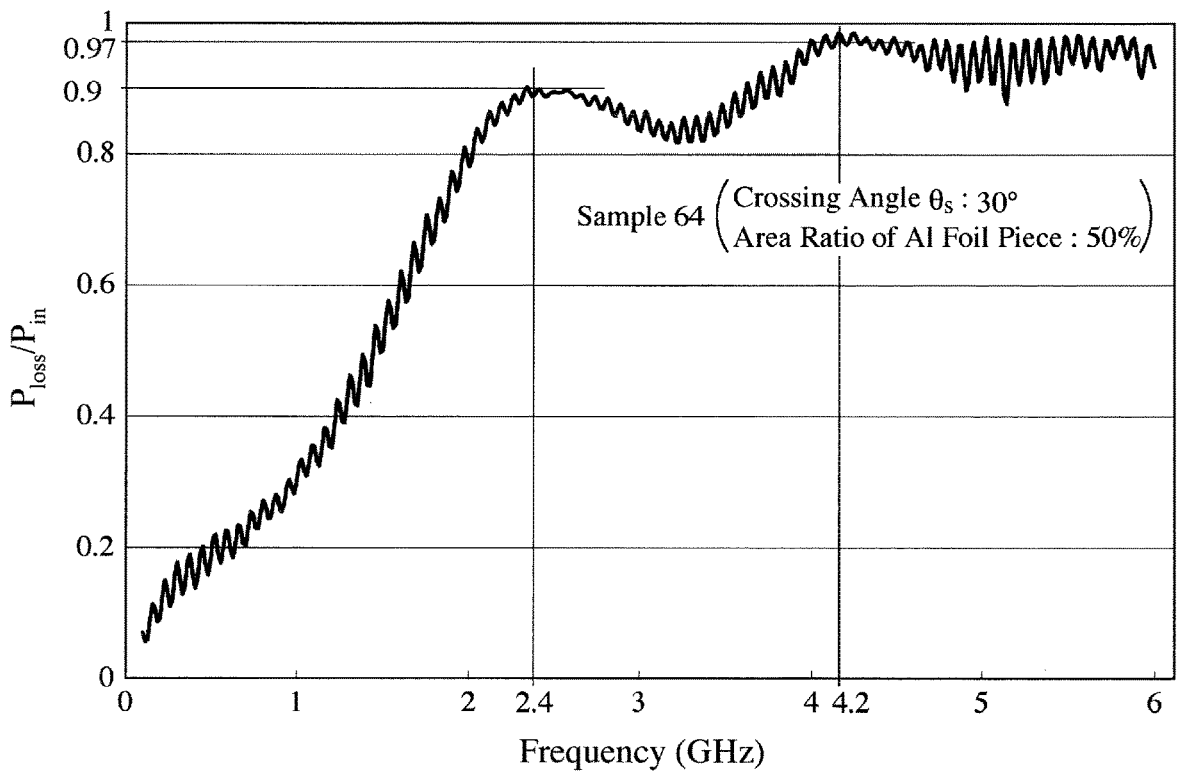
FIG. 37 is a graph showing the noise absorption ratio $P_{loss}/P_{in}$ of Sample 64 (crossing angle θs of linear scratches=30°, and area ratio of aluminum foil piece=50%) of the electromagnetic-wave-absorbing composite sheet.
Figure 38:
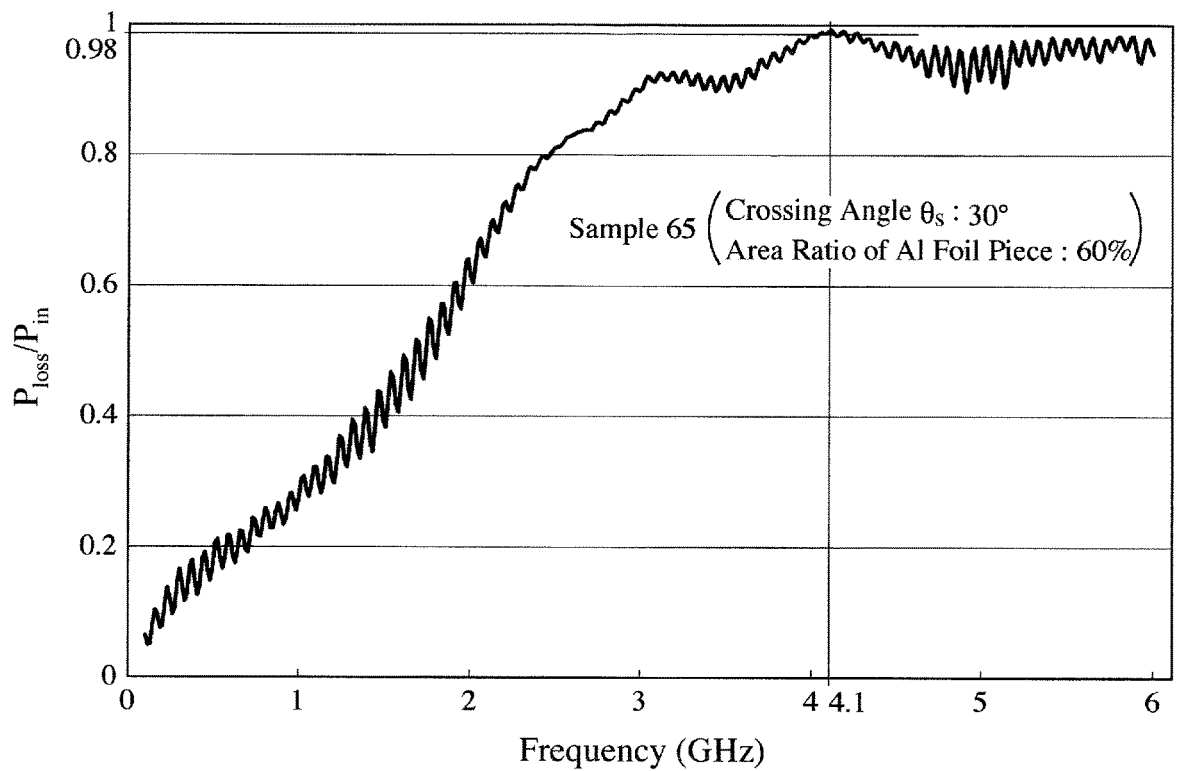
FIG. 38 is a graph showing the noise absorption ratio $P_{loss}/P_{in}$ of Sample 65 (crossing angle θs of linear scratches=30°, and area ratio of aluminum foil piece=60%) of the electromagnetic-wave-absorbing composite sheet.
Figure 39:
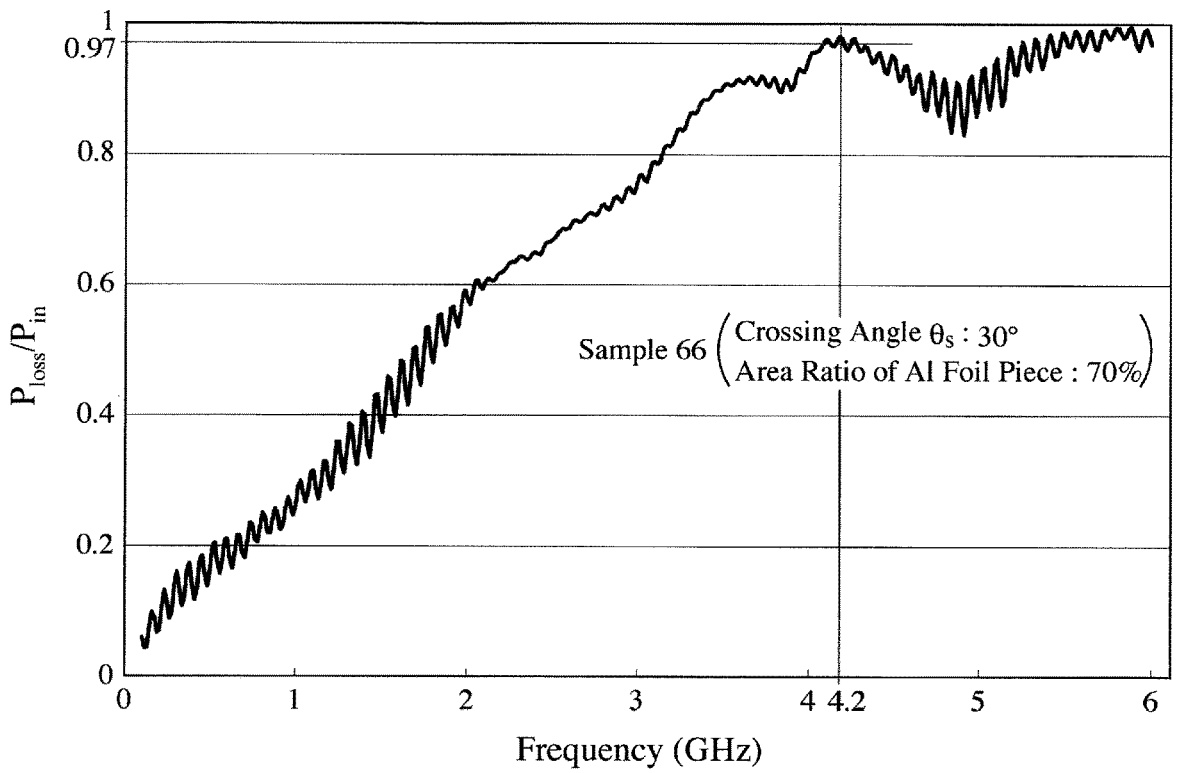
FIG. 39 is a graph showing the noise absorption ratio $P_{loss}/P_{in}$ of Sample 66 (crossing angle θs of linear scratches=30°, and area ratio of aluminum foil piece=70%) of the electromagnetic-wave-absorbing composite sheet.
Figure 40:
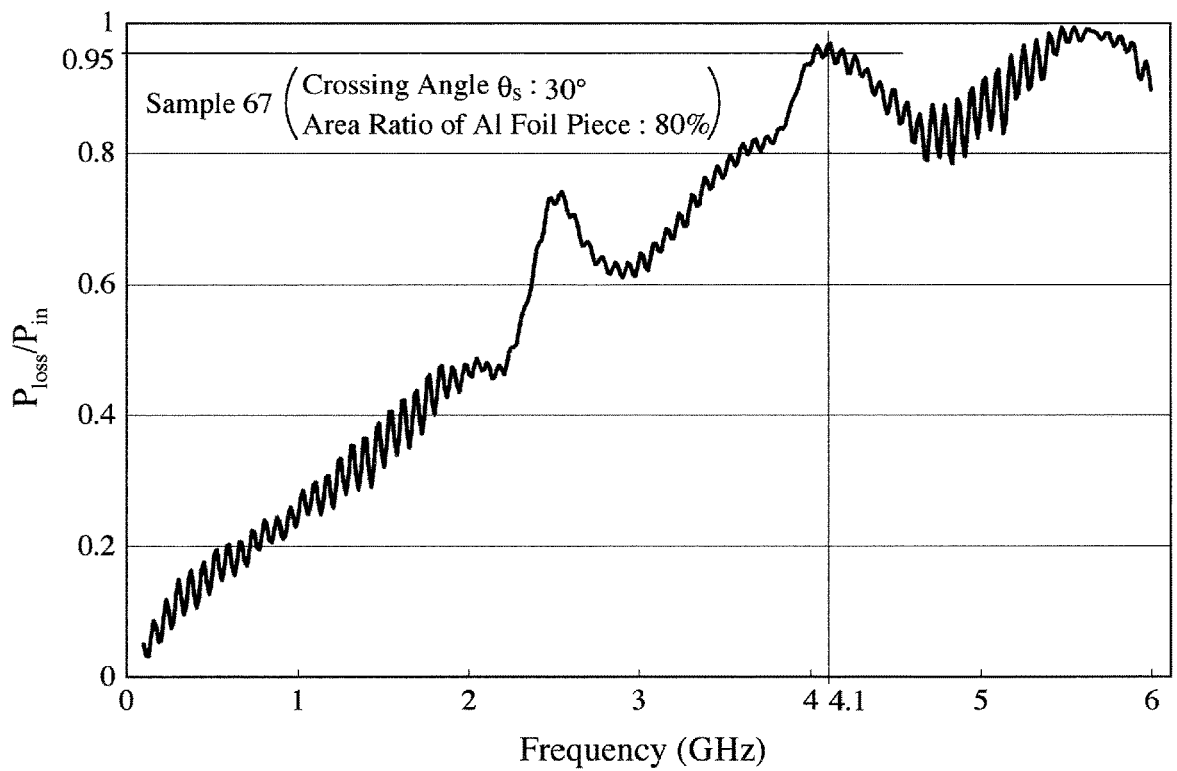
FIG. 40 is a graph showing the noise absorption ratio $P_{loss}/P_{in}$ of Sample 67 (crossing angle θs of linear scratches=30°, and area ratio of aluminum foil piece=80%) of the electromagnetic-wave-absorbing composite sheet.
Figure 41:
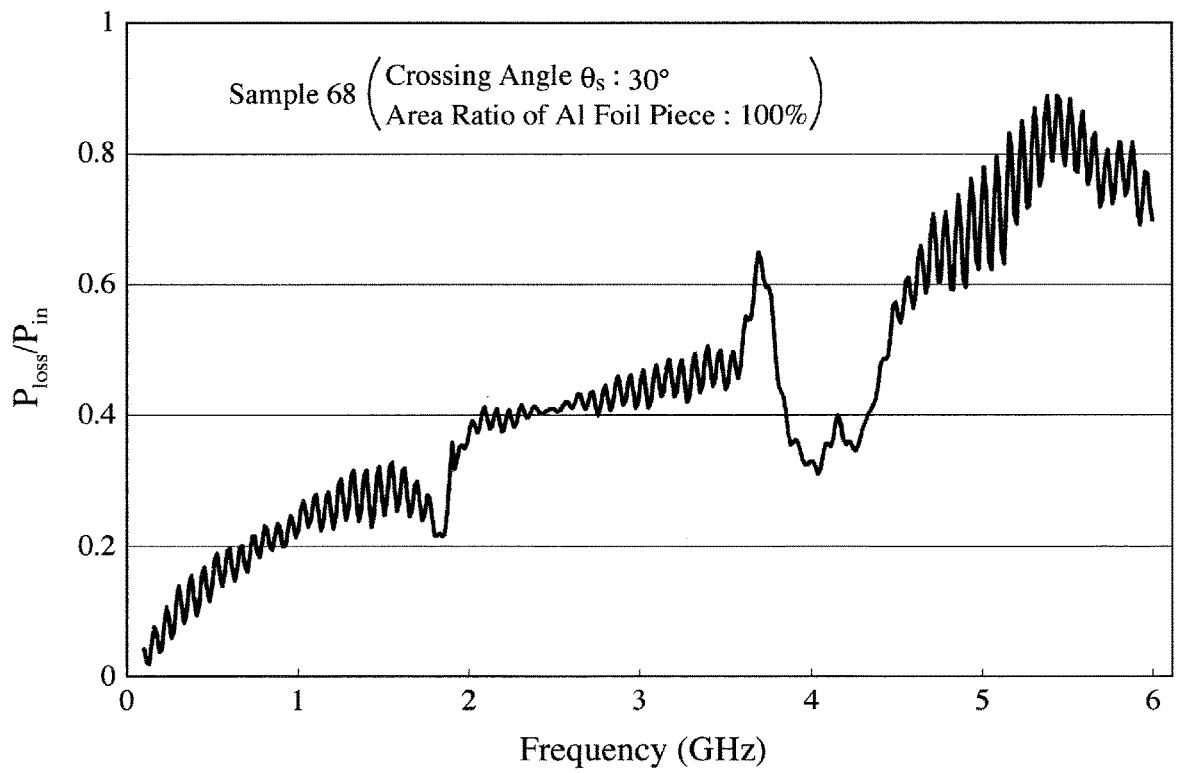
FIG. 41 is a graph showing the noise absorption ratio $P_{loss}/P_{in}$ of Sample 68 (crossing angle θs of linear scratches=30°, and area ratio of aluminum foil piece=100%) of the electromagnetic-wave-absorbing composite sheet.
Figure 42:
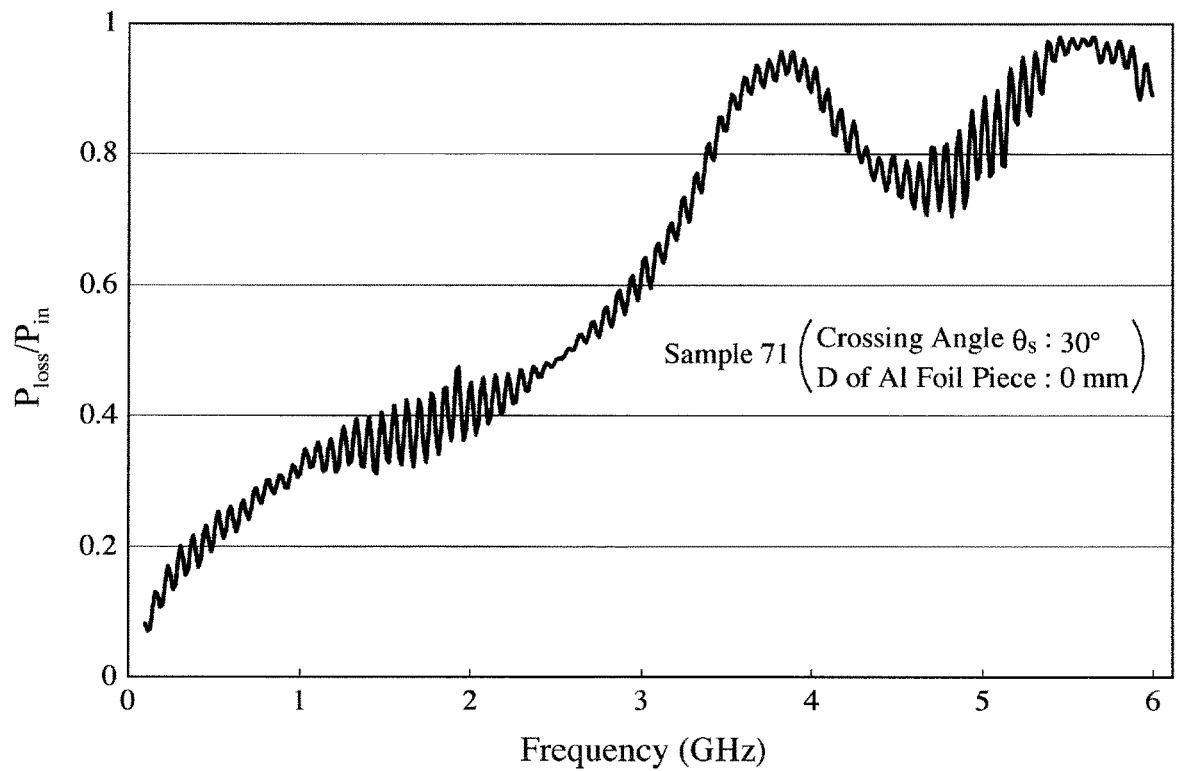
FIG. 42 is a graph showing the noise absorption ratio $P_{loss}/P_{in}$ of Sample 71 (crossing angle θs of linear scratches=30°, and distance D of aluminum foil piece=0 mm) of the electromagnetic-wave-absorbing composite sheet.
Figure 43:
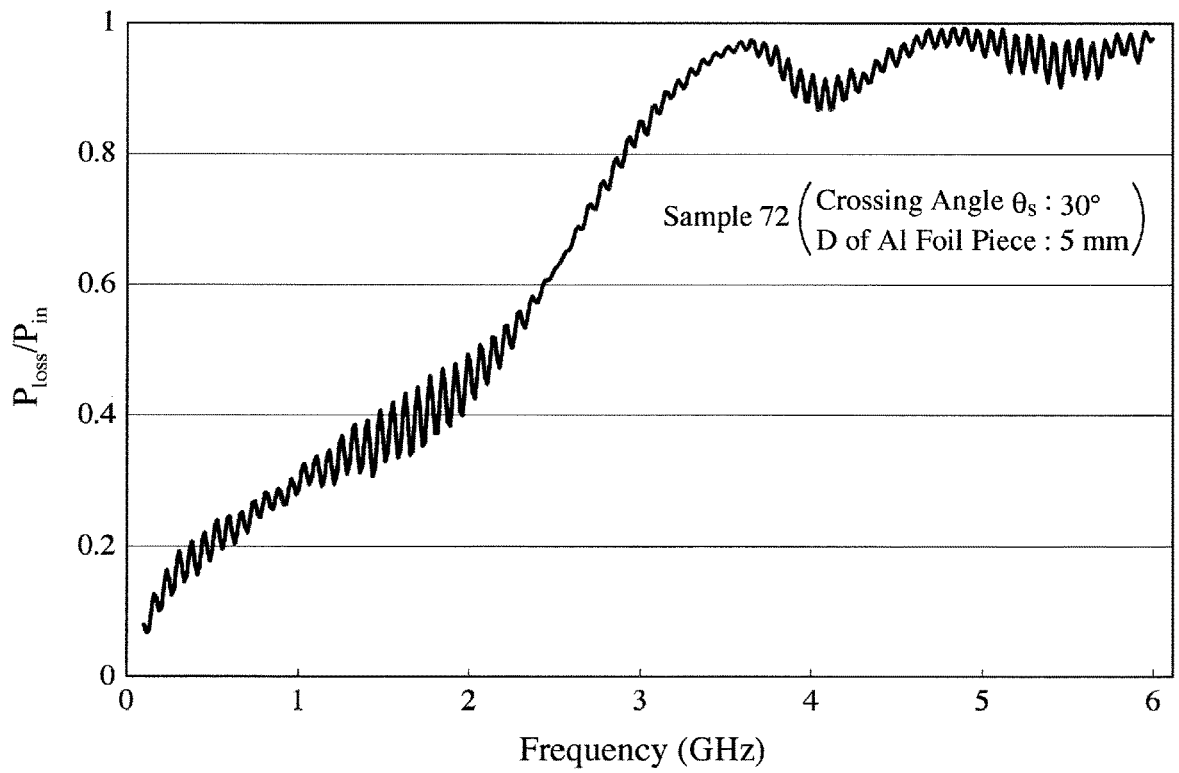
FIG. 43 is a graph showing the noise absorption ratio $P_{loss}/P_{in}$ of Sample 72 (crossing angle θs of linear scratches=30°, and distance D of aluminum foil piece=5 mm) of the electromagnetic-wave-absorbing composite sheet.
Figure 44:
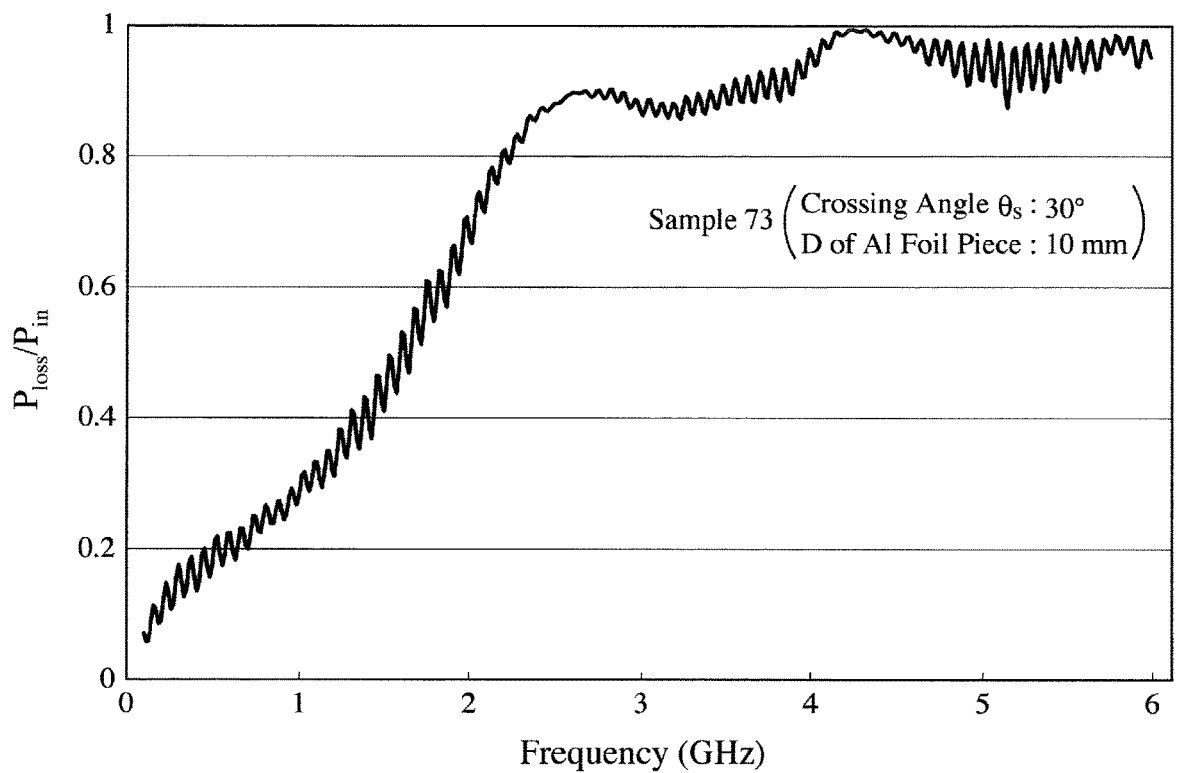
FIG. 44 is a graph showing the noise absorption ratio $P_{loss}/P_{in}$ of Sample 73 (crossing angle θs of linear scratches=30°, and distance D of aluminum foil piece=10 mm) of the electromagnetic-wave-absorbing composite sheet.
Figure 45:
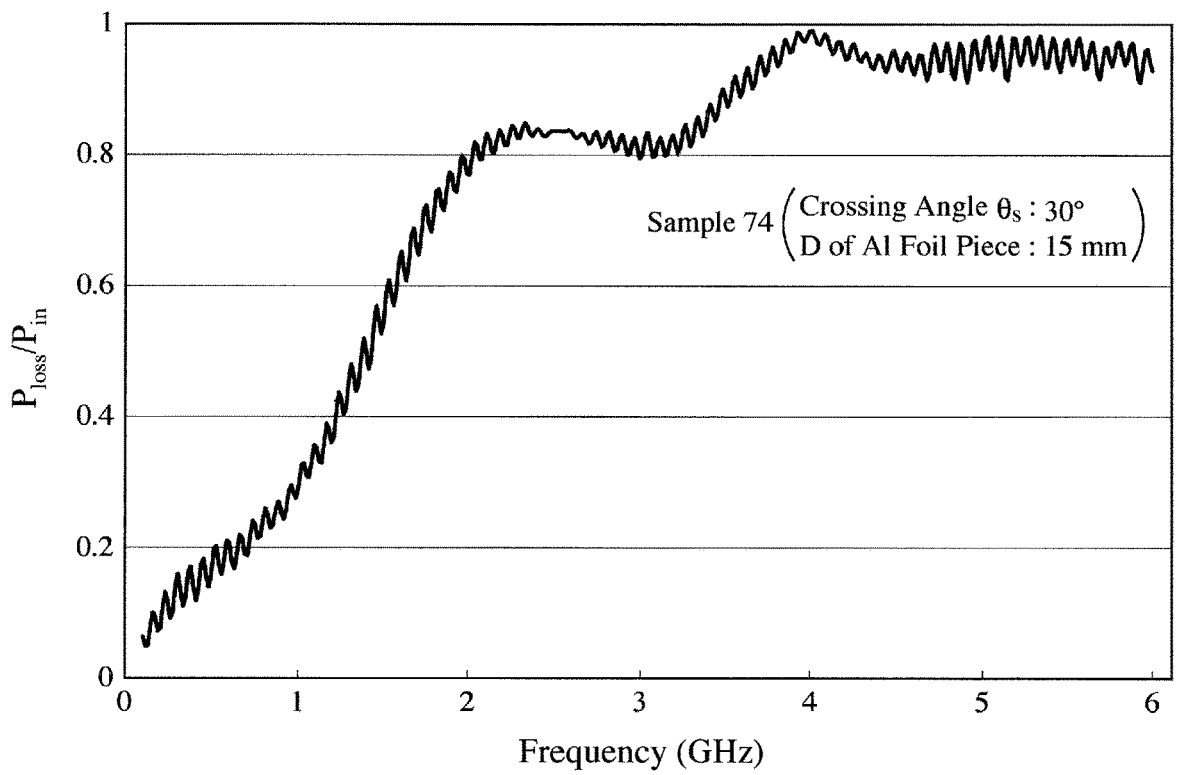
FIG. 45 is a graph showing the noise absorption ratio $P_{loss}/P_{in}$ of Sample 74 (crossing angle θs of linear scratches=30°, and distance D of aluminum foil piece=15 mm) of the electromagnetic-wave-absorbing composite sheet.
Figure 46:
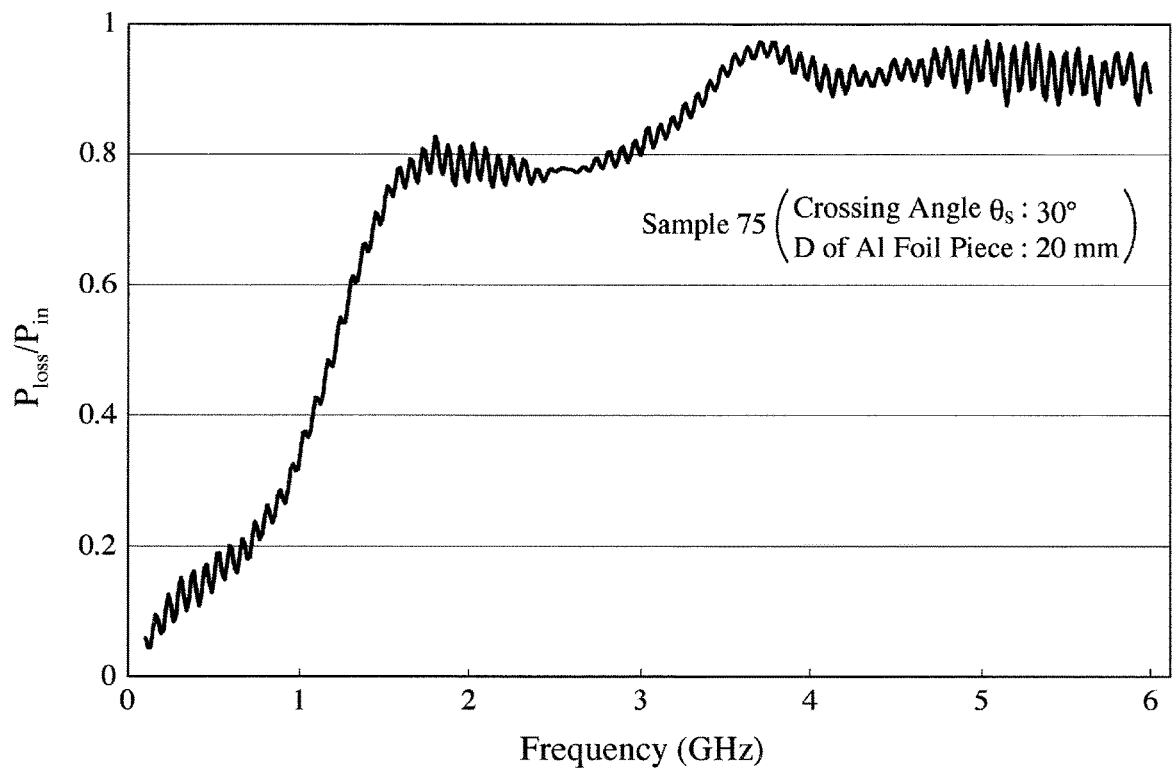
FIG. 46 is a graph showing the noise absorption ratio $P_{loss}/P_{in}$ of Sample 75 (crossing angle θs of linear scratches=30°, and distance D of aluminum foil piece=20 mm) of the electromagnetic-wave-absorbing composite sheet.
Figure 47:
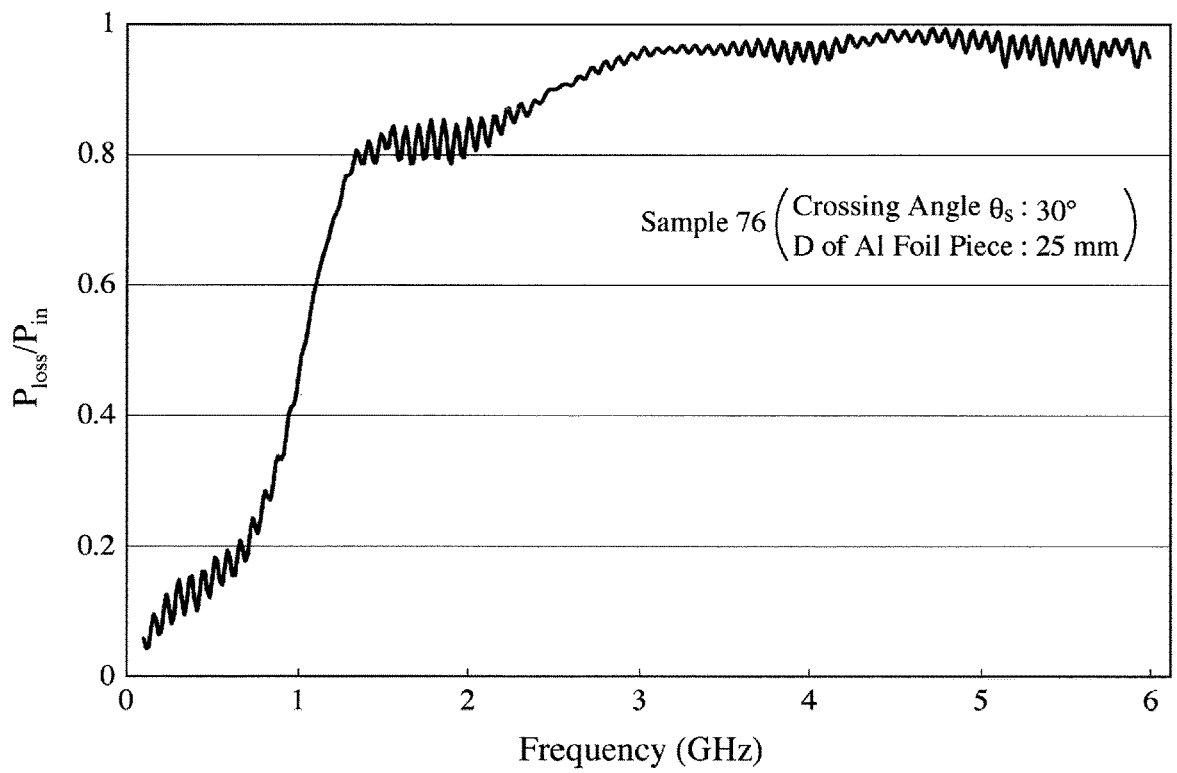
FIG. 47 is a graph showing the noise absorption ratio $P_{loss}/P_{in}$ of Sample 76 (crossing angle θs of linear scratches=30°, and distance D of aluminum foil piece=25 mm) of the electromagnetic-wave-absorbing composite sheet.
Figure 48:
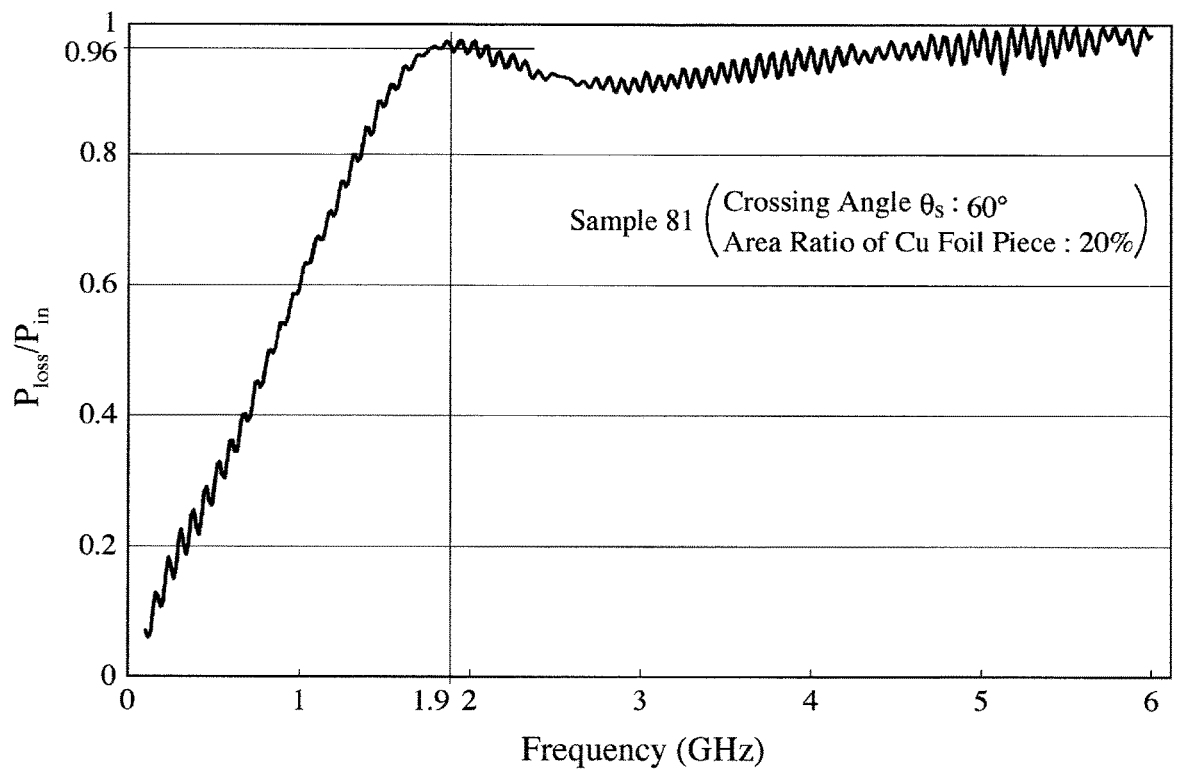
FIG. 48 is a graph showing the noise absorption ratio $P_{loss}/P_{in}$ of Sample 81 (crossing angle θs of linear scratches=60°, and area ratio of copper foil piece=20%) of the electromagnetic-wave-absorbing composite sheet.
Figure 49:
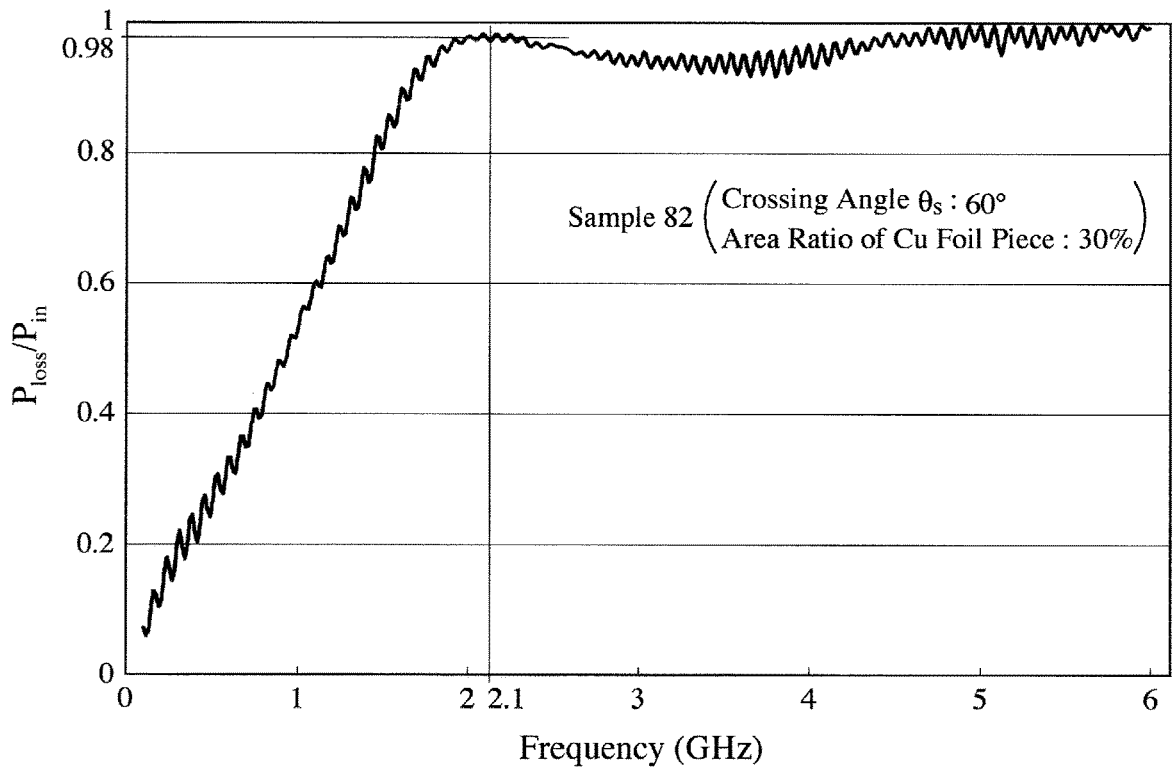
FIG. 49 is a graph showing the noise absorption ratio $P_{loss}/P_{in}$ of Sample 82 (crossing angle θs of linear scratches=60°, and area ratio of copper foil piece=30%) of the electromagnetic-wave-absorbing composite sheet.
Figure 50:
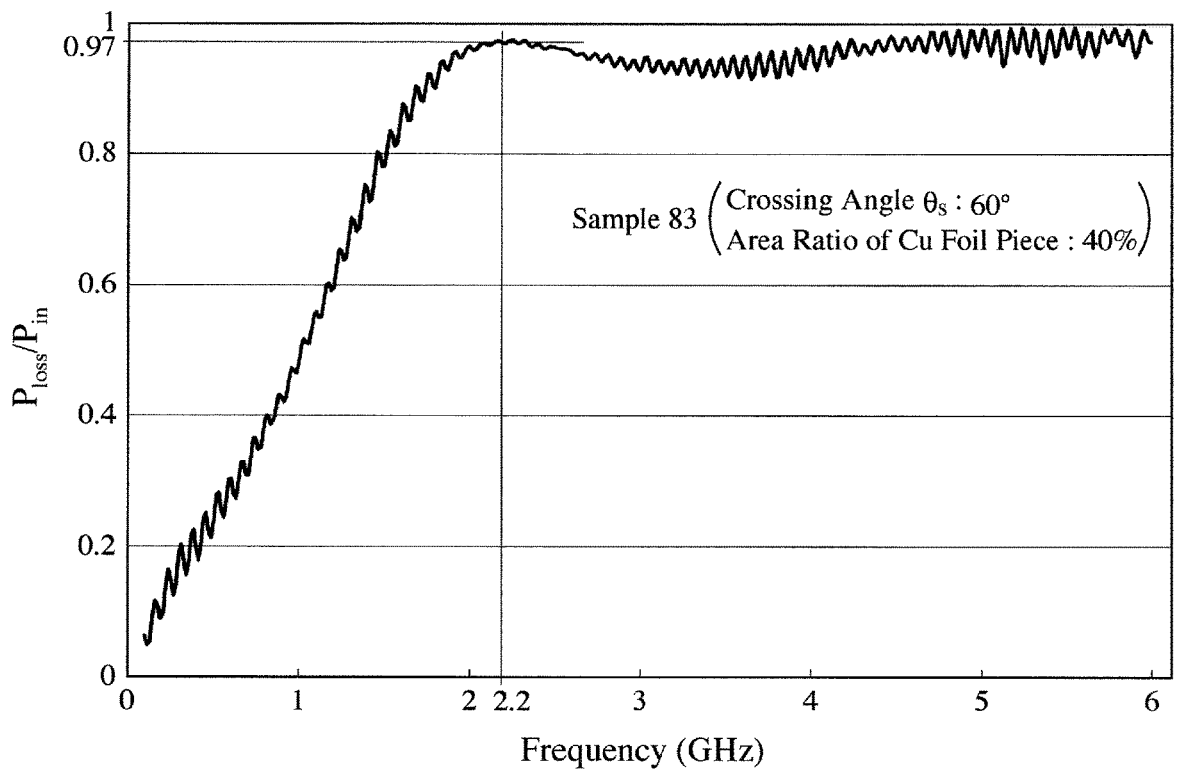
FIG. 50 is a graph showing the noise absorption ratio $P_{loss}/P_{in}$ of Sample 83 (crossing angle θs of linear scratches=60°, and area ratio of copper foil piece=40%) of the electromagnetic-wave-absorbing composite sheet.
Figure 51:
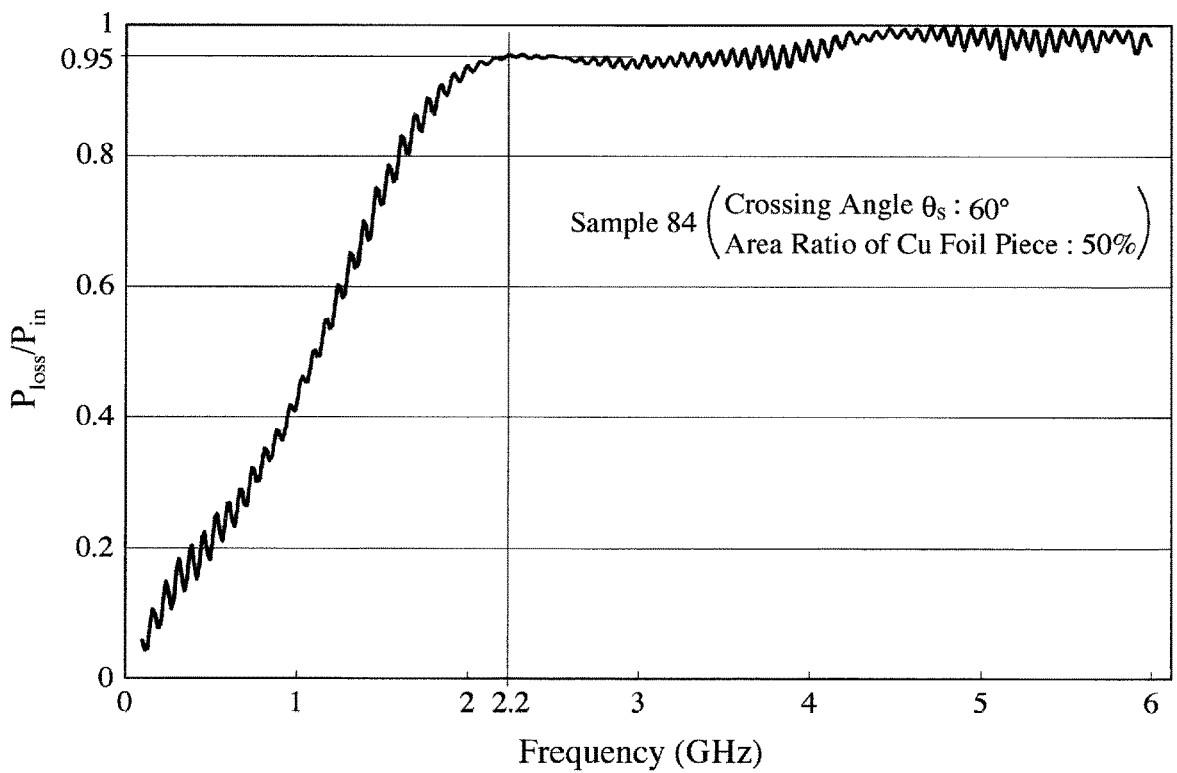
FIG. 51 is a graph showing the noise absorption ratio $P_{loss}/P_{in}$ of Sample 84 (crossing angle θs of linear scratches=60°, and area ratio of copper foil piece=50%) of the electromagnetic-wave-absorbing composite sheet.
Figure 52:
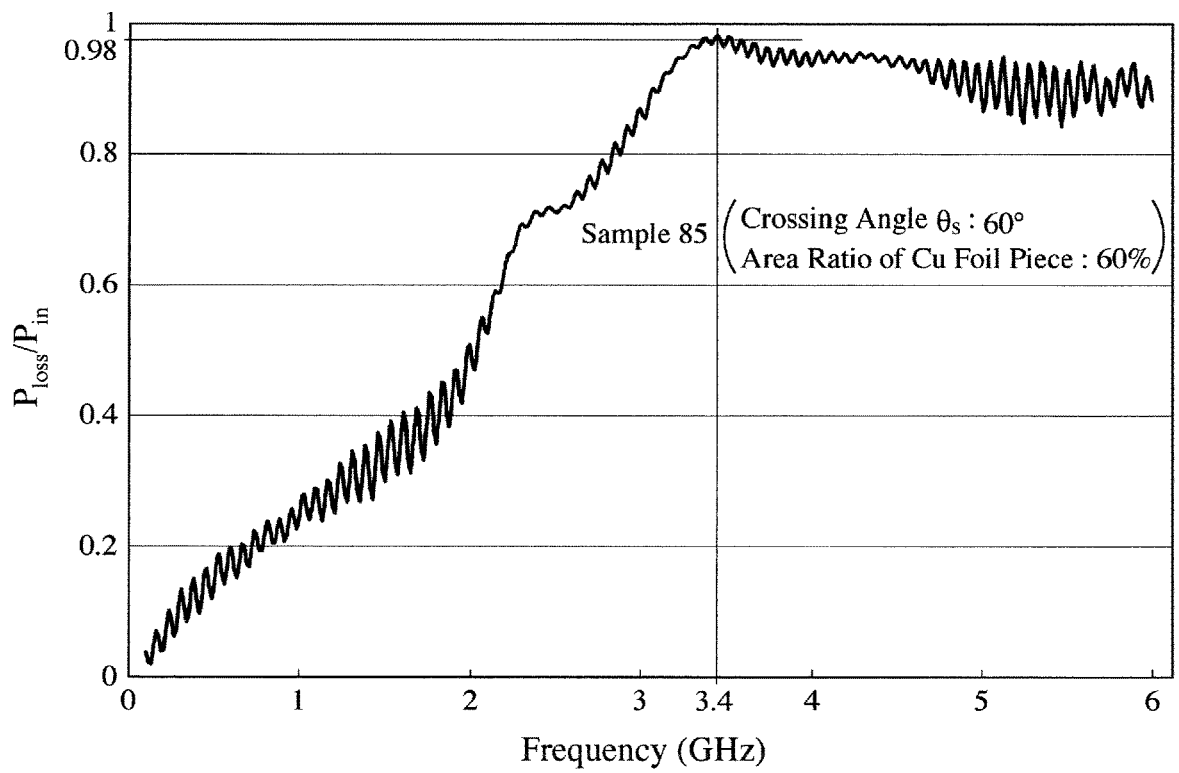
FIG. 52 is a graph showing the noise absorption ratio $P_{loss}/P_{in}$ of Sample 85 (crossing angle θs of linear scratches=60°, and area ratio of copper foil piece=60%) of the electromagnetic-wave-absorbing composite sheet.
Figure 53:
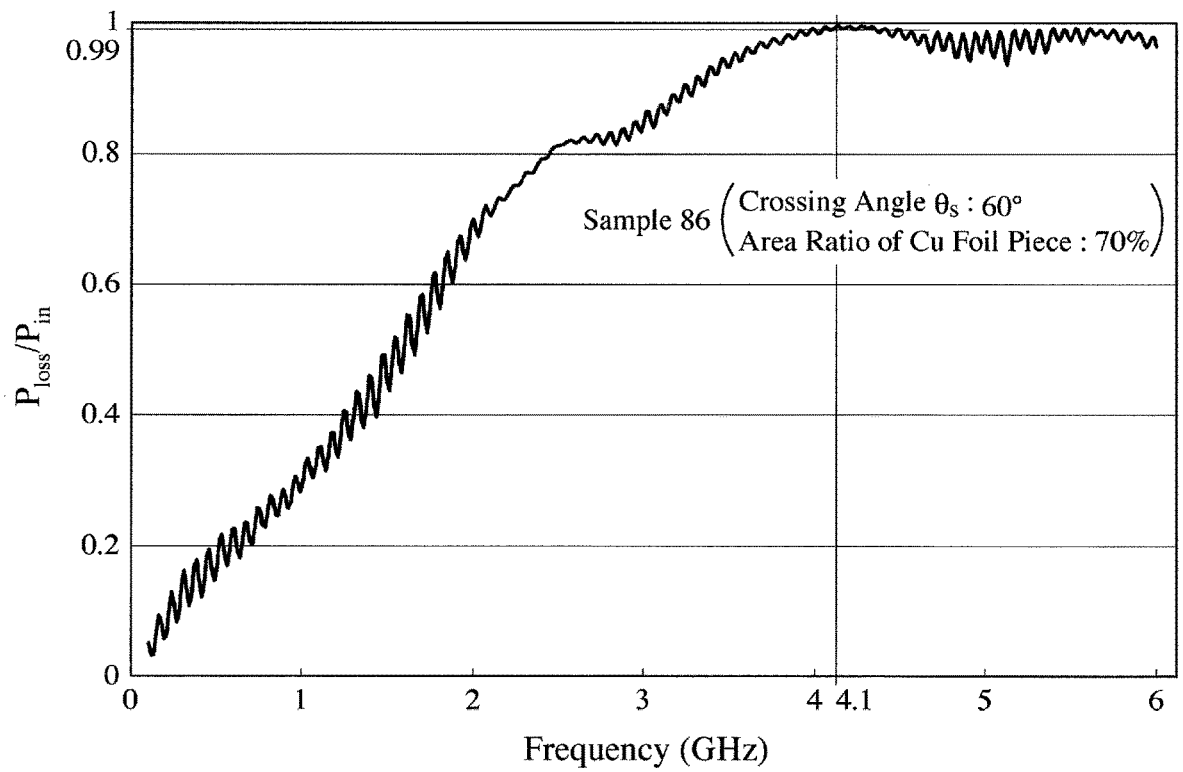
FIG. 53 is a graph showing the noise absorption ratio $P_{loss}/P_{in}$ of Sample 86 (crossing angle θs of linear scratches=60°, and area ratio of copper foil piece=70%) of the electromagnetic-wave-absorbing composite sheet.
Figure 54:
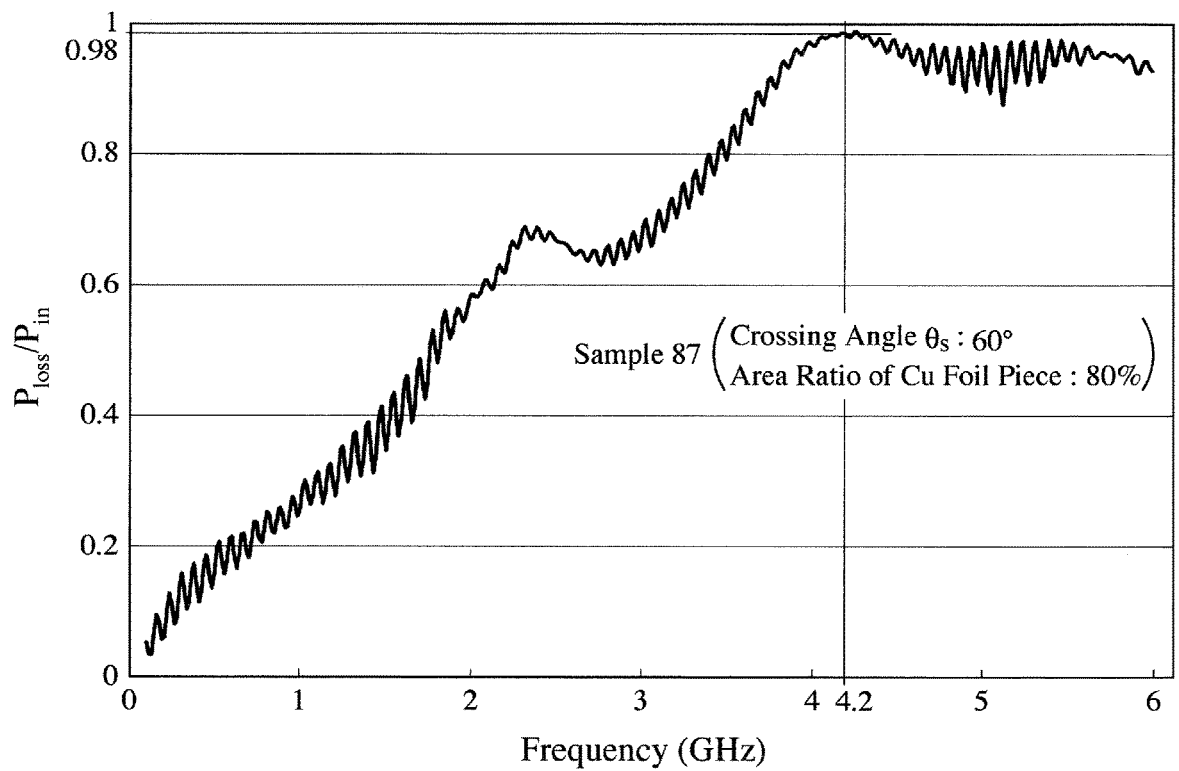
FIG. 54 is a graph showing the noise absorption ratio $P_{loss}/P_{in}$ of Sample 87 (crossing angle θs of linear scratches=60°, and area ratio of copper foil piece=80%) of the electromagnetic-wave-absorbing composite sheet.
Figure 55:
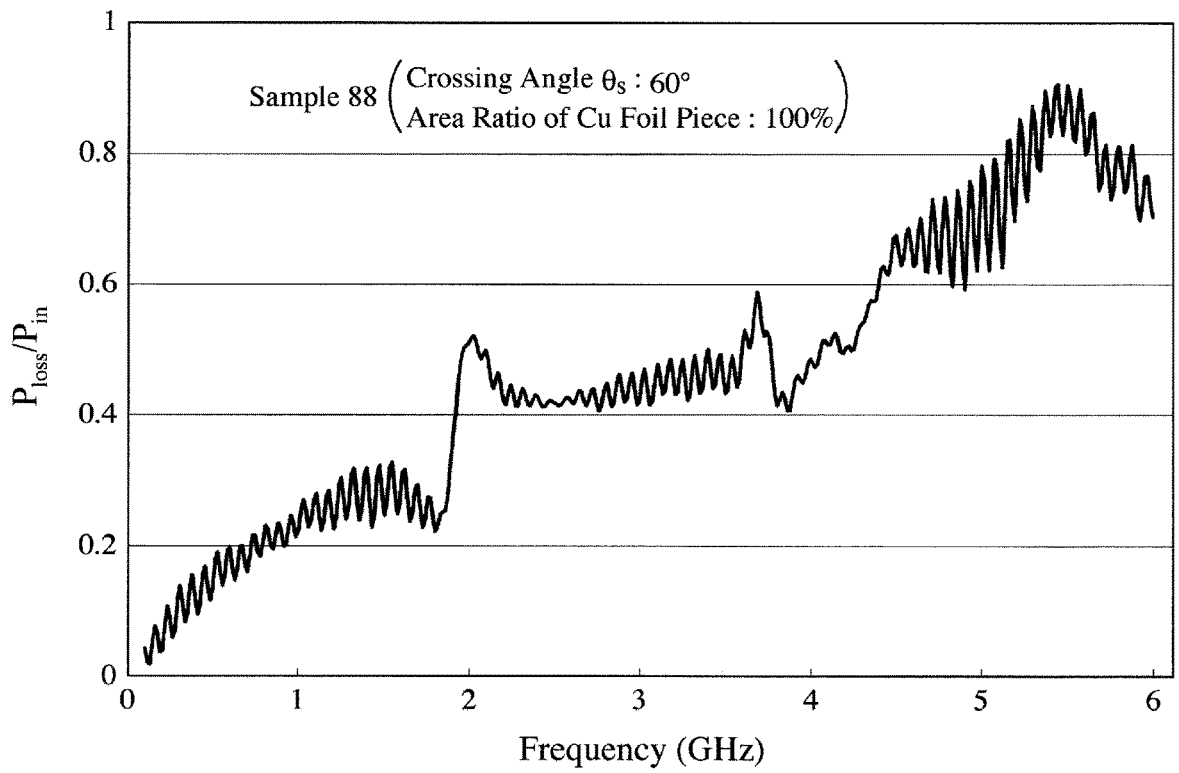
FIG. 55 is a graph showing the noise absorption ratio $P_{loss}/P_{in}$ of Sample 88 (crossing angle θs of linear scratches=60°, and area ratio of copper foil piece=100%) of the electromagnetic-wave-absorbing composite sheet.
Figure 56:
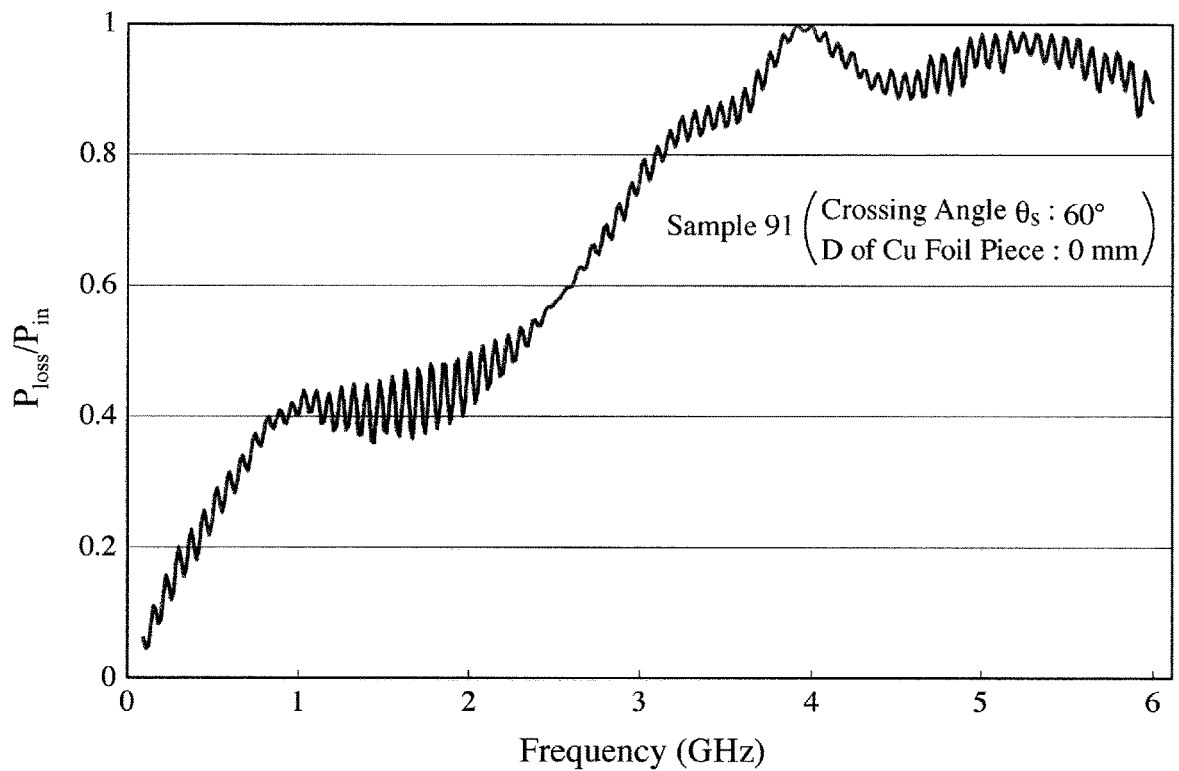
FIG. 56 is a graph showing the noise absorption ratio $P_{loss}/P_{in}$ of Sample 91 (crossing angle θs of linear scratches=60°, and distance D of copper foil piece=0 mm) of the electromagnetic-wave-absorbing composite sheet.
Figure 57:
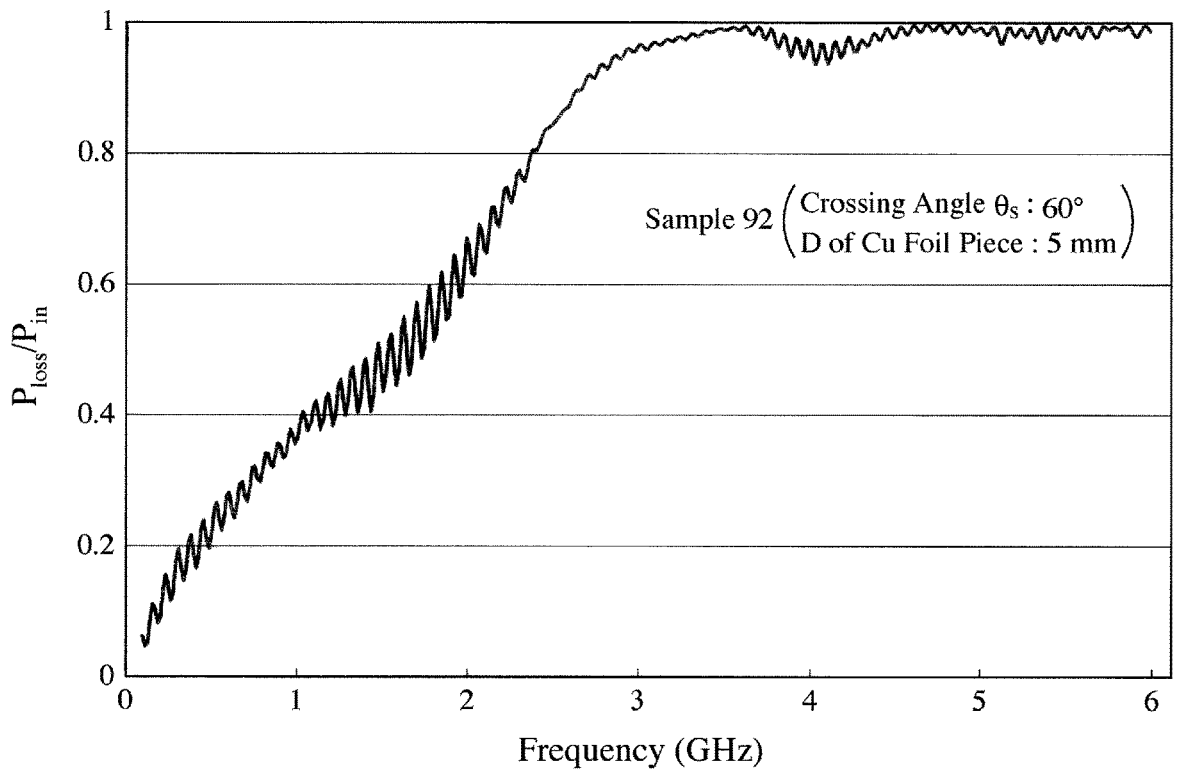
FIG. 57 is a graph showing the noise absorption ratio $P_{loss}/P_{in}$ of Sample 92 (crossing angle θs of linear scratches=60°, and distance D of copper foil piece=5 mm) of the electromagnetic-wave-absorbing composite sheet.
Figure 58:
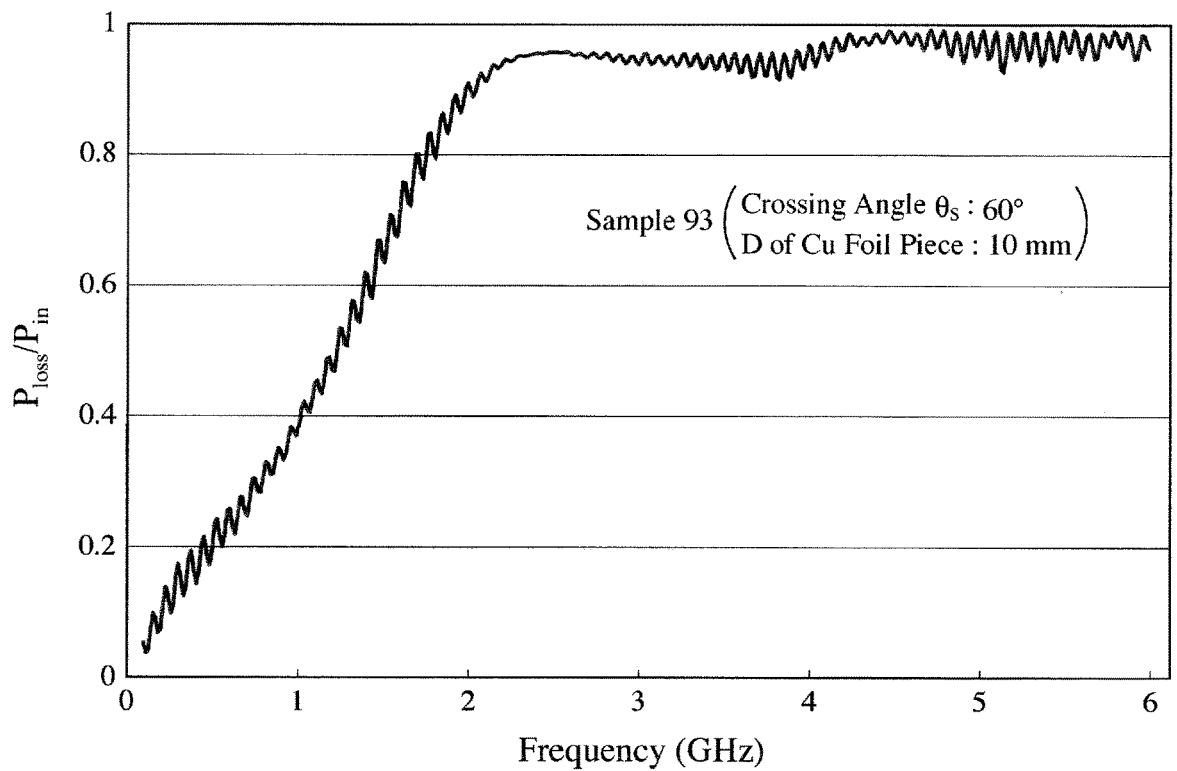
FIG. 58 is a graph showing the noise absorption ratio $P_{loss}/P_{in}$ of Sample 93 (crossing angle θs of linear scratches=60°, and distance D of copper foil piece=10 mm) of the electromagnetic-wave-absorbing composite sheet.
Figure 59:
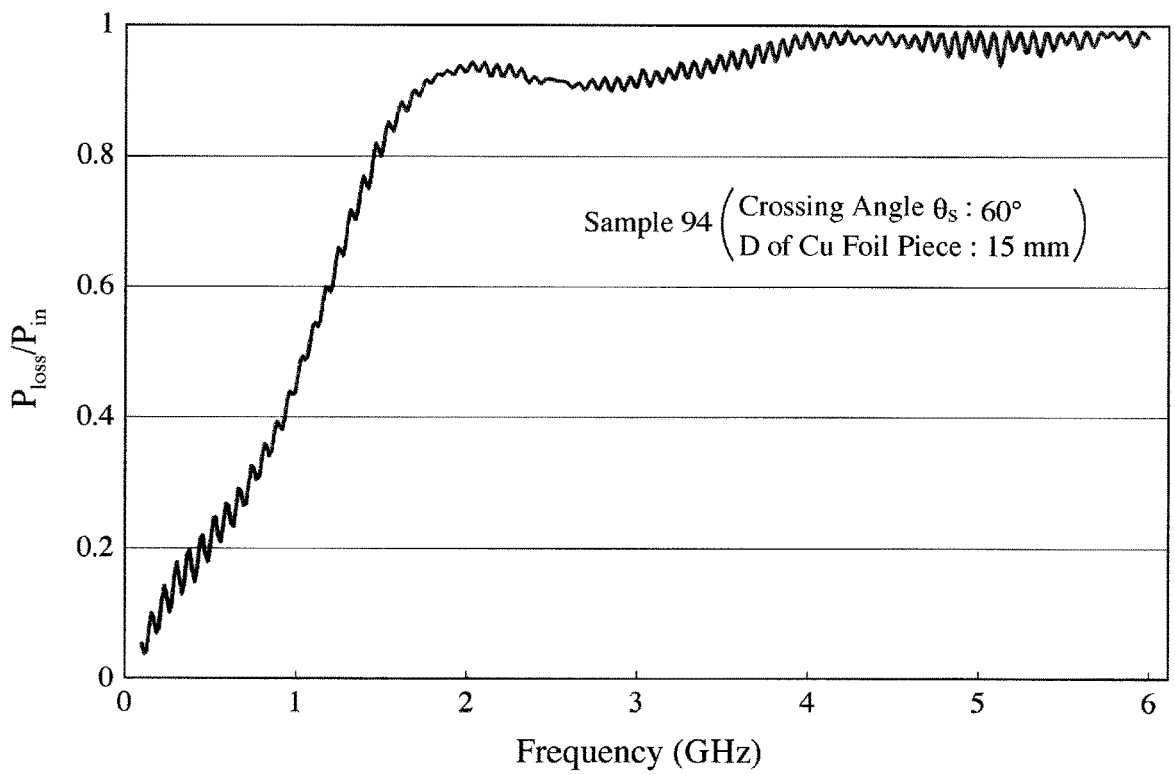
FIG. 59 is a graph showing the noise absorption ratio $P_{loss}/P_{in}$ of Sample 94 (crossing angle θs of linear scratches=60°, and distance D of copper foil piece=15 mm) of the electromagnetic-wave-absorbing composite sheet.
Figure 60:
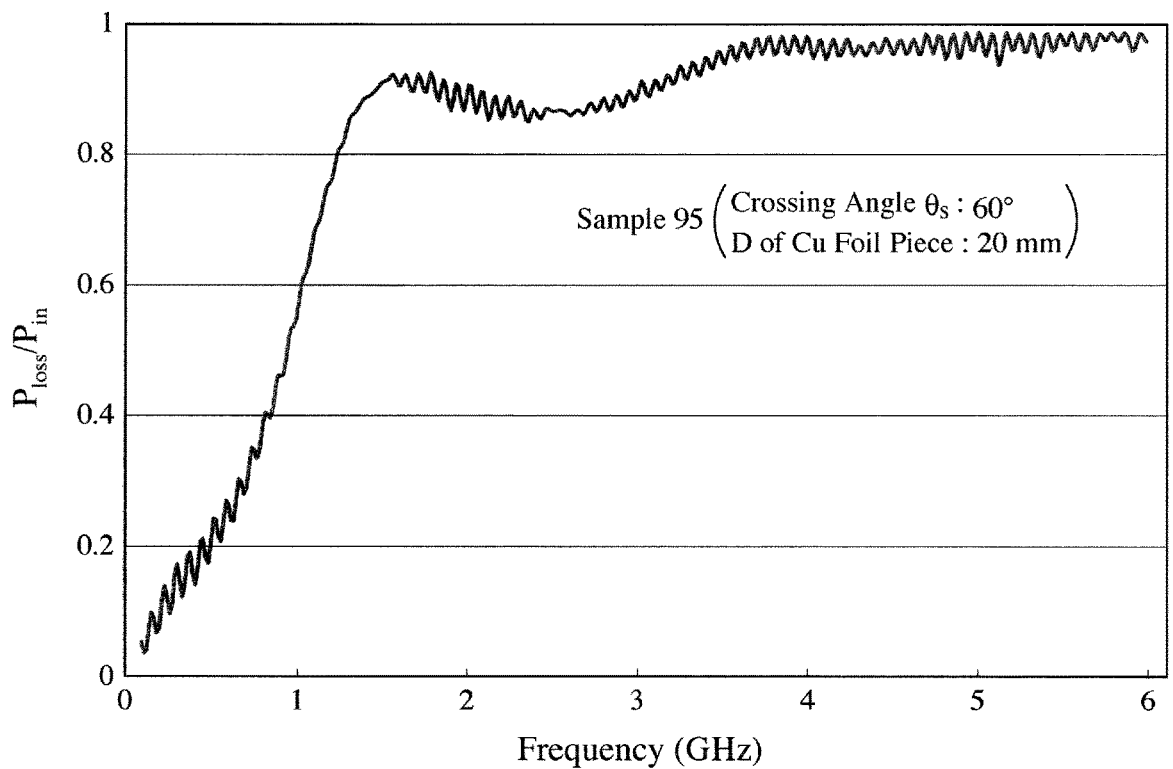
FIG. 60 is a graph showing the noise absorption ratio $P_{loss}/P_{in}$ of Sample 95 (crossing angle θs of linear scratches=60°, and distance D of copper foil piece=20 mm) of the electromagnetic-wave-absorbing composite sheet.
Figure 61:
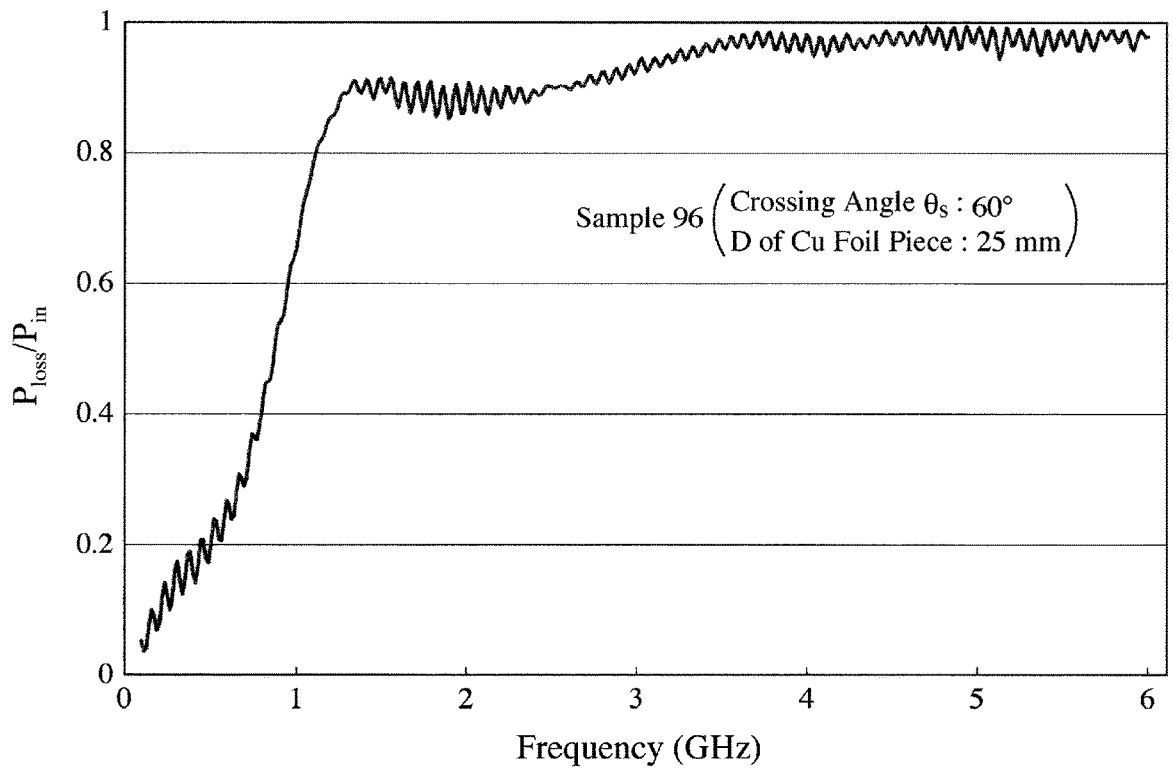
FIG. 61 is a graph showing the noise absorption ratio $P_{loss}/P_{in}$ of Sample 96 (crossing angle θs of linear scratches=60°, and distance D of copper foil piece=25 mm) of the electromagnetic-wave-absorbing composite sheet.
Figure 62:
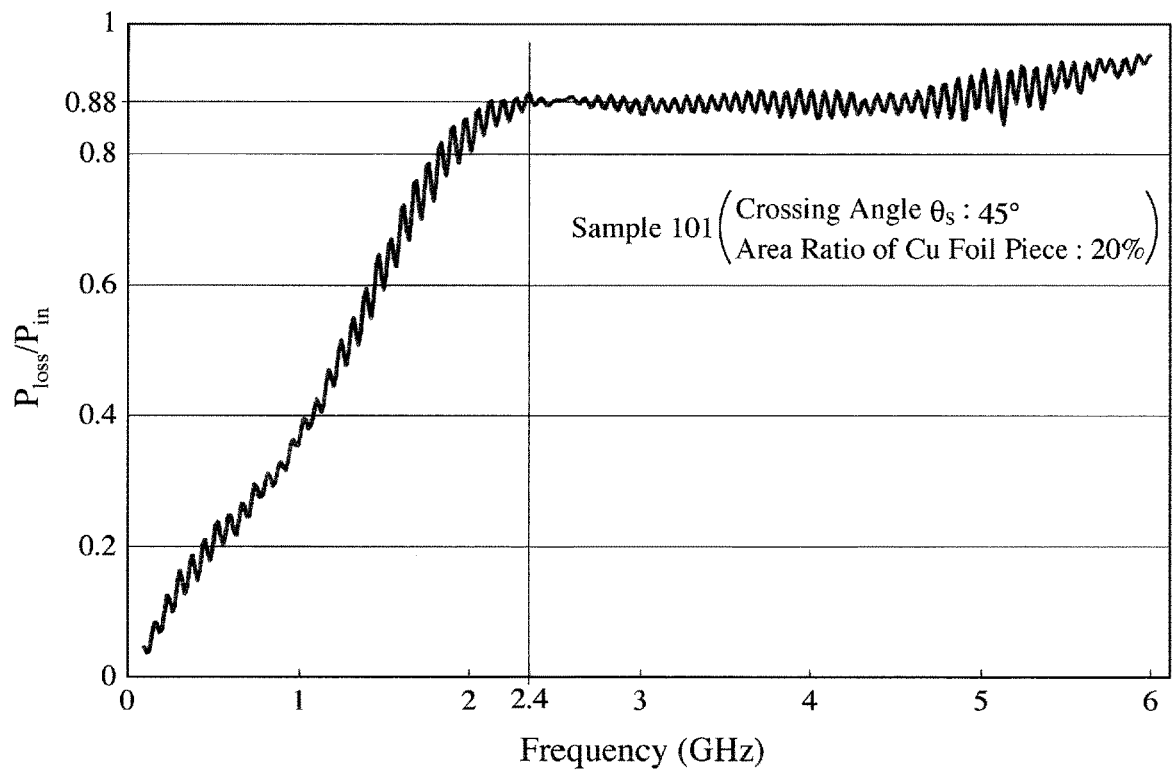
FIG. 62 is a graph showing the noise absorption ratio $P_{loss}/P_{in}$ of Sample 101 (crossing angle θs of linear scratches=45°, and area ratio of copper foil piece=20%) of the electromagnetic-wave-absorbing composite sheet.
Figure 63:
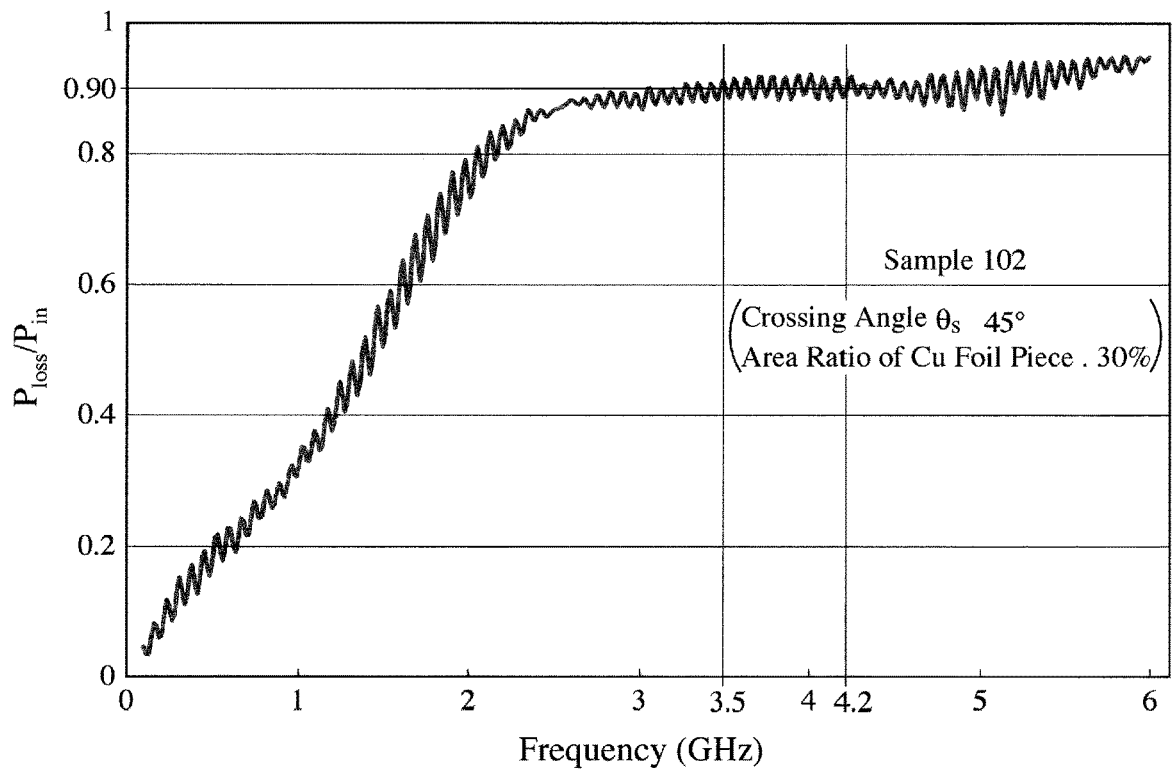
FIG. 63 is a graph showing the noise absorption ratio $P_{loss}/P_{in}$ of Sample 102 (crossing angle θs of linear scratches=45°, and area ratio of copper foil piece=30%) of the electromagnetic-wave-absorbing composite sheet.
Figure 64:
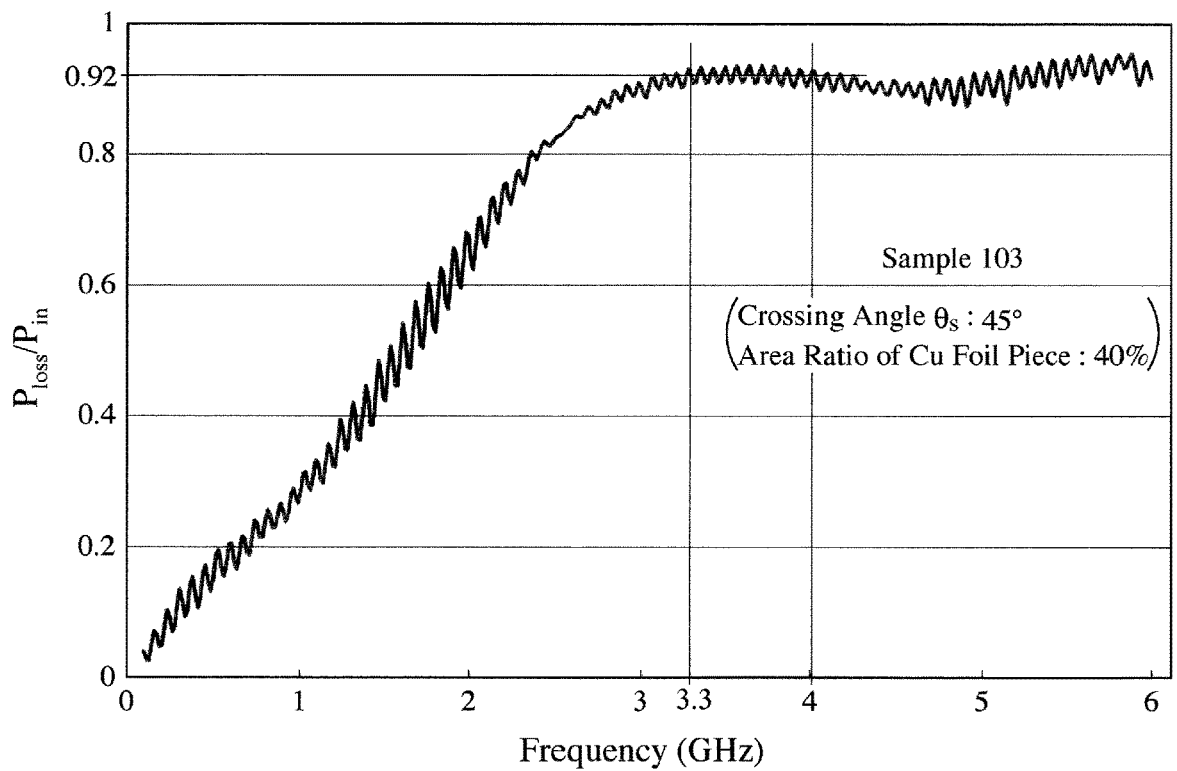
FIG. 64 is a graph showing the noise absorption ratio $P_{loss}/P_{in}$ of Sample 103 (crossing angle θs of linear scratches=45°, and area ratio of copper foil piece=40%) of the electromagnetic-wave-absorbing composite sheet.
Figure 65:
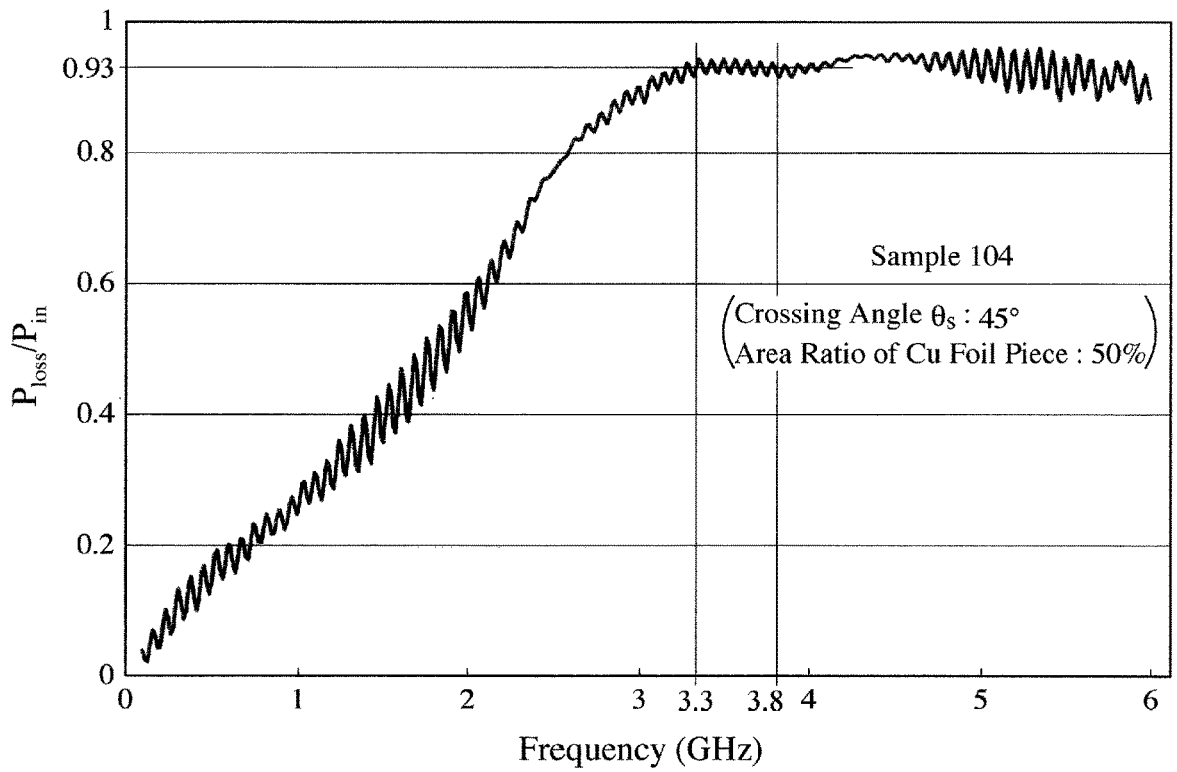
FIG. 65 is a graph showing the noise absorption ratio $P_{loss}/P_{in}$ of Sample 104 (crossing angle θs of linear scratches=45°, and area ratio of copper foil piece=50%) of the electromagnetic-wave-absorbing composite sheet.
Figure 66:
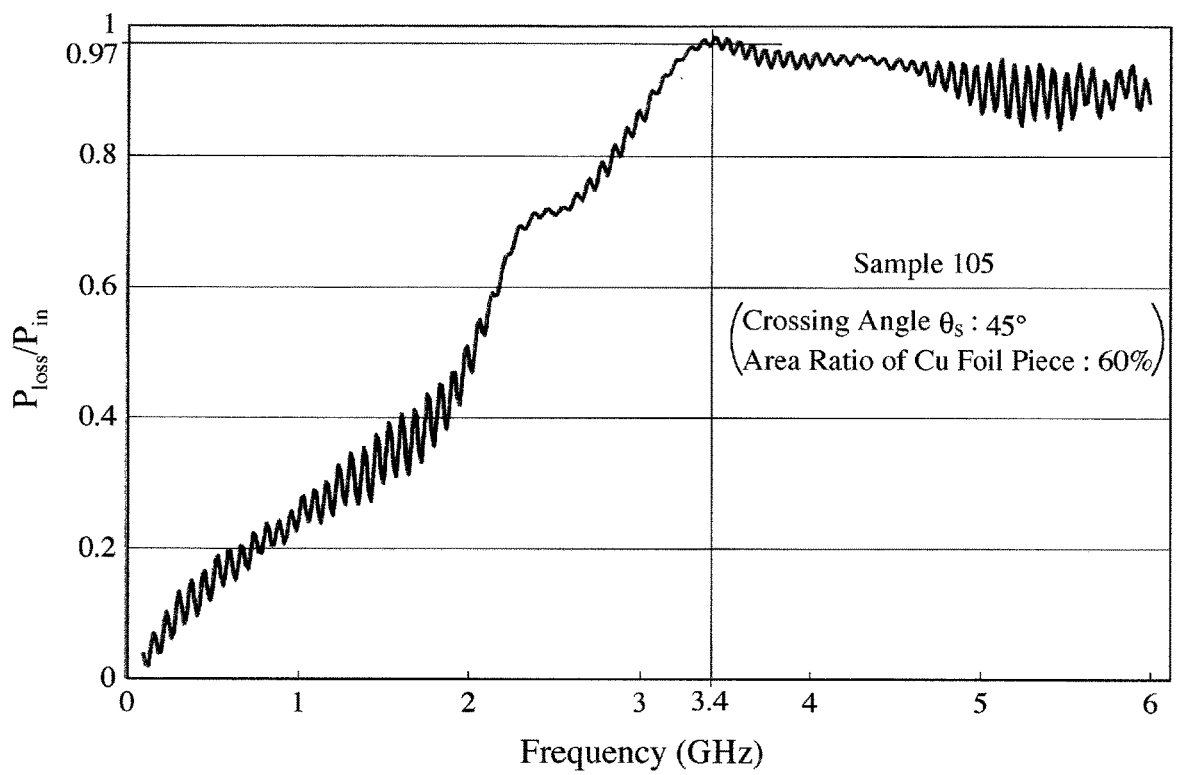
FIG. 66 is a graph showing the noise absorption ratio $P_{loss}/P_{in}$ of Sample 105 (crossing angle θs of linear scratches=45°, and area ratio of copper foil piece=60%) of the electromagnetic-wave-absorbing composite sheet.
Figure 67:
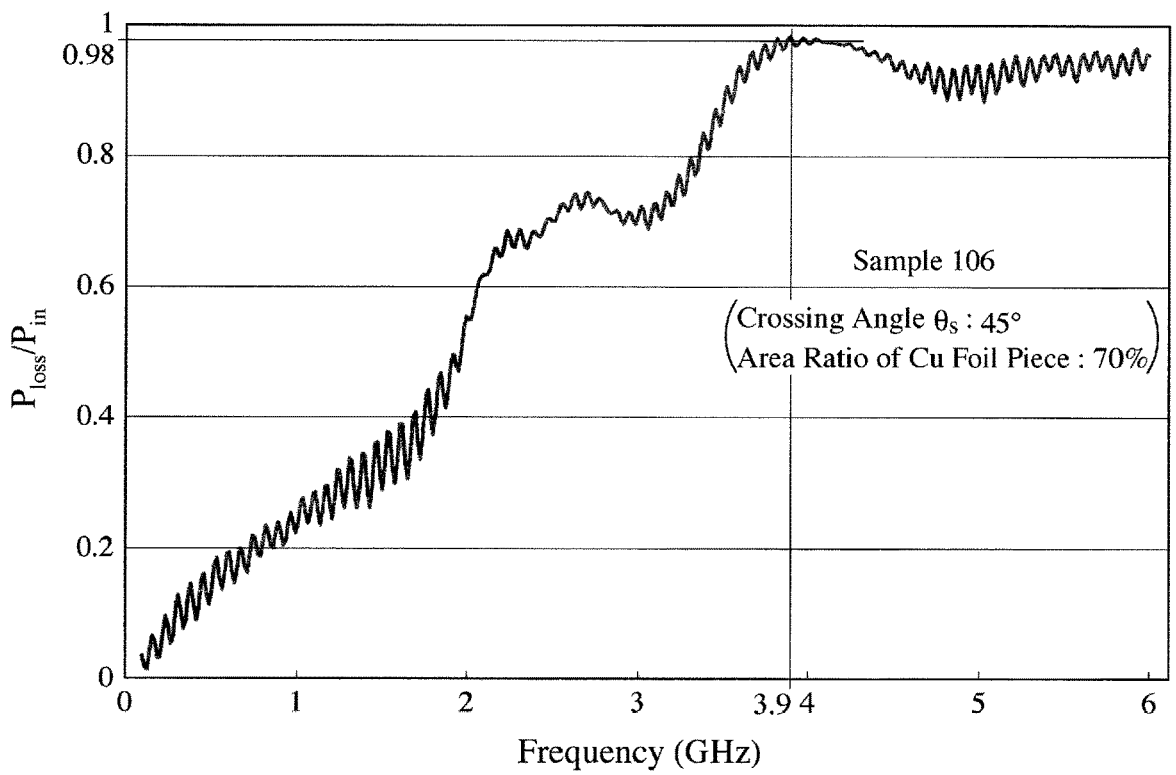
FIG. 67 is a graph showing the noise absorption ratio $P_{loss}/P_{in}$ of Sample 106 (crossing angle θs of linear scratches=45°, and area ratio of copper foil piece=70%) of the electromagnetic-wave-absorbing composite sheet.
Figure 68:
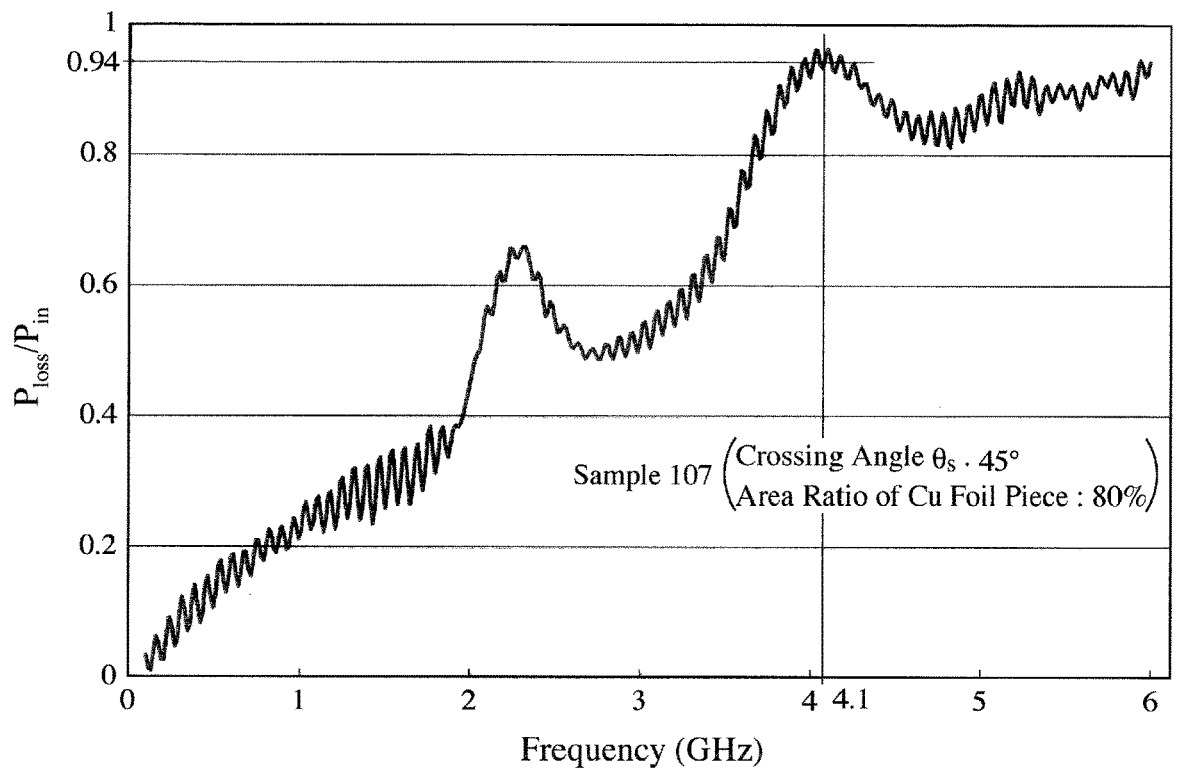
FIG. 68 is a graph showing the noise absorption ratio $P_{loss}/P_{in}$ of Sample 107 (crossing angle θs of linear scratches=45°, and area ratio of copper foil piece=80%) of the electromagnetic-wave-absorbing composite sheet.
Figure 69:
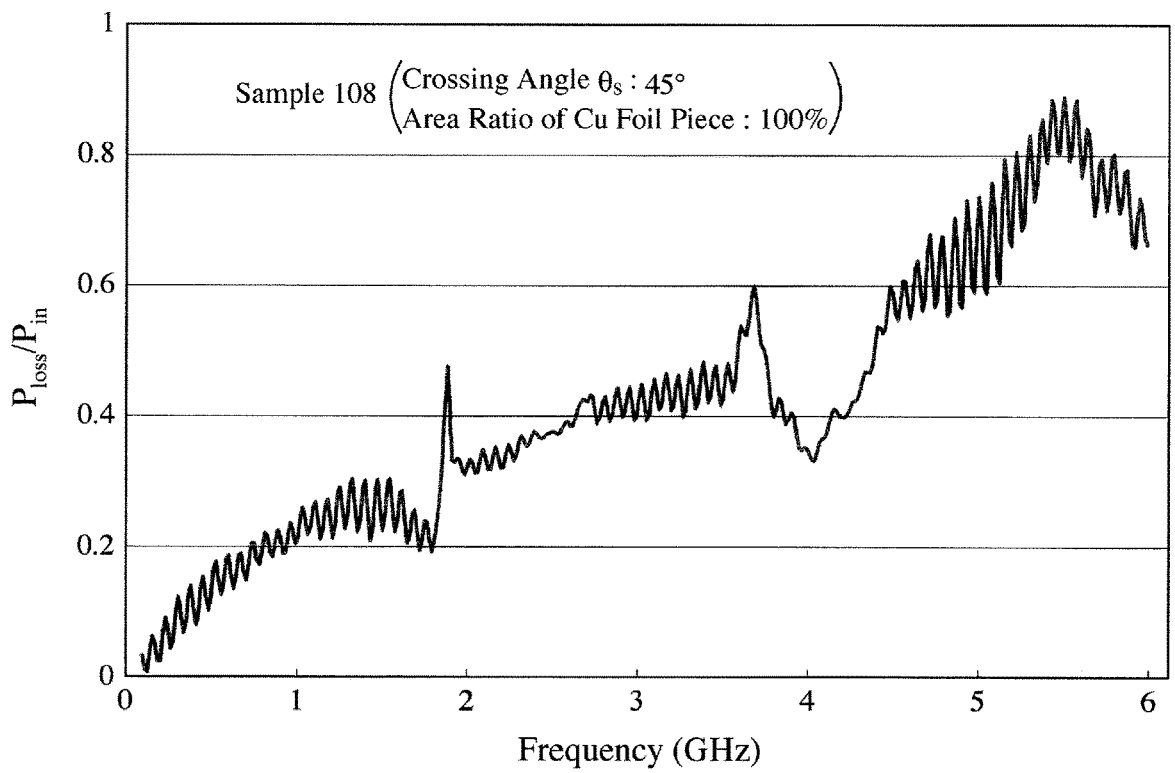
FIG. 69 is a graph showing the noise absorption ratio $P_{loss}/P_{in}$ of Sample 108 (crossing angle θs of linear scratches=45°, and area ratio of copper foil piece=100%) of the electromagnetic-wave-absorbing composite sheet.
Figure 70:
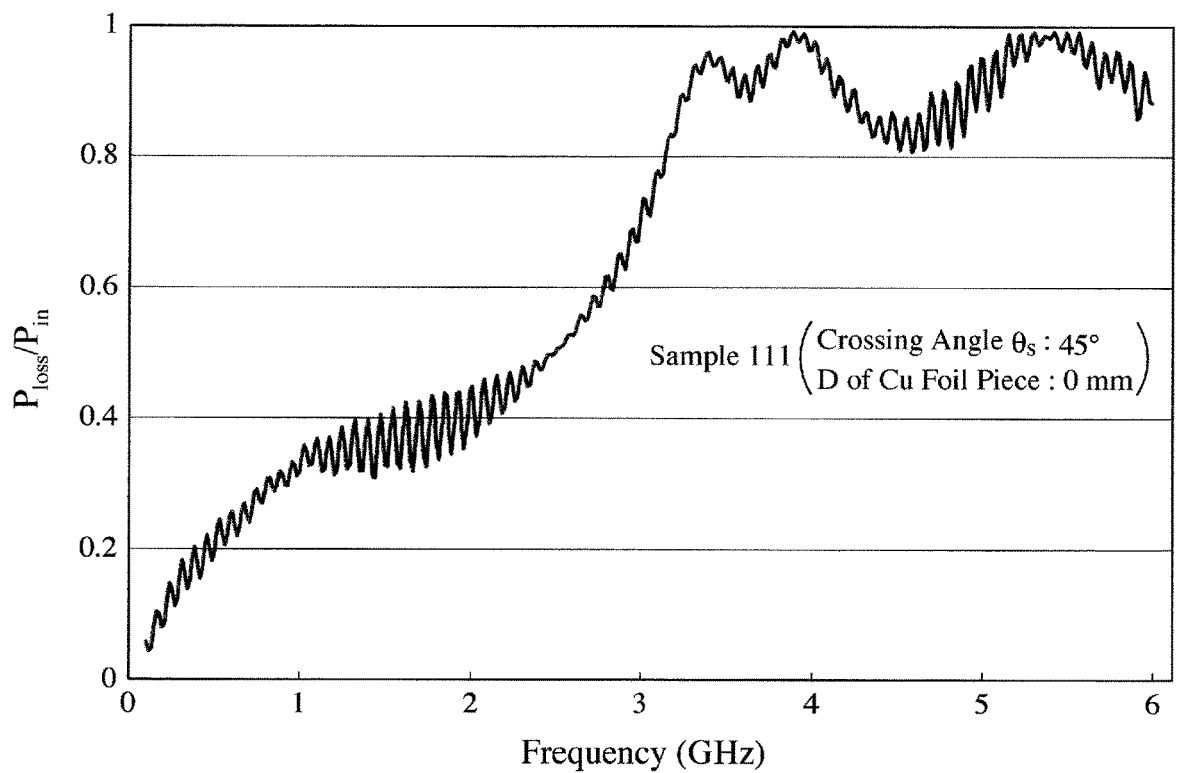
FIG. 70 is a graph showing the noise absorption ratio $P_{loss}/P_{in}$ of Sample 111 (crossing angle θs of linear scratches=45°, and distance D of copper foil piece=0 mm) of the electromagnetic-wave-absorbing composite sheet.
Figure 71:
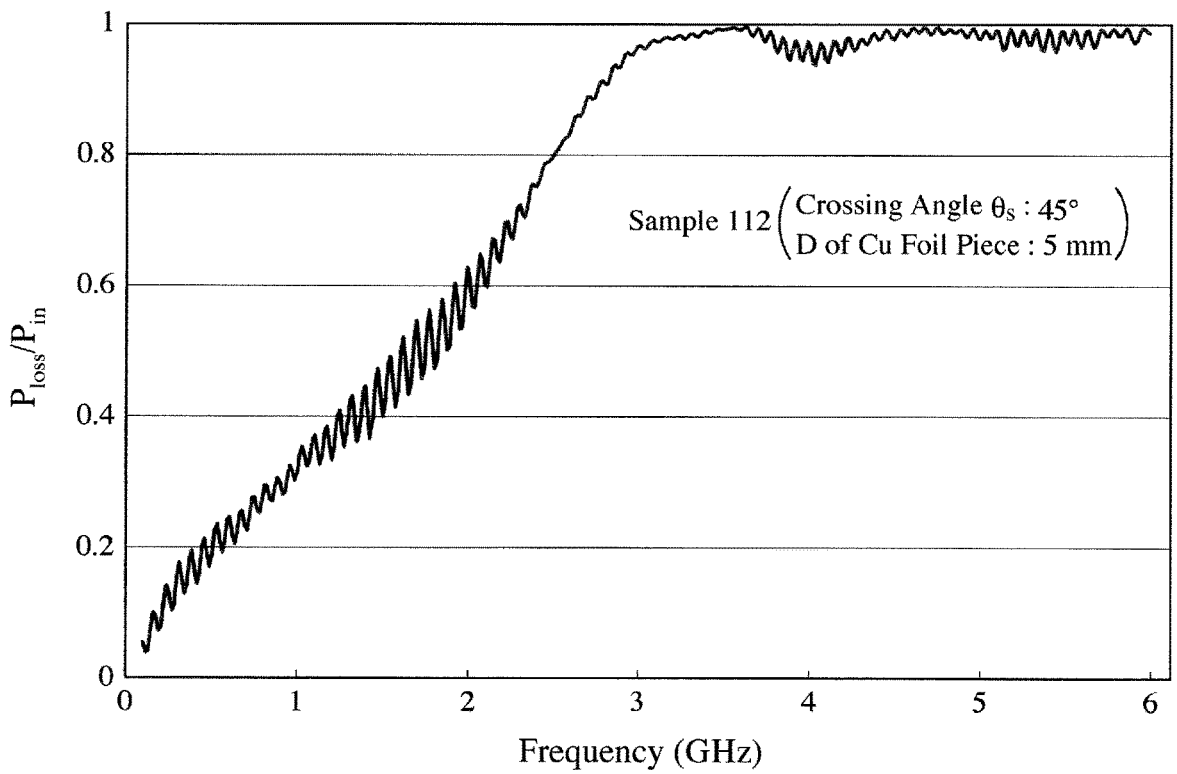
FIG. 71 is a graph showing the noise absorption ratio $P_{loss}/P_{in}$ of Sample 112 (crossing angle θs of linear scratches=45°, and distance D of copper foil piece=5 mm) of the electromagnetic-wave-absorbing composite sheet.
Figure 72:
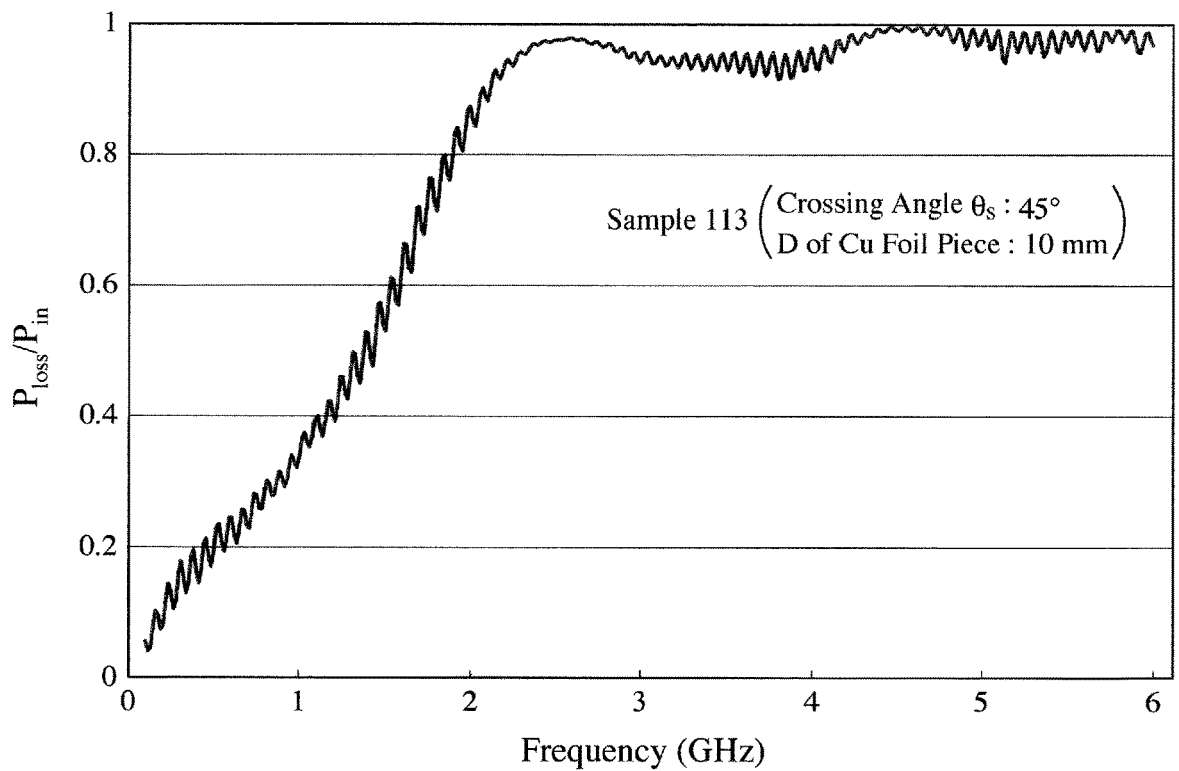
FIG. 72 is a graph showing the noise absorption ratio $P_{loss}/P_{in}$ of Sample 113 (crossing angle θs of linear scratches=45°, and distance D of copper foil piece=10 mm) of the electromagnetic-wave-absorbing composite sheet.
Figure 73:
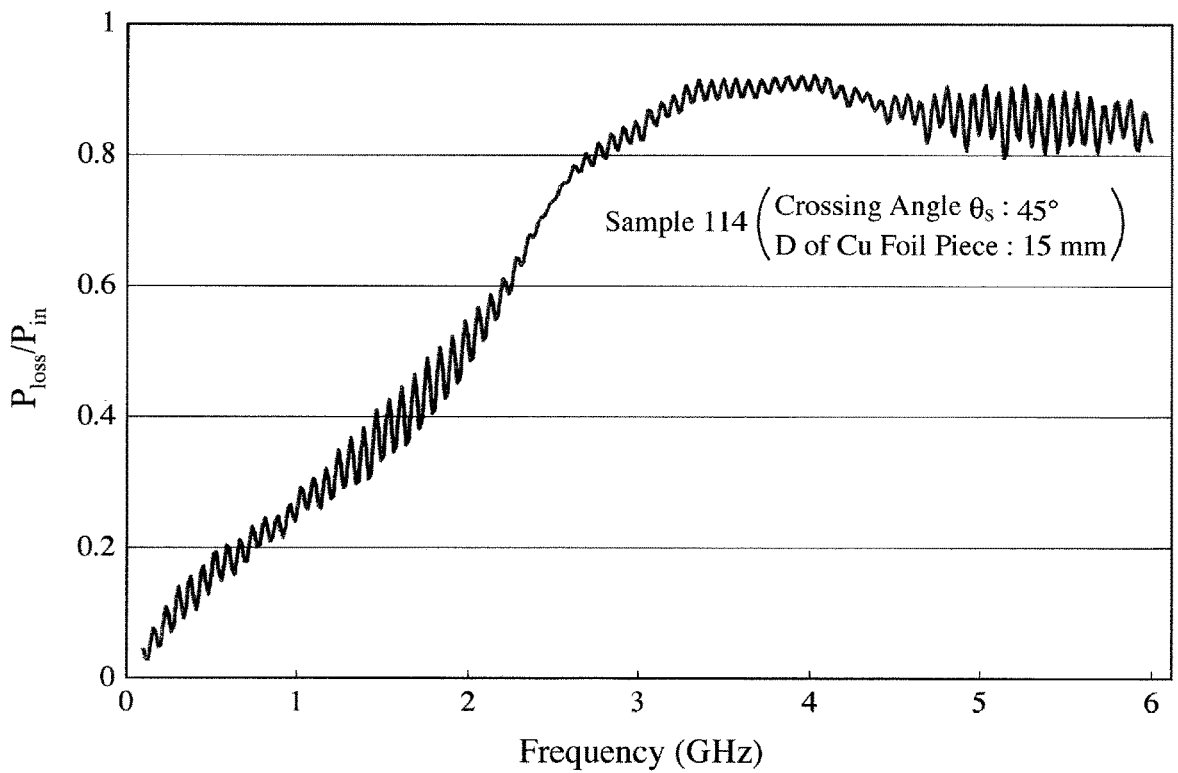
FIG. 73 is a graph showing the noise absorption ratio $P_{loss}/P_{in}$ of Sample 114 (crossing angle θs of linear scratches=45°, and distance D of copper foil piece=15 mm) of the electromagnetic-wave-absorbing composite sheet.
Figure 74:
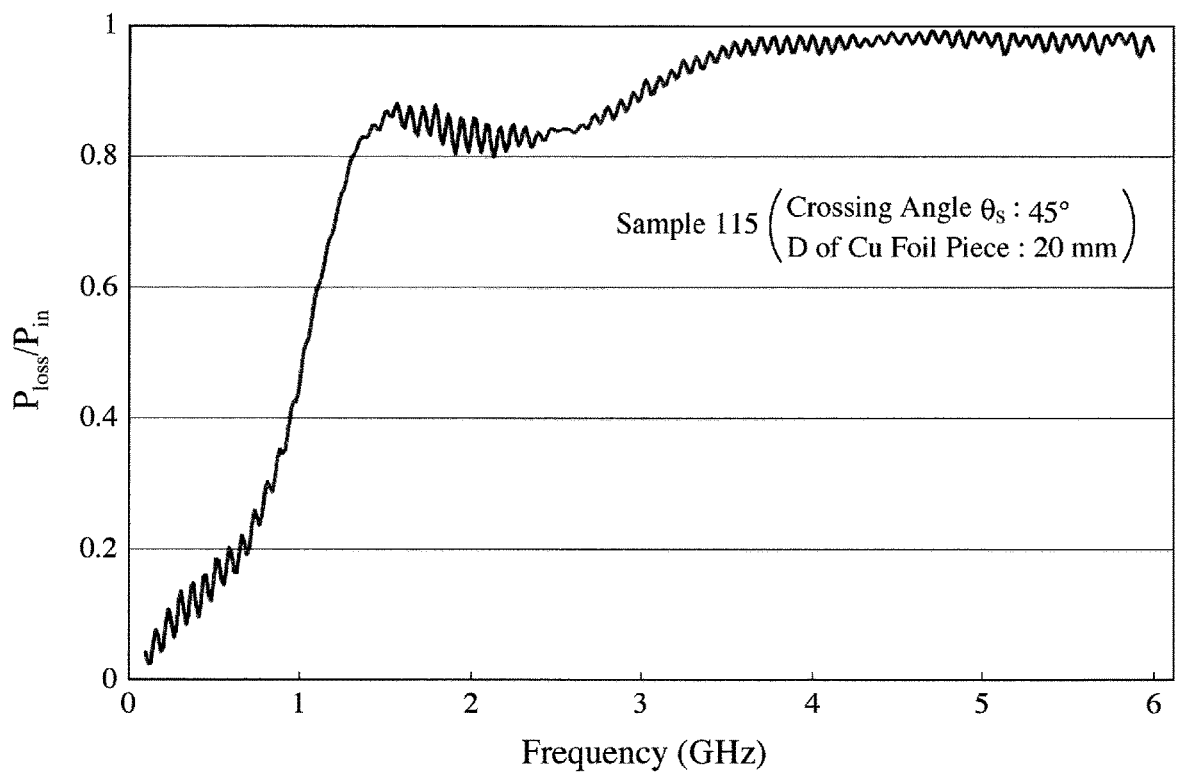
FIG. 74 is a graph showing the noise absorption ratio $P_{loss}/P_{in}$ of Sample 115 (crossing angle θs of linear scratches=45°, and distance D of copper foil piece=20 mm) of the electromagnetic-wave-absorbing composite sheet.
Figure 75:
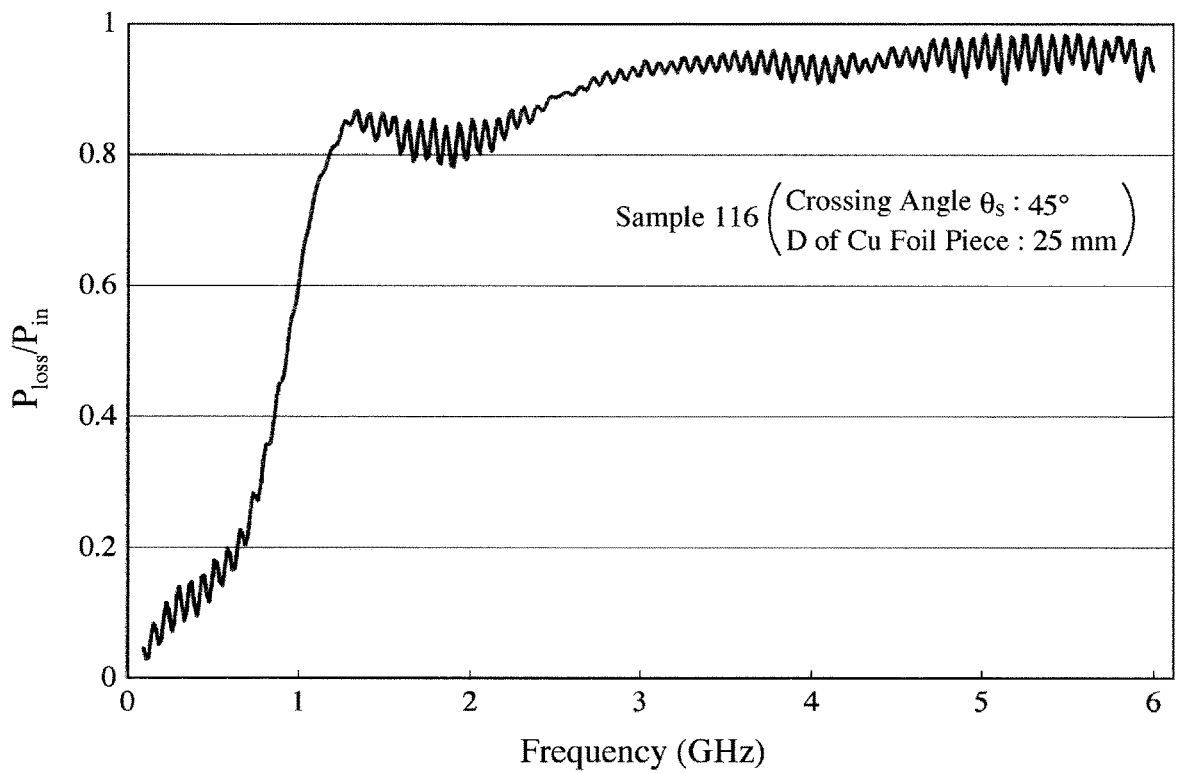
FIG. 75 is a graph showing the noise absorption ratio $P_{loss}/P_{in}$ of Sample 116 (crossing angle θs of linear scratches=45°, and distance D of copper foil piece=25 mm) of the electromagnetic-wave-absorbing composite sheet.
Figure 76:
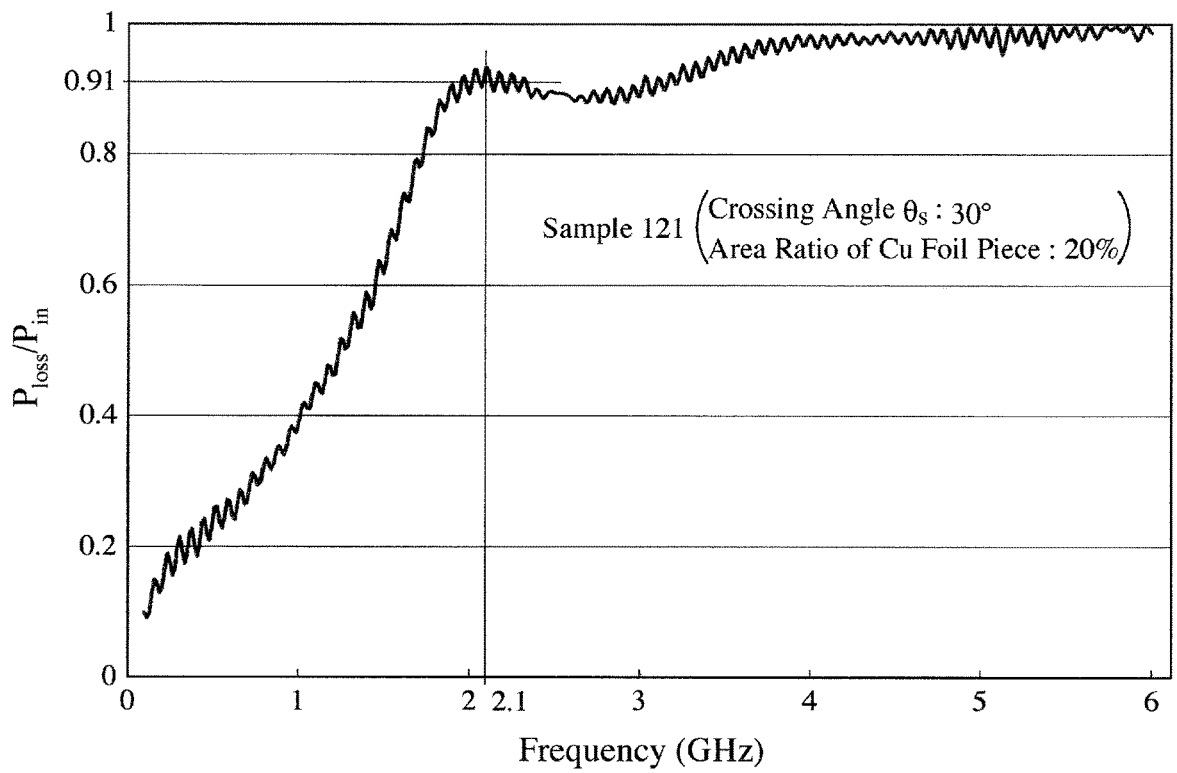
FIG. 76 is a graph showing the noise absorption ratio $P_{loss}/P_{in}$ of Sample 121 (crossing angle θs of linear scratches=30°, and area ratio of copper foil piece=20%) of the electromagnetic-wave-absorbing composite sheet.
Figure 77:
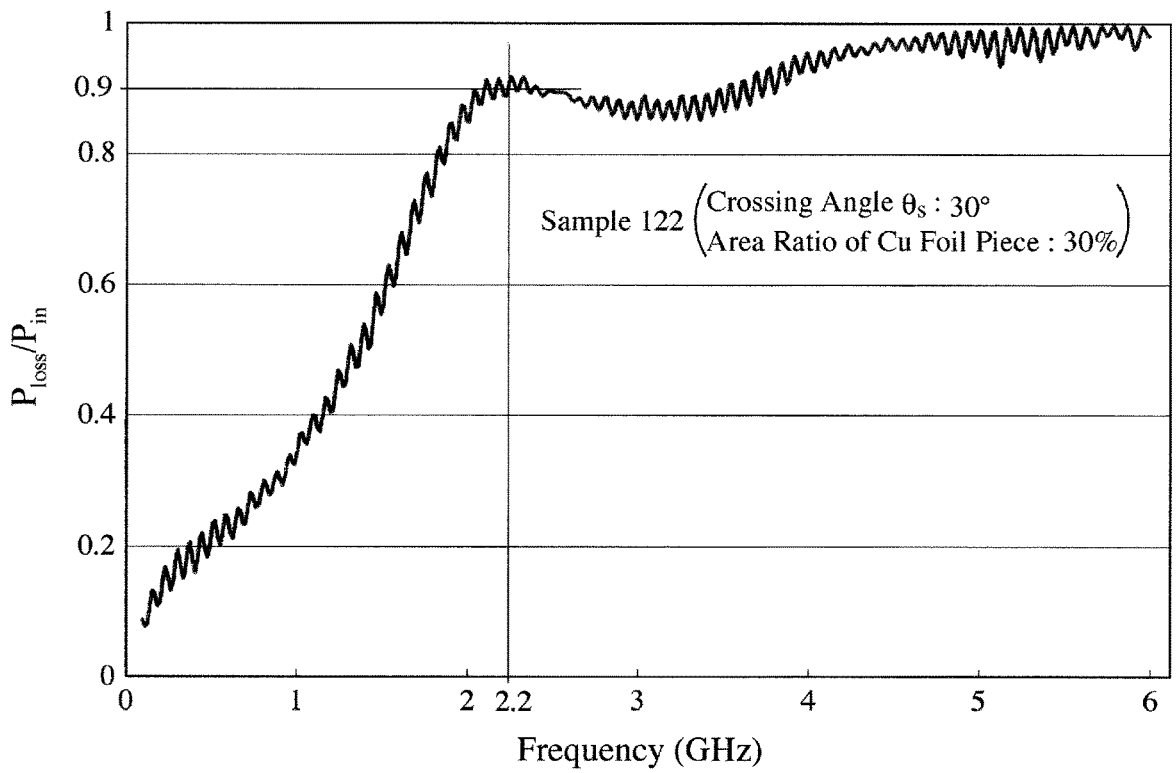
FIG. 77 is a graph showing the noise absorption ratio $P_{loss}/P_{in}$ of Sample 122 (crossing angle θs of linear scratches=30°, and area ratio of copper foil piece=30%) of the electromagnetic-wave-absorbing composite sheet.
Figure 78:
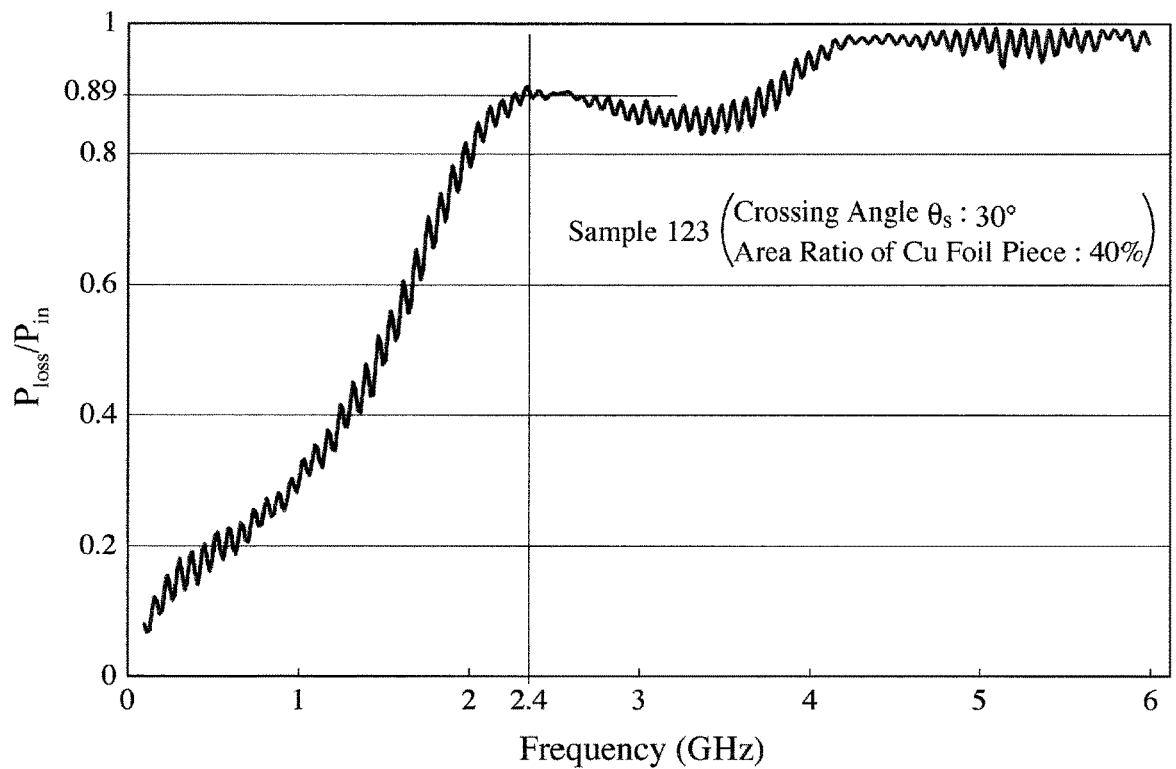
FIG. 78 is a graph showing the noise absorption ratio $P_{loss}/P_{in}$ of Sample 123 (crossing angle θs of linear scratches=30°, and area ratio of copper foil piece=40%) of the electromagnetic-wave-absorbing composite sheet.
Figure 79:
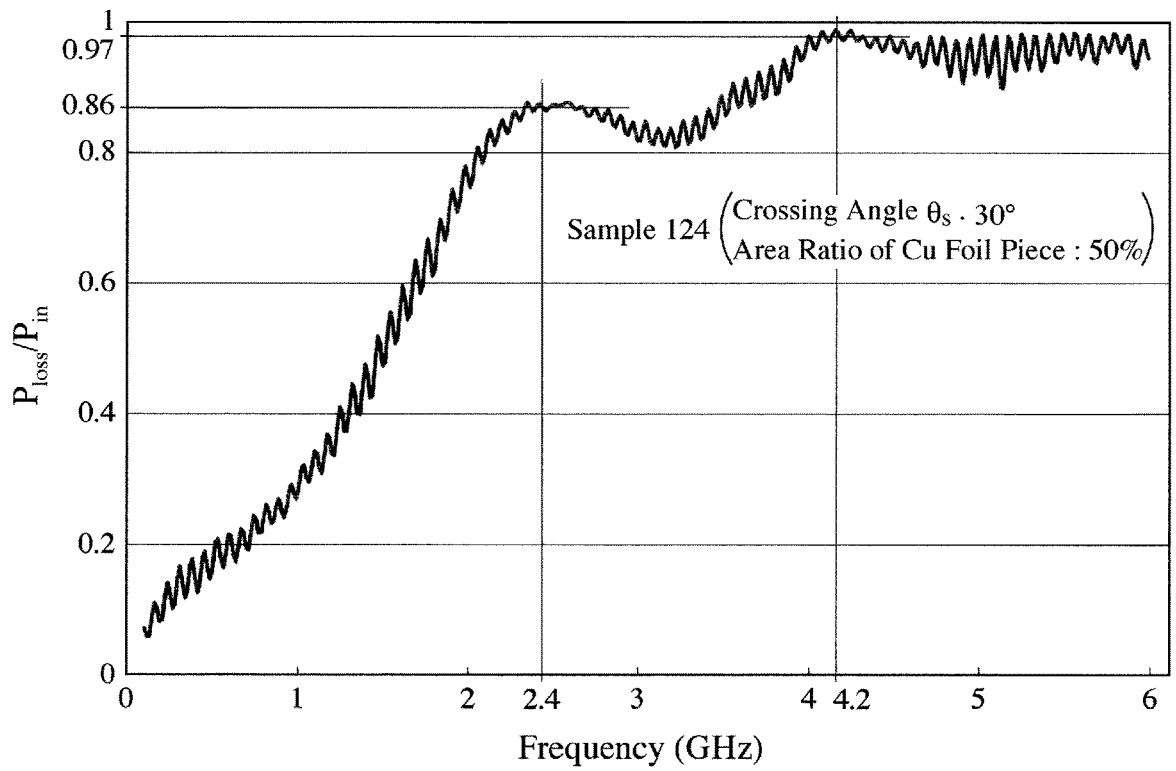
FIG. 79 is a graph showing the noise absorption ratio $P_{loss}/P_{in}$ of Sample 124 (crossing angle θs of linear scratches=30°, and area ratio of copper foil piece=50%) of the electromagnetic-wave-absorbing composite sheet.
Figure 80:
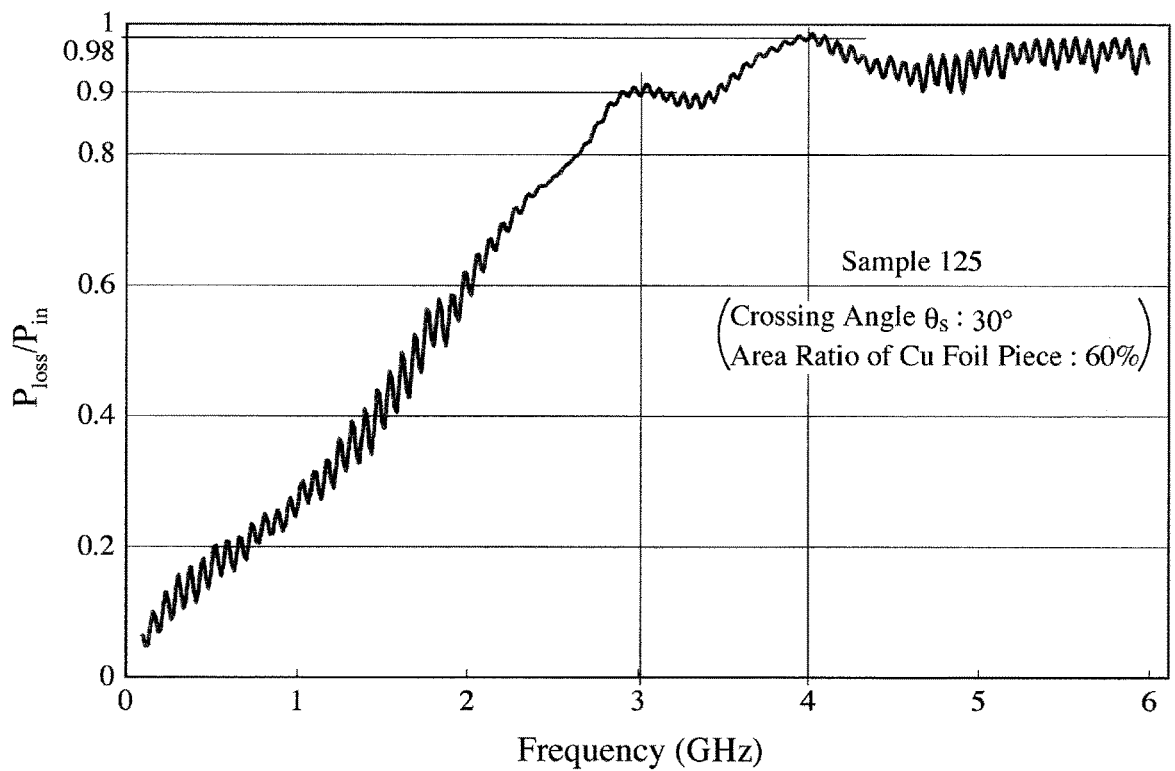
FIG. 80 is a graph showing the noise absorption ratio $P_{loss}/P_{in}$ of Sample 125 (crossing angle θs of linear scratches=30°, and area ratio of copper foil piece=60%) of the electromagnetic-wave-absorbing composite sheet.
Figure 81:
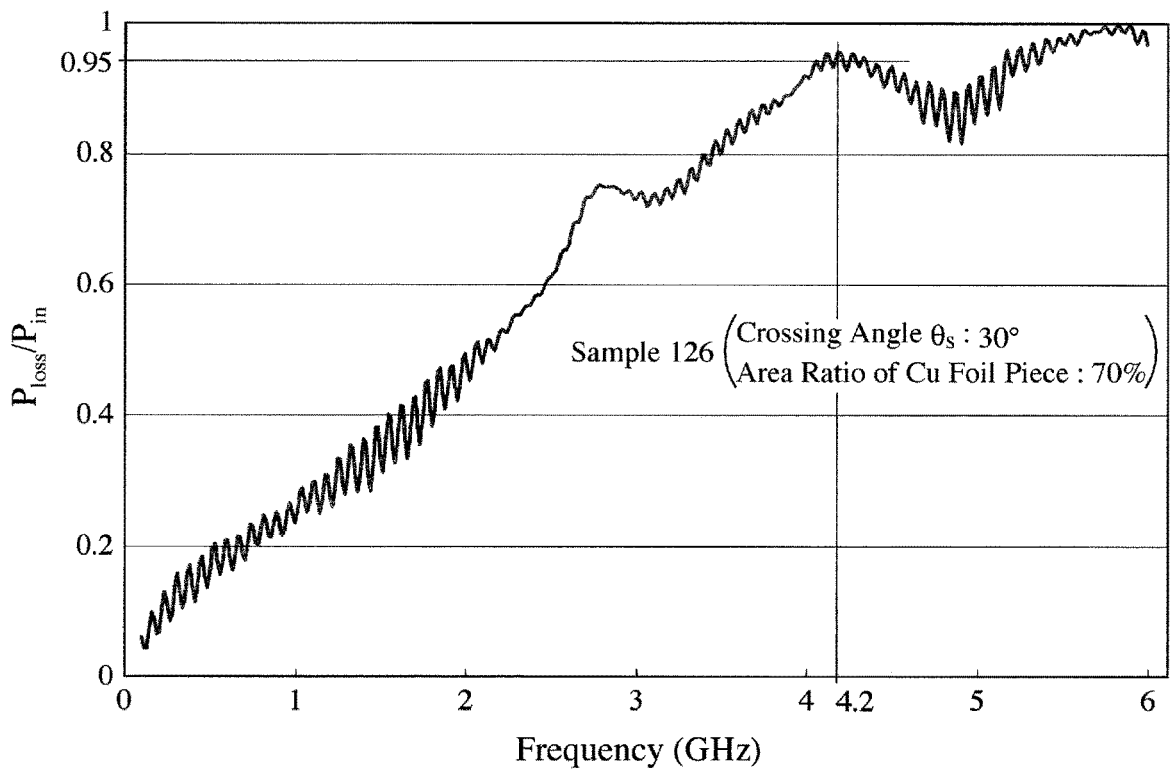
FIG. 81 is a graph showing the noise absorption ratio $P_{loss}/P_{in}$ of Sample 126 (crossing angle θs of linear scratches=30°, and area ratio of copper foil piece=70%) of the electromagnetic-wave-absorbing composite sheet.
Figure 82:
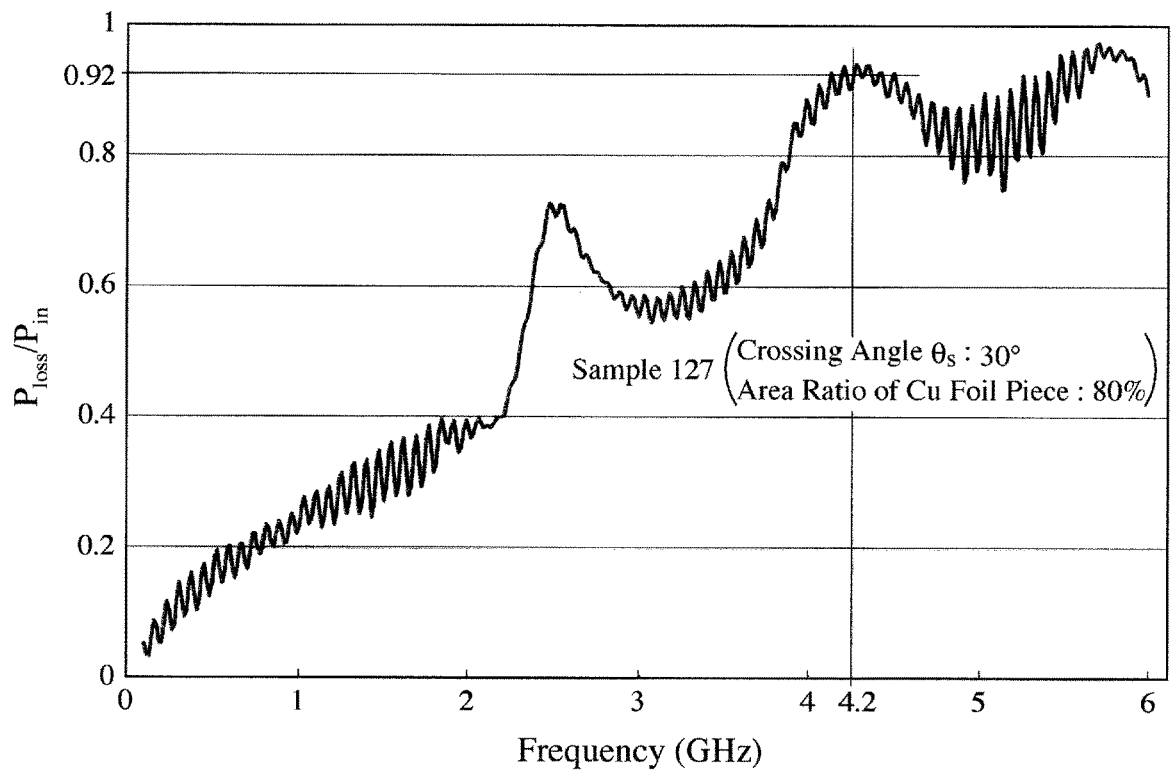
FIG. 82 is a graph showing the noise absorption ratio $P_{loss}/P_{in}$ of Sample 127 (crossing angle θs of linear scratches=30°, and area ratio of copper foil piece=80%) of the electromagnetic-wave-absorbing composite sheet.
Figure 83:
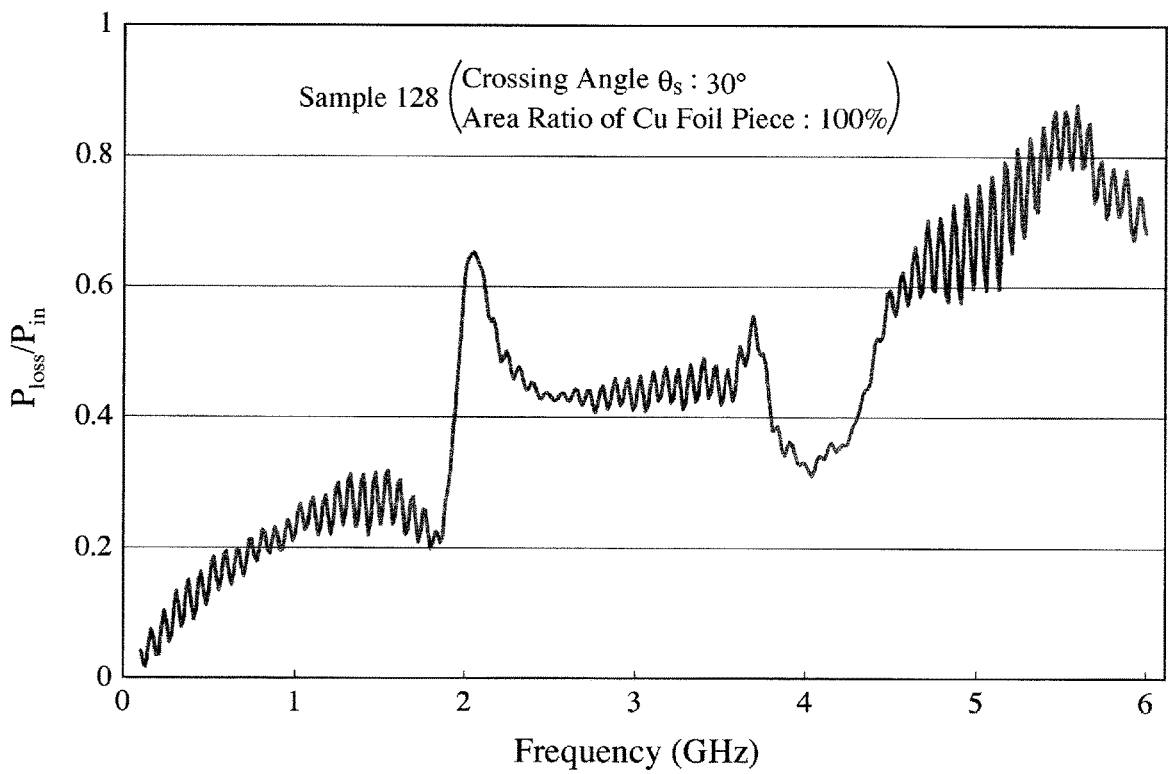
FIG. 83 is a graph showing the noise absorption ratio $P_{loss}/P_{in}$ of Sample 128 (crossing angle θs of linear scratches=30°, and area ratio of copper foil piece=100%) of the electromagnetic-wave-absorbing composite sheet.
Figure 84:
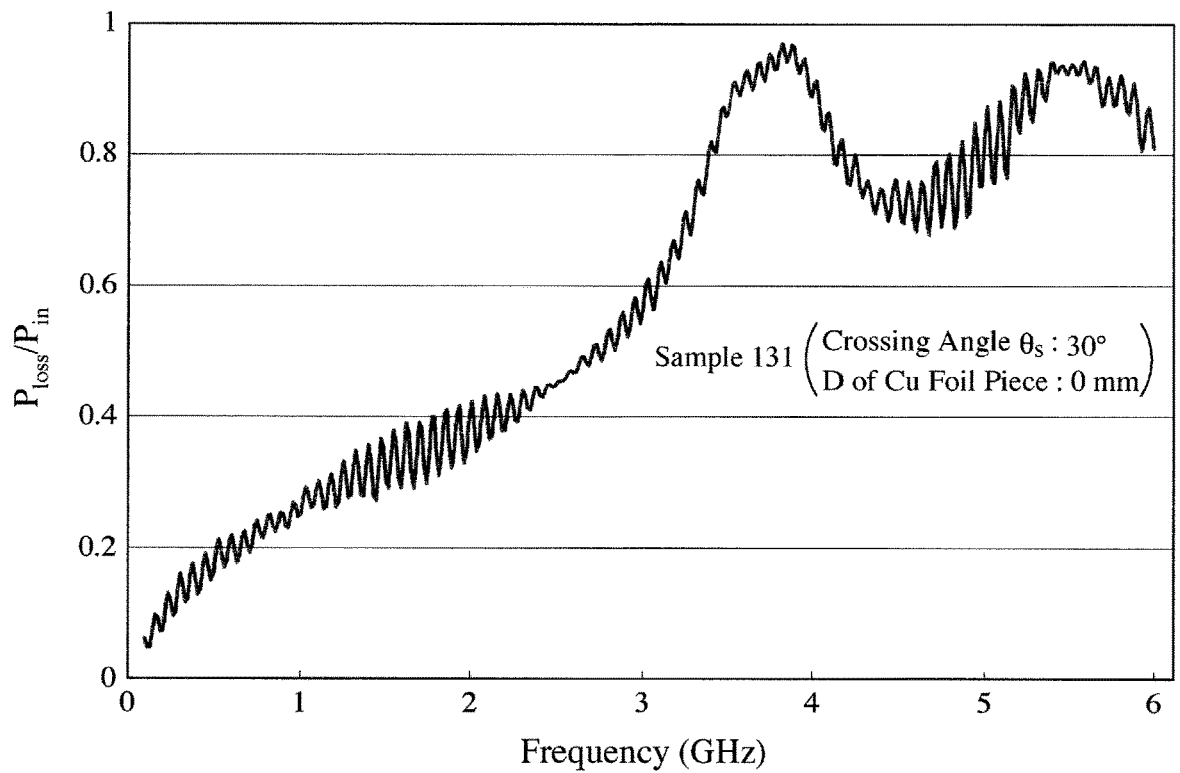
FIG. 84 is a graph showing the noise absorption ratio $P_{loss}/P_{in}$ of Sample 131 (crossing angle θs of linear scratches=30°, and distance D of copper foil piece=0 mm) of the electromagnetic-wave-absorbing composite sheet.
Figure 85:
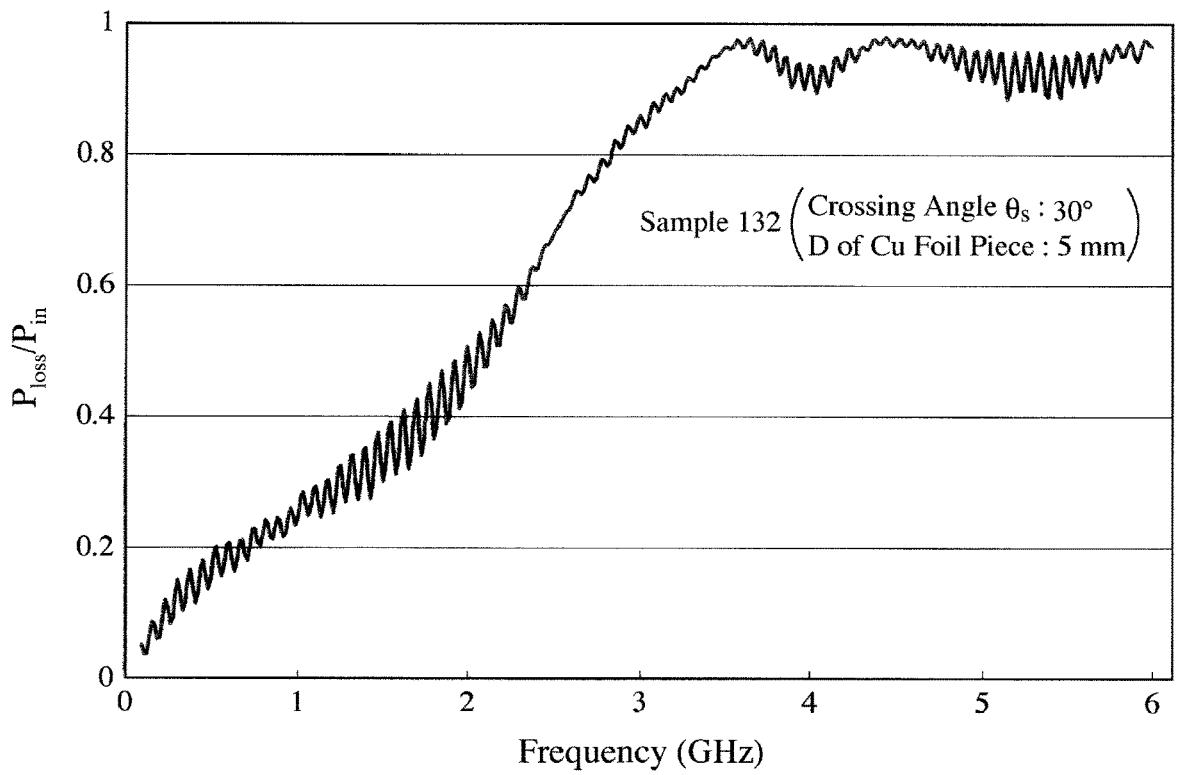
FIG. 85 is a graph showing the noise absorption ratio $P_{loss}/P_{in}$ of Sample 132 (crossing angle θs of linear scratches=30°, and distance D of copper foil piece=5 mm) of the electromagnetic-wave-absorbing composite sheet.
Figure 86:
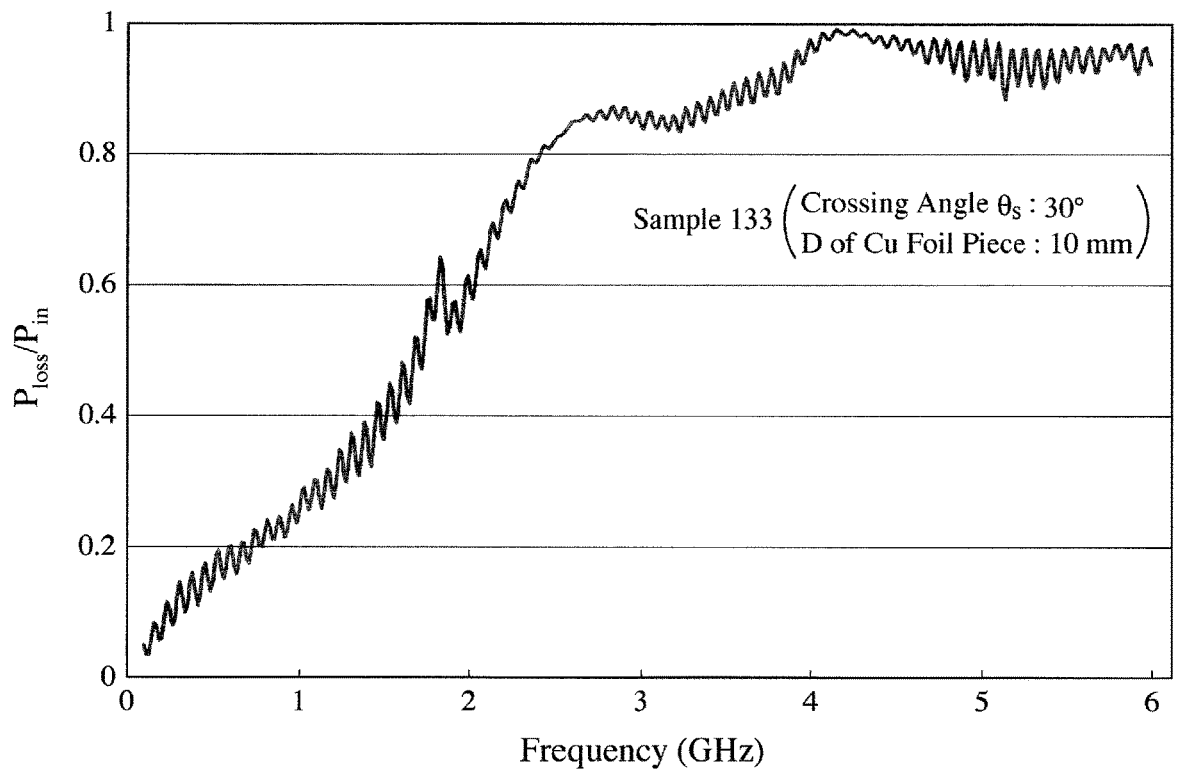
FIG. 86 is a graph showing the noise absorption ratio $P_{loss}/P_{in}$ of Sample 133 (crossing angle θs of linear scratches=30°, and distance D of copper foil piece=10 mm) of the electromagnetic-wave-absorbing composite sheet.
Figure 87:
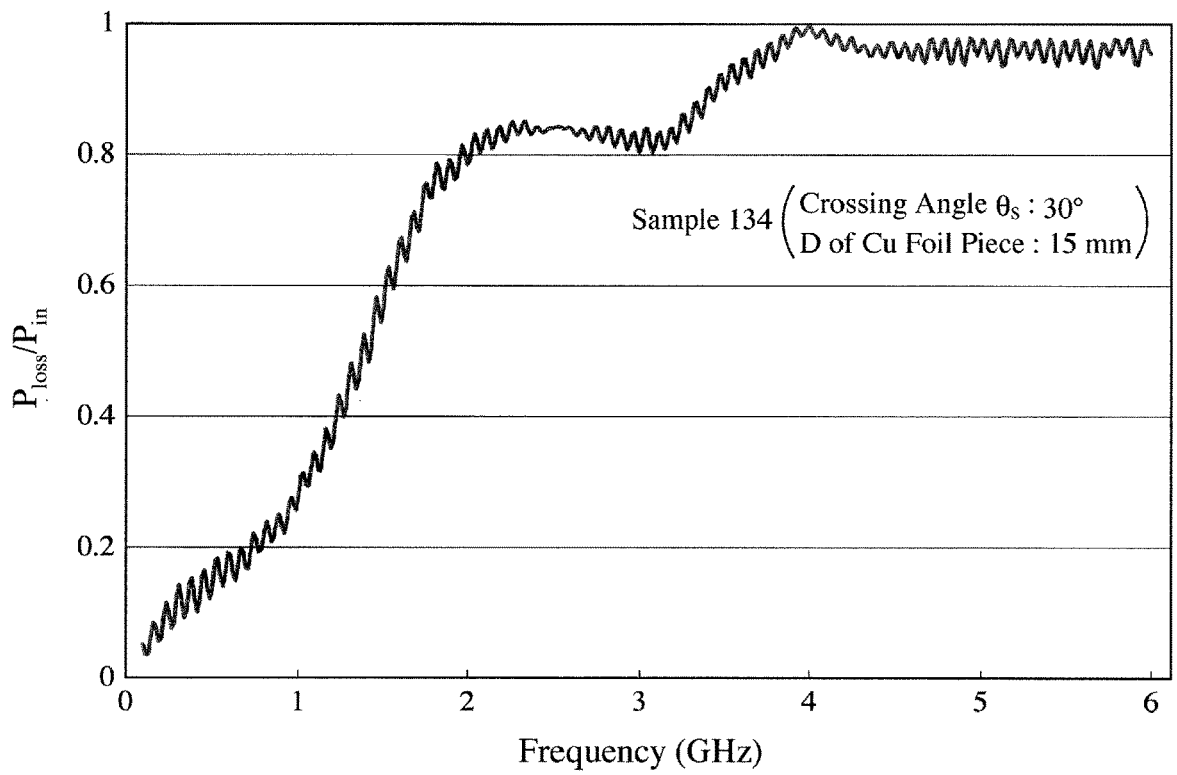
FIG. 87 is a graph showing the noise absorption ratio $P_{loss}/P_{in}$ of Sample 134 (crossing angle θs of linear scratches=30°, and distance D of copper foil piece=15 mm) of the electromagnetic-wave-absorbing composite sheet.
Figure 88:
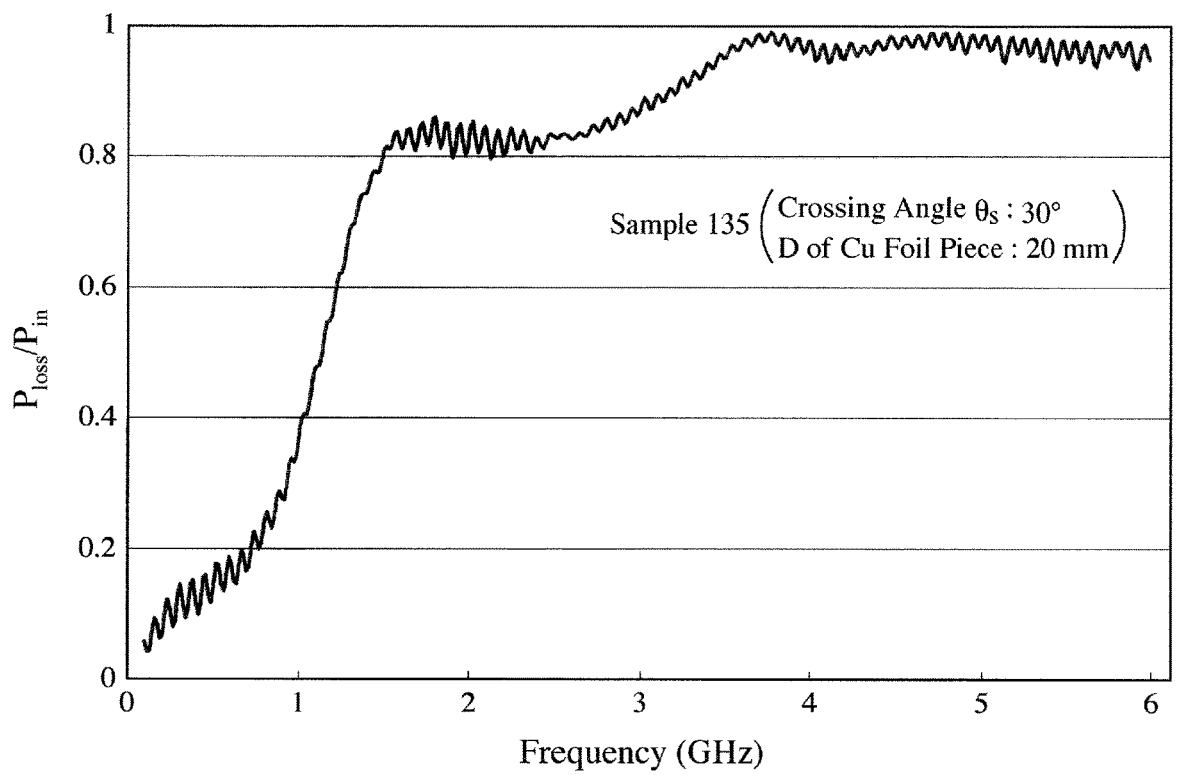
FIG. 88 is a graph showing the noise absorption ratio $P_{loss}/P_{in}$ of Sample 135 (crossing angle θs of linear scratches=30°, and distance D of copper foil piece=20 mm) of the electromagnetic-wave-absorbing composite sheet.
Figure 89:
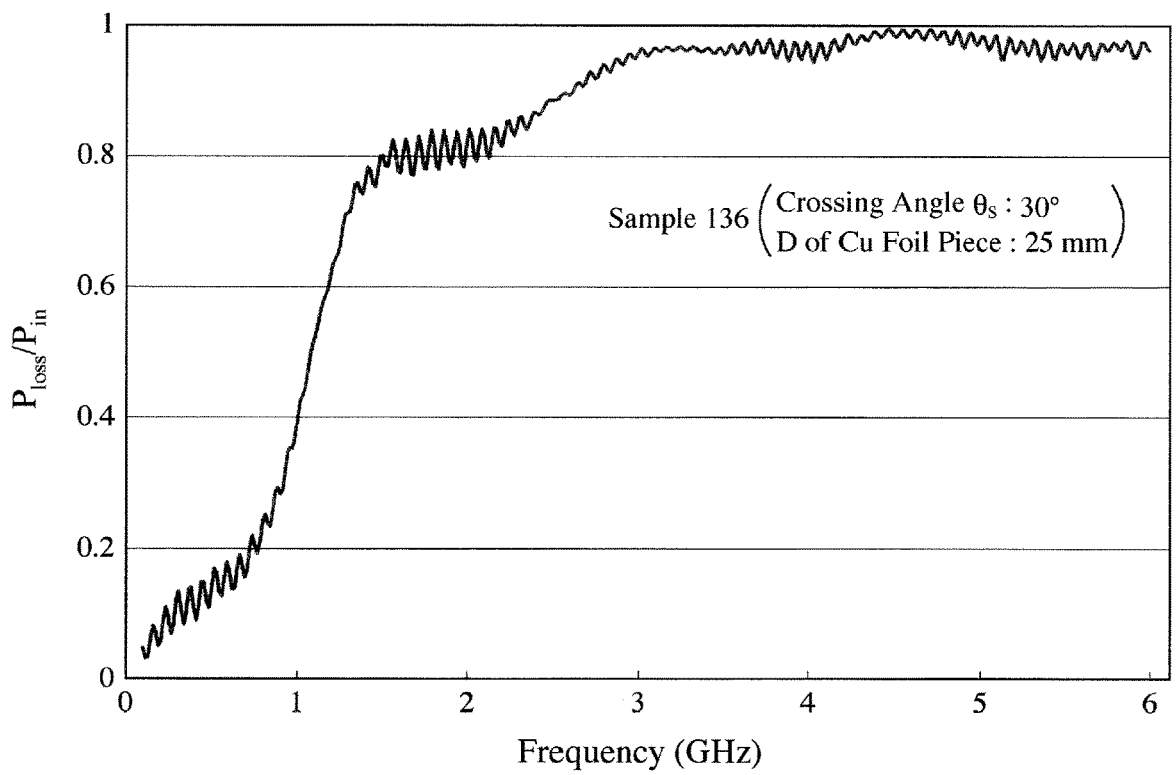
FIG. 89 is a graph showing the noise absorption ratio $P_{loss}/P_{in}$ of Sample 136 (crossing angle θs of linear scratches=30°, and distance D of copper foil piece=25 mm) of the electromagnetic-wave-absorbing composite sheet.

With a cover removed from Fire Stick TV, the electromagnetic-wave-absorbing composite sheet of Example 4 was placed on the IC chip in Fire Stick TV, to measure electromagnetic wave noise leaking from Fire Stick TV by a spectrum analyzer VSA6G2A available from Keisoku Giken Co., Ltd. The results are shown in FIG. 18(a). Also, electromagnetic wave noise leaking from Fire Stick TV was measured, with a cover removed but the electromagnetic-wave-absorbing composite sheet not placed on the IC chip. The results are shown in FIG. 18(b). As is clear from FIGS. 18(a) and 18(b), electromagnetic wave noise at a frequency of around 3 GHz leaking from Fire Stick TV remarkably decreased when the electromagnetic-wave-absorbing composite sheet of the present invention was placed on the IC chip.

EXAMPLE 5

Each electromagnetic-wave-absorbing composite sheet was produced in the same manner as in Example 1, except for laminating each carbon sheet piece of graphite powder/carbon black having a size of 20 mm×50 mm (Sample 31), 25 mm×50 mm (Sample 32) and 50 mm×50 mm (Sample 33) in place of the aluminum foil piece on the electromagnetic-wave-absorbing film piece of 50 mm×50 mm with their centers aligned. The carbon sheet of graphite powder/carbon black was produced by the same method as in Example 1 of JP 2015-170660 A. The noise absorption ratio $P_{loss}/P_{in}$ of each sample was measured in the same manner as in Example 1. The results are shown in FIG. 19.

As is clear from FIG. 19, the same results as in Example 1 were obtained, even when the carbon sheet piece was used in place of the aluminum foil piece.

Though each electromagnetic-wave-absorbing composite sheet, in which an electromagnetic-wave-absorbing film provided with linear scratches with a crossing angle of 90° in a thin aluminum film is laminated with an aluminum foil or a carbon sheet of graphite powder/carbon black as an electromagnetic-wave-shielding film, is used in the above Examples, the present invention is not restricted to these electromagnetic-wave-absorbing composite sheets, but may be changed within the scope of the present invention. For example, the thin metal film is not restricted to the thin aluminum film but may be a thin copper film, etc.; the crossing angle of linear scratches is not restricted to 90° but may be changed within a range of 30-90'; and a copper foil, aluminum, a coating of a conductive ink in which powder of copper, silver, etc. is dispersed can be used in place of the aluminum foil as the electromagnetic-wave-shielding film.

EXAMPLE 6

An aluminum foil piece (thickness: 15 μm) having a size of L (10 mm, 15 mm, 20 mm, 25 mm, 30 mm, 35 mm, 40 mm, and 50 mm)×50 mm was laminated via a non-conductive adhesive on an electromagnetic-wave-absorbing film piece of 50 mm×50 mm cut out of the electromagnetic-wave-absorbing film (crossing angle θs of linear scratches: 60°) obtained in Reference Example 2 as shown in FIG. 8, to produce Samples 41-48. In each Sample, a center of the aluminum foil piece was aligned with a center of the electromagnetic-wave-absorbing film piece. The noise absorption ratio $P_{loss}/P_{in}$ of each Sample 41-48 was determined by the same method as in Example 1. The results are shown in FIGS. 20-27 and Table 3.

TABLE 3

| Sample No. | Aluminum Foil Piece | | | Maximum Noise Absorption | |
|---|---|---|---|---|---|
| | θs [1] (°) | L (mm) | Area Ratio [2] (%) | $P_{loss}/P_{in}$ | Frequency (GHz) |
| 41 | 60 | 10 | 20 | 0.96 | 1.9 |
| 42 | 60 | 15 | 30 | 0.96 | 1.95 |
| 43 | 60 | 20 | 40 | 0.96 | 2.2 |
| 44 | 60 | 25 | 50 | 0.93 | 2.2 |
| 45 | 60 | 30 | 60 | 0.94 | 4.1 |
| 46 | 60 | 35 | 70 | 0.99 | 4.05 |

TABLE 3-continued

| Sample No. | Aluminum Foil Piece | | | Maximum Noise Absorption | |
|---|---|---|---|---|---|
| | θs [1] (°) | L (mm) | Area Ratio [2] (%) | $P_{loss}/P_{in}$ | Frequency (GHz) |
| 47 | 60 | 40 | 80 | 0.97 | 4.1 |
| 48* | 60 | 50 | 100 | —[3] | —[3] |

Note:
[1] θs represents the crossing angle of linear scratches.
[2] An area ratio of the aluminum foil piece to the electromagnetic-wave-absorbing film piece.
[3] $P_{loss}/P_{in}$ was low in an entire frequency range.
A sample with * is outside the scope of the present invention.

In Sample 48, in which the electromagnetic-wave-absorbing film piece and the aluminum foil piece laminated with each other had the same size, the noise absorption ratio $P_{loss}/P_{in}$ was low in an entire frequency range. On the other hand, in Samples 41-47, in which the aluminum foil pieces having area ratios of 20-80% were laminated with the electromagnetic-wave-absorbing film pieces, the maximum noise absorption ratios $P_{loss}/P_{in}$ were as high as 0.93-0.99 at frequencies differing in a range of 1.9-4.1 GHz. This indicates that to maximize the noise absorption ratio $P_{loss}/P_{in}$ in a desired frequency region, the area ratio of the aluminum foil piece (electromagnetic-wave-shielding film) to the electromagnetic-wave-absorbing film piece should be 10-80%.

EXAMPLE 7

An aluminum foil piece (thickness: 15 μm) of 25 mm×50 mm was laminated via a non-conductive adhesive on the same electromagnetic-wave-absorbing film piece of 50 mm×50 mm (crossing angle θs of linear scratches: 60°) as used in Example 6, such that the distance D between one side $X_1$ of the electromagnetic-wave-absorbing film piece and one side $X_2$ (parallel to $X_1$) of the aluminum foil piece was 0 mm, 5 mm, 10 mm, 15 mm, 20 mm, and 25 mm, respectively, as shown in FIG. 6(a), to produce Samples 51-56. The noise absorption ratio $P_{loss}/P_{in}$ of each Sample in a range of 0.1-6 GHz was measured in the same manner as in Example 2. The relation between the noise absorption ratio $P_{loss}/P_{in}$ and the distance D in each Sample is shown in FIGS. 28-33. As is clear from FIGS. 28-33, a curve of the noise absorption ratio $P_{loss}/P_{in}$ changed drastically as the distance D changed.

EXAMPLE 8

An aluminum foil piece (thickness: 15 μm) of L (10 mm, 15 mm, 20 mm, 25 mm, 30 mm, 35 mm, 40 mm, and 50 mm)×50 mm was laminated via a non-conductive adhesive on an electromagnetic-wave-absorbing film piece of 50 mm×50 mm cut out of the electromagnetic-wave-absorbing film (crossing angle θs of linear scratches: 30°) obtained in Reference Example 4 as shown in FIG. 8, to produce Samples 61-68. In each Sample, a center of the aluminum foil piece was aligned with a center of the electromagnetic-wave-absorbing film piece. The noise absorption ratio $P_{loss}/P_{in}$ of each Sample 61-68 was determined by the same method as in Example 1. The results are shown in FIGS. 34-41 and Table 4.

TABLE 4

| Sample No. | Aluminum Foil Piece | | | Maximum Noise Absorption | |
|---|---|---|---|---|---|
| | θs [1] (°) | L (mm) | Area Ratio [2] (%) | $P_{loss}/P_{in}$ | Frequency (GHz) |
| 61 | 30 | 10 | 20 | 0.93[3] | 2.1 |
| 62 | 30 | 15 | 30 | 0.92[4] | 2.1 |
| 63 | 30 | 20 | 40 | 0.9[5] | 2.3 |
| 64 | 30 | 25 | 50 | 0.9[6] | 2.4 |
| 65 | 30 | 30 | 60 | 0.98 | 4.1 |
| 66 | 30 | 35 | 70 | 0.97 | 4.2 |
| 67 | 30 | 40 | 80 | 0.95 | 4.1 |
| 68* | 30 | 50 | 100 | —[7] | —[7] |

Note:
[1] θs represents the crossing angle of linear scratches.
[2] An area ratio of the aluminum foil piece to the electromagnetic-wave-absorbing film piece.
[3] The noise absorption ratio $P_{loss}/P_{in}$ was 0.98 in a frequency range of about 5 GHz, and had a large peak of 0.93 at a frequency of 2.1 GHz.
[4] The noise absorption ratio $P_{loss}/P_{in}$ was 0.98 in a range frequency of about 5 GHz or more, and had a large peak of 0.92 at a frequency of 2.1 GHz.
[5] The noise absorption ratio $P_{loss}/P_{in}$ was 0.97 in a frequency range of 4 GHz or more, and had a large peak of 0.9 at a frequency of 2.3 GHz.
[6] The noise absorption ratio $P_{loss}/P_{in}$ was 0.97 in a frequency range of 4.2 GHz, and had a large peak of 0.9 at a frequency of 2.4 GHz.
[7] $P_{loss}/P_{in}$ was low in an entire frequency range.
A sample with * is outside the scope of the present invention.

In Sample 68, in which the electromagnetic-wave-absorbing film piece and the aluminum foil piece laminated with each other had the same size, the noise absorption ratio $P_{loss}/P_{in}$ was low in an entire frequency range. On the other hand, in Samples 61-67, in which the aluminum foil pieces having area ratios of 20-80% were laminated on the electromagnetic-wave-absorbing film pieces, the maximum noise absorption ratios $P_{loss}/P_{in}$ were as high as 0.9-0.98 at frequencies differing in a range of 2.1-4.2 GHz. This indicates that to maximize the noise absorption ratio $P_{loss}/P_{in}$ in a desired frequency region, the area ratio of the aluminum foil piece (electromagnetic-wave-shielding film) to the electromagnetic-wave-absorbing film piece should be 10-80%.

EXAMPLE 9

An aluminum foil piece (thickness: 15 μm) of 25 mm×50 mm was laminated via a non-conductive adhesive on the electromagnetic-wave-absorbing film piece of 50 mm×50 mm (crossing angle θs of linear scratches: 30°) as used in Example 8, such that the distance D between one side $X_1$ of the electromagnetic-wave-absorbing film piece and one side $X_2$ (parallel to $X_1$) of the aluminum foil piece was 0 mm, 5 mm, 10 mm, 15 mm, 20 mm, and 25 mm, respectively, as shown in FIG. 6(a), to produce Samples 71-76. The noise absorption ratio $P_{loss}/P_{in}$ of each Sample in a range of 0.1-6 GHz was measured in the same manner as in Example 2. The relation between the noise absorption ratio $P_{loss}/P_{in}$ and the distance D in each Sample is shown in FIGS. 42-47. As is clear from FIGS. 42-47, a curve of the noise absorption ratio $P_{loss}/P_{in}$ changed drastically as the distance D changed.

EXAMPLE 10

A copper foil piece (thickness: 15 μm) of L (10 mm, 15 mm, 20 mm, 25 mm, 30 mm, 35 mm, 40 mm, and 50 mm)×50 mm was laminated via a non-conductive adhesive on an electromagnetic-wave-absorbing film piece of 50 mm×50 mm cut out of the electromagnetic-wave-absorbing film (crossing angle θs of linear scratches: 60°) obtained in Reference Example 2 as shown in FIG. 8, to produce Samples 81-88. In each Sample, a center of the copper foil piece was aligned with a center of the electromagnetic-wave-absorbing film piece. The noise absorption ratio $P_{loss}/$ $P_{in}$ of each Sample 81-88 was determined by the same method as in Example 1. The results are shown in FIGS. 48-55 and Table 5.

TABLE 5

| Sample No. | Copper Foil Piece | | | Maximum Noise Absorption | |
|---|---|---|---|---|---|
| | θs [1] (°) | L (mm) | Area Ratio [2] (%) | $P_{loss}/P_{in}$ | Frequency (GHz) |
| 81 | 60 | 10 | 20 | 0.96 | 1.9 |
| 82 | 60 | 15 | 30 | 0.98 | 2.1 |
| 83 | 60 | 20 | 40 | 0.97 | 2.2 |
| 84 | 60 | 25 | 50 | 0.95 | 2.2 |
| 85 | 60 | 30 | 60 | 0.98 | 3.4 |
| 86 | 60 | 35 | 70 | 0.99 | 4.1 |
| 87 | 60 | 40 | 80 | 0.98 | 4.2 |
| 88* | 60 | 50 | 100 | —[3] | —[3] |

Note:
[1] θs represents the crossing angle of linear scratches.
[2] An area ratio of the copper foil piece to the electromagnetic-wave-absorbing film piece.
[3] $P_{loss}/P_{in}$ was low in an entire frequency range.
A sample with * is outside the scope of the present invention.

In Sample 88, in which the electromagnetic-wave-absorbing film piece and the copper foil piece laminated with each other had the same size, the noise absorption ratio $P_{loss}/P_{in}$ was low in an entire frequency range. On the other hand, in Samples 81-87, in which the copper foil pieces having area ratios of 20-80% were laminated on the electromagnetic-wave-absorbing film pieces, the maximum noise absorption ratios $P_{loss}/P_{in}$ were as high as 0.95-0.99 at frequencies differing in a range of 1.9-4.2 GHz. This indicates that to maximize the noise absorption ratio $P_{loss}/P_{in}$ in a desired frequency region, the area ratio of the copper foil piece (electromagnetic-wave-shielding film) to the electromagnetic-wave-absorbing film piece should be 10-80%.

EXAMPLE 11

A copper foil piece (thickness: 15 μm) of 25 mm×50 mm was laminated via a non-conductive adhesive on the same electromagnetic-wave-absorbing film piece of 50 mm×50 mm (crossing angle θs of linear scratches: 60°) as used in Example 10, such that the distance D between one side $X_1$ of the electromagnetic-wave-absorbing film piece and one side $X_2$ (parallel to $X_1$) of the copper foil piece was 0 mm, 5 mm, 10 mm, 15 mm, 20 mm, and 25 mm, respectively, as shown in FIG. 6(a), to produce Samples 91-96. The noise absorption ratio $P_{loss}/P_{in}$ of each Sample in a range of 0.1-6 GHz was measured in the same manner as in Example 2. The relation between the noise absorption ratio $P_{loss}/P_{in}$ and the distance D in each Sample is shown in FIGS. 56-61. As is clear from FIGS. 56-61, a curve of the noise absorption ratio $P_{loss}/P_{in}$ changed drastically as the distance D changed.

EXAMPLE 12

A copper foil piece (thickness: 15 μm) of L (10 mm, 15 mm, 20 mm, 25 mm, 30 mm, 35 mm, 40 mm, and 50 mm)×50 mm was laminated via a non-conductive adhesive on an electromagnetic-wave-absorbing film piece of 50 mm×50 mm cut out of the electromagnetic-wave-absorbing film (crossing angle θs of linear scratches: 45°) obtained in Reference Example 3 as shown in FIG. 8, to produce Samples 101-108. In each Sample, a center of the copper foil piece was aligned with a center of the electromagnetic-wave-absorbing film piece. The noise absorption ratio $P_{loss}/$ $P_{in}$ of each Sample 101-108 was determined by the same method as in Example 1. The results are shown in FIGS. 62-69 and Table 6.

TABLE 6

| Sample No. | Copper Foil Piece | | | Maximum Noise Absorption | |
|---|---|---|---|---|---|
| | θs [1] (°) | L (mm) | Area Ratio [2] (%) | $P_{loss}/P_{in}$ | Frequency (GHz) |
| 101 | 45 | 10 | 20 | 0.88 | 2.4 |
| 102 | 45 | 15 | 30 | 0.90 | 3.5-4.2 |
| 103 | 45 | 20 | 40 | 0.92 | 3.3-4 |
| 104 | 45 | 25 | 50 | 0.93 | 3.3-3.8 |
| 105 | 45 | 30 | 60 | 0.97 | 3.4 |
| 106 | 45 | 35 | 70 | 0.98 | 3.9 |
| 107 | 45 | 40 | 80 | 0.94 | 4.1 |
| 108* | 45 | 50 | 100 | —[3] | —[3] |

Note:
[1] θs represents the crossing angle of linear scratches.
[2] An area ratio of the copper foil piece to the electromagnetic-wave-absorbing film piece.
[3] $P_{loss}/P_{in}$ was low in an entire frequency range.
A sample with * is outside the scope of the present invention.

In Sample 108, in which the electromagnetic-wave-absorbing film piece and the copper foil piece laminated with each other had the same size, the noise absorption ratio $P_{loss}/P_{in}$ was low in an entire frequency range. On the other hand, in Samples 101-107, in which the copper foil pieces having area ratios of 20-80% were laminated on the electromagnetic-wave-absorbing film piece, the maximum noise absorption ratios $P_{loss}/P_{in}$ were as high as 0.90-0.98 at frequencies differing in a range of 2.4-4.2 GHz. This indicates that to maximize the noise absorption ratio $P_{loss}/P_{in}$ in a desired frequency region, the area ratio of the copper foil piece (electromagnetic-wave-shielding film) to the electromagnetic-wave-absorbing film piece should be 10-80%.

EXAMPLE 13

A copper foil piece (thickness: 15 μm) of 25 mm×50 mm was laminated via a non-conductive adhesive on the same electromagnetic-wave-absorbing film piece of 50 mm×50 mm (crossing angle θs of linear scratches: 45°) as used in Example 12, such that the distance D between one side $X_1$ of the electromagnetic-wave-absorbing film piece and one side $X_2$ (parallel to $X_1$) of the copper foil piece was 0 mm, 5 mm, 10 mm, 15 mm, 20 mm, and 25 mm, respectively, as shown in FIG. 6(a), to produce Samples 111-116. The noise absorption ratio $P_{loss}/P_{in}$ of each Sample in a range of 0.1-6 GHz was measured in the same manner as in Example 2. The relation between the noise absorption ratio $P_{loss}/P_{in}$ and the distance D in each Sample is shown in FIGS. 70-75. As is clear from FIGS. 70-75, a curve of the noise absorption ratio $P_{loss}/P_{in}$ changed drastically as the distance D changed.

EXAMPLE 14

A copper foil piece (thickness: 15 μm) of L (10 mm, 15 mm, 20 mm, 25 mm, 30 mm, 35 mm, 40 mm, and 50 mm)×50 mm was laminated via a non-conductive adhesive on an electromagnetic-wave-absorbing film piece of 50 mm×50 mm cut out of the electromagnetic-wave-absorbing film (crossing angle θs of linear scratches: 30°) obtained in Reference Example 4 as shown in FIG. 8, to produce Samples 121-128. In each Sample, a center of the copper foil piece was aligned with a center of the electromagnetic-wave-absorbing film piece. The noise absorption ratio $P_{loss}/$ $P_{in}$ of each Sample 121-128 was determined by the same method as in Example 1. The results are shown in FIGS. 76-83 and Table 7.

TABLE 7

| Sample No. | θs [1] (°) | Copper Foil Piece L (mm) | Area Ratio [2] (%) | Maximum Noise Absorption $P_{loss}/P_{in}$ | Frequency (GHz) |
|---|---|---|---|---|---|
| 121 | 30 | 10 | 20 | 0.91 | 2.1 |
| 122 | 30 | 15 | 30 | 0.9 | 2.2 |
| 123 | 30 | 20 | 40 | 0.89 | 2.4 |
| 124 | 30 | 25 | 50 | 0.97 | 4.2 |
| 125 | 30 | 30 | 60 | 0.98 | 4.0 |
| 126 | 30 | 35 | 70 | 0.95 | 4.2 |
| 127 | 30 | 40 | 80 | 0.92 | 4.2 |
| 128* | 30 | 50 | 100 | —[3] | —[3] |

Note:
[1] θs represents the crossing angle of linear scratches.
[2] An area ratio of the copper foil piece to the electromagnetic-wave-absorbing film piece.
[3] $P_{loss}/P_{in}$ was low in an entire frequency range.
A sample with * is outside the scope of the present invention.

In Sample 128, in which the electromagnetic-wave-absorbing film piece and the copper foil piece laminated with each other had the same size, the noise absorption ratio $P_{loss}/P_{in}$ was low in an entire frequency range. On the other hand, in Samples 121-127, in which the copper foil pieces having area ratios of 20-80% were laminated on the electromagnetic-wave-absorbing film piece, the maximum noise absorption ratios $P_{loss}/P_{in}$ were as high as 0.9-0.98 at frequencies differing in a range of 2.1-4.2 GHz. This indicates that to maximize the noise absorption ratio $P_{loss}/P_{in}$ in a desired frequency region, the area ratio of the copper foil piece (electromagnetic-wave-shielding film) to the electromagnetic-wave-absorbing film piece should be 10-80%.

EXAMPLE 15

A copper foil piece (thickness: 15 μm) of 25 mm×50 mm was laminated via a non-conductive adhesive on the same electromagnetic-wave-absorbing film piece of 50 mm×50 mm (crossing angle θs of linear scratches: 30°) as used in Example 14, such that the distance D between one side $X_1$ of the electromagnetic-wave-absorbing film piece and one side $X_2$ (parallel to $X_1$) of the copper foil piece was 0 mm, 5 mm, 10 mm, 15 mm, 20 mm, and 25 mm, respectively, as shown in FIG. 6(*a*), to produce Samples 131-136. The noise absorption ratio $P_{loss}/P_{in}$ of each Sample in a range of 0.1-6 GHz was measured in the same manner as in Example 2. The relation between the noise absorption ratio $P_{loss}/P_{in}$ and the distance D in each Sample is shown in FIGS. 84-89. As is clear from FIGS. 84-89, a curve of the noise absorption ratio $P_{loss}/P_{in}$ changed drastically as the distance D changed.

Effects of the Invention

The electromagnetic-wave-absorbing composite sheet of the present invention having the above structure has excellent electromagnetic wave absorbability, and can maximize electromagnetic wave noise absorbability in a desired frequency range by changing an area ratio of an electromagnetic-wave-shielding film to an electromagnetic-wave-absorbing film within a range of 10-80%. When used in electronic appliances and parts emitting electromagnetic wave noises at particular frequencies, their electromagnetic wave noises can efficiently be absorbed by such electromagnetic-wave-absorbing composite sheets.

DESCRIPTION OF REFERENCE NUMERALS

10: Electromagnetic-wave-absorbing composite sheet
1: Electromagnetic-wave-absorbing film
11: Plastic film
12, 12a, 12b, 112: Thin metal film
13, 13a, 13b, 113, 113a, 113b: Linear scratch
2: Electromagnetic-wave-shielding film
100: Thin metal film-plastic composite film
202a, 202b, 232a, 232b: Pattern roll
203a, 203b, 233a, 233b: Push roll
204a, 204b, 234a, 234b: Electric-resistance-measuring means (roll)
205a, 205b, 235a: Backup roll
221, 224: Reel
222, 223: Guide roll
300: Insulation substrate
301: Grounded electrode
302: Conductor pin
303: Coaxial cable
D: Distance between one side $X_1$ of electromagnetic-wave-absorbing film piece and one side $X_2$ of metal foil piece
MSL: Microstripline
NA: Network analyzer
θs: Crossing angle of linear scratches in electromagnetic-wave-absorbing film
Ls: Length of linear scratch
W: Width of linear scratch
I: Interval of linear scratches

What is claimed is:

1. An electromagnetic-wave-absorbing composite sheet comprising an electromagnetic-wave-absorbing film and an electromagnetic-wave-shielding film laminated on said electromagnetic-wave-absorbing film;
    said electromagnetic-wave-absorbing film having a single- or multi-layer thin metal film formed on a surface of a plastic film, said thin metal film being provided with large numbers (pluralities) of substantially parallel, intermittent, linear scratches with irregular widths and intervals in plural directions; and
    an area ratio of said electromagnetic-wave-shielding film to said electromagnetic-wave-absorbing film being 10-80%.

2. The electromagnetic-wave-absorbing composite sheet according to claim 1, wherein the area ratio of said electromagnetic-wave-shielding film to said electromagnetic-wave-absorbing film is 20-80%.

3. The electromagnetic-wave-absorbing composite sheet according to claim 2, wherein the area ratio of said electromagnetic-wave-shielding film to said electromagnetic-wave-absorbing film is 30-70%.

4. The electromagnetic-wave-absorbing composite sheet according to claim 1, wherein said electromagnetic-wave-shielding film is a conductive metal foil, a plastic film having a thin conductive metal film or coating, or a carbon sheet.

5. The electromagnetic-wave-absorbing composite sheet according to claim 4, wherein said conductive metal in said electromagnetic-wave-shielding film is at least one selected from the group consisting of aluminum, copper, silver, tin, nickel, cobalt, chromium, and their alloys.

6. The electromagnetic-wave-absorbing composite sheet according to claim 1, wherein said linear scratches in said electromagnetic-wave-absorbing film have widths in a range of 0.1-100 μm for 90% or more and 1-50 μm on average, and lateral intervals in a range of 1-500 μm and 1-200 μm on average.

7. The electromagnetic-wave-absorbing composite sheet according to claim 1, wherein the linear scratches in said electromagnetic-wave-absorbing film have an acute crossing angle θs in a range of 30-90°.

8. The electromagnetic-wave-absorbing composite sheet according to claim 1, wherein both of said electromagnetic-wave-absorbing film and said electromagnetic-wave-shielding film are in a rectangular or square shape.

\* \* \* \* \*